US011749778B2

(12) United States Patent
Lee et al.

(10) Patent No.: US 11,749,778 B2
(45) Date of Patent: Sep. 5, 2023

(54) SEMICONDUCTOR DEVICE AND SEMICONDUCTOR DEVICE PACKAGE HAVING AN ELECTRODE RECESS WITH A DIFFERENT INCLINATION ANGLE THAN AN INCLINATION ANGLE OF AN ELECTRODE IN THE RECESS

(71) Applicant: SUZHOU LEKIN SEMICONDUCTOR CO., LTD., Taicang (CN)

(72) Inventors: Chang Hyeong Lee, Seoul (KR); June O Song, Seoul (KR); Tae Sung Lee, Seoul (KR); Chang Man Lim, Seoul (KR); Se Yeon Jung, Seoul (KR); Byung Yeon Choi, Seoul (KR); Sung Min Hwang, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 475 days.

(21) Appl. No.: 16/641,296

(22) PCT Filed: Aug. 24, 2018

(86) PCT No.: PCT/KR2018/009815
§ 371 (c)(1),
(2) Date: Feb. 24, 2020

(87) PCT Pub. No.: WO2019/039914
PCT Pub. Date: Feb. 28, 2019

(65) Prior Publication Data
US 2020/0203566 A1    Jun. 25, 2020

(30) Foreign Application Priority Data

Aug. 25, 2017 (KR) .......................... 10-2017-0108145
Aug. 25, 2017 (KR) .......................... 10-2017-0108220

(51) Int. Cl.
*H01L 33/10* (2010.01)
*H01L 33/40* (2010.01)
(Continued)

(52) U.S. Cl.
CPC ............ *H01L 33/10* (2013.01); *H01L 33/405* (2013.01); *H01L 33/48* (2013.01); *H01L 33/38* (2013.01)

(58) Field of Classification Search
CPC .. H01L 33/382; H01L 33/38; H01L 33/02–48
See application file for complete search history.

(56) References Cited

U.S. PATENT DOCUMENTS

| 8,319,233 | B2* | 11/2012 | Beom | ...................... H01L 33/36 |
| | | | | 438/956 |
| 9,877,180 | B2* | 1/2018 | Tiirola | ................... H04W 8/005 |
| 9,887,180 | B2* | 2/2018 | Meitl | ....................... H01L 33/44 |

(Continued)

FOREIGN PATENT DOCUMENTS

| KR | 10-2006-0032290 A | 4/2005 |
| KR | 10-2011-0031099 | 3/2011 |

(Continued)

OTHER PUBLICATIONS

International Search Report dated Feb. 28, 2019 issued in Application No. PCT/KR2018/009815.

*Primary Examiner* — Didarul A Mazumder
*Assistant Examiner* — Gustavo G Ramallo
(74) *Attorney, Agent, or Firm* — Birch, Stewart, Kolasch & Birch, LLP

(57) ABSTRACT

A semiconductor device according to an embodiment may include: a light emitting structure; a light transmitting electrode layer disposed on the light emitting structure; and a reflective layer disposed on the light transmitting electrode layer and including a plurality of first openings and a (Continued)

plurality of second openings. The semiconductor device according to the embodiment may include: a first electrode in contact with a first conductivity type semiconductor layer of the light emitting structure; and a second electrode in contact with the light transmitting electrode layer through the plurality of first openings. The first electrode may include a first sub-electrode and a plurality of first branch electrodes, wherein the plurality of first branch electrodes are arranged extending toward the second electrode from the first sub-electrode; the second electrode may include a second sub-electrode and a plurality of second branch electrodes, wherein the plurality of second branch electrodes are arranged extending toward the first electrode from the second sub-electrode; and the plurality of first branch electrodes and the plurality of second branch electrodes may be alternately disposed on an upper surface of the reflective layer.

18 Claims, 53 Drawing Sheets

(51) Int. Cl.
*H01L 33/48* (2010.01)
*H01L 33/38* (2010.01)

(56) References Cited

U.S. PATENT DOCUMENTS

| | | | |
|---|---|---|---|
| 2006/0140550 A1* | 6/2006 | Chen | H01L 27/14625 257/E25.032 |
| 2009/0179211 A1* | 7/2009 | Yoo | H01L 33/20 257/79 |
| 2011/0068359 A1 | 3/2011 | Yahata et al. | |
| 2014/0217439 A1 | 8/2014 | Jeon et al. | |
| 2014/0231839 A1* | 8/2014 | Jeon | H01L 33/382 257/96 |
| 2015/0325762 A1* | 11/2015 | Hsu | H01L 27/15 438/26 |
| 2016/0104814 A1 | 4/2016 | Hwang et al. | |
| 2016/0126413 A1* | 5/2016 | Kim | H01L 33/145 257/13 |
| 2016/0260869 A1* | 9/2016 | Jeon | H01L 33/38 |
| 2017/0162746 A1* | 6/2017 | Cha | H01L 33/504 |
| 2018/0153007 A1 | 5/2018 | Kim et al. | |

FOREIGN PATENT DOCUMENTS

| | | |
|---|---|---|
| KR | 10-1368720 | 3/2014 |
| KR | 10-1561203 | 10/2015 |
| KR | 10-2016-0025455 A | 3/2016 |
| KR | 10-2016-0043868 | 4/2016 |
| KR | 10-2016-0143430 | 12/2016 |
| TW | 201626604 A | 7/2016 |
| TW | 201831809 A | 9/2016 |
| WO | WO 2012/039555 A2 | 3/2012 |

* cited by examiner

【FIG. 1】
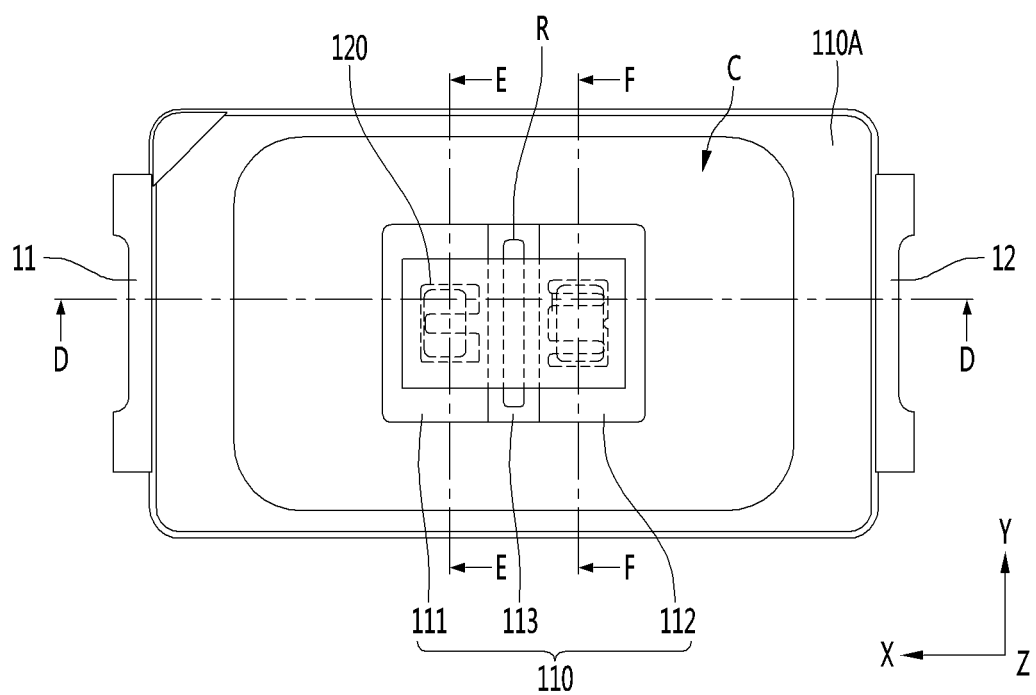

[FIG. 2]
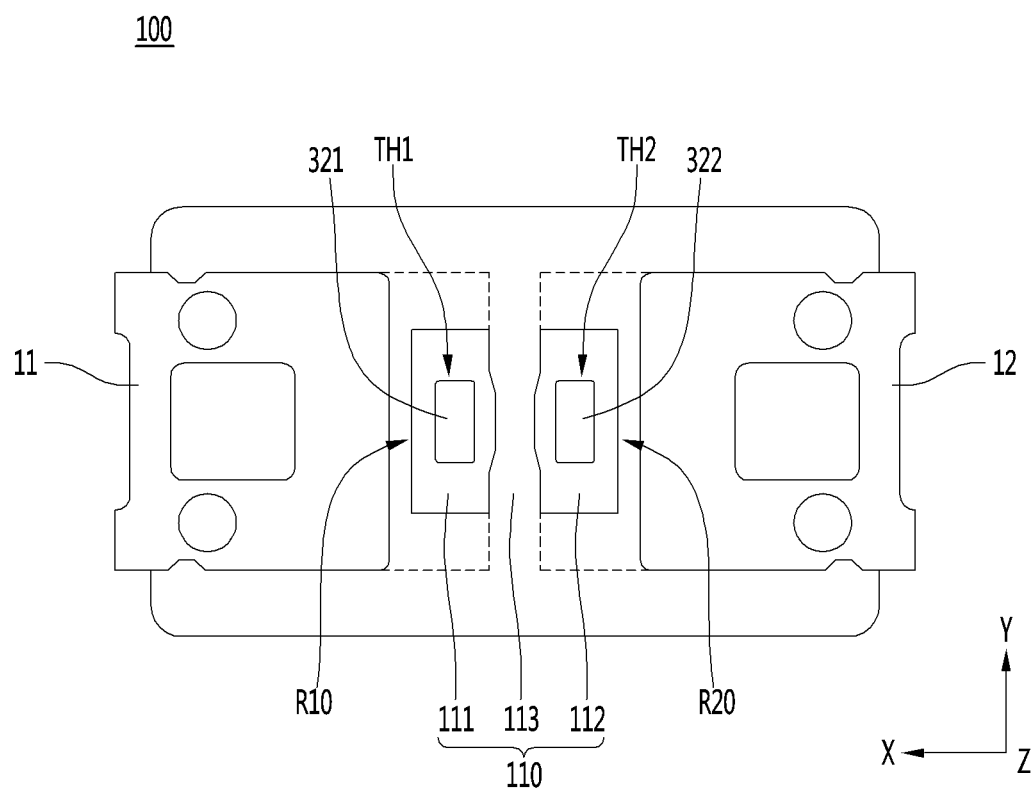

[FIG. 3]
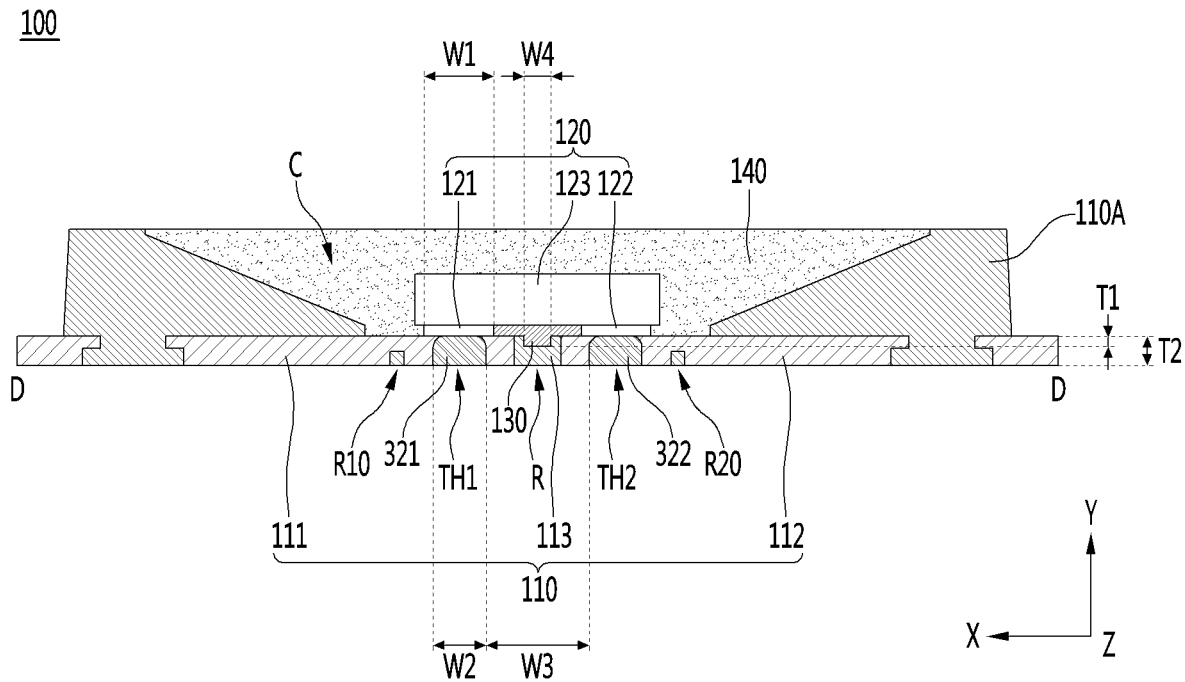
[FIG. 4]
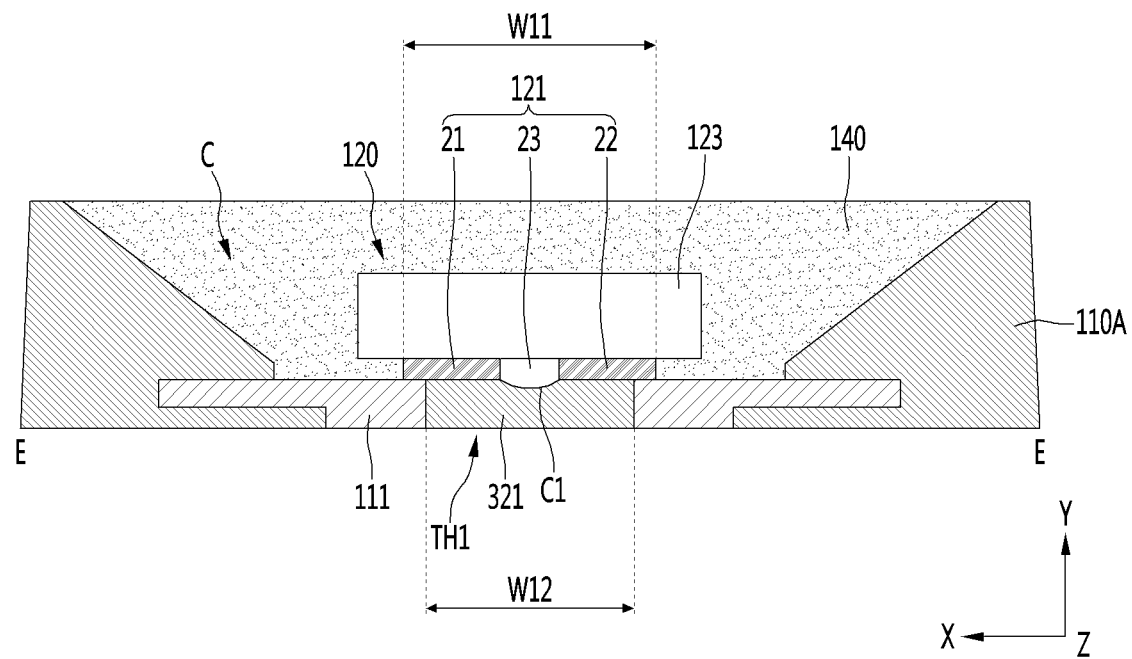

[FIG. 5]
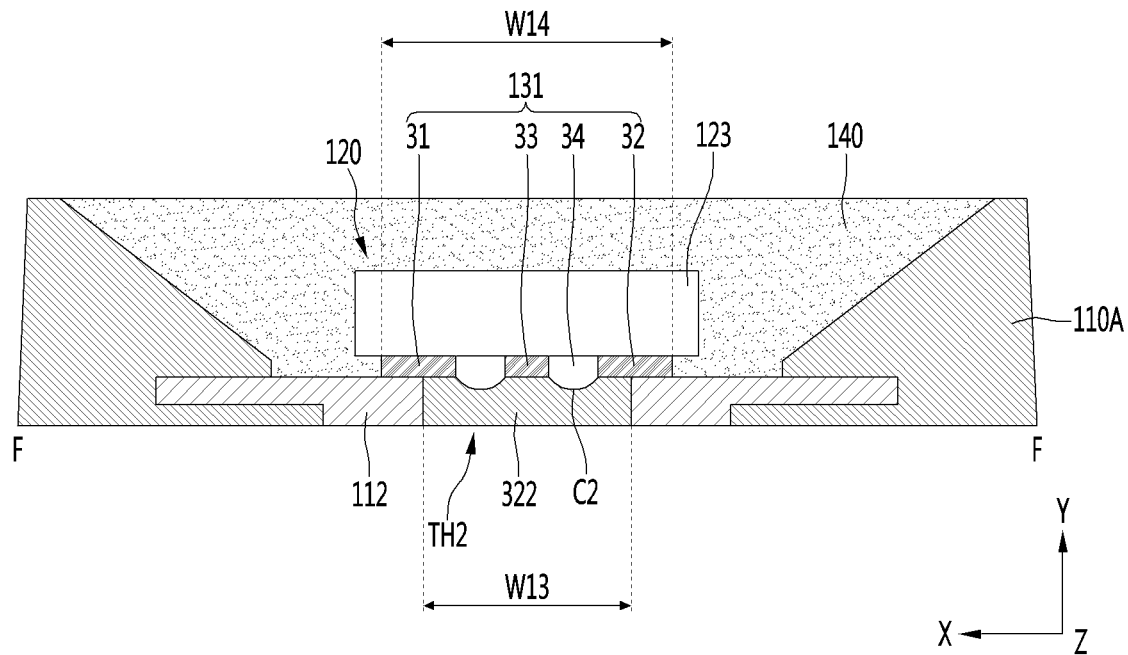
[FIG. 6]
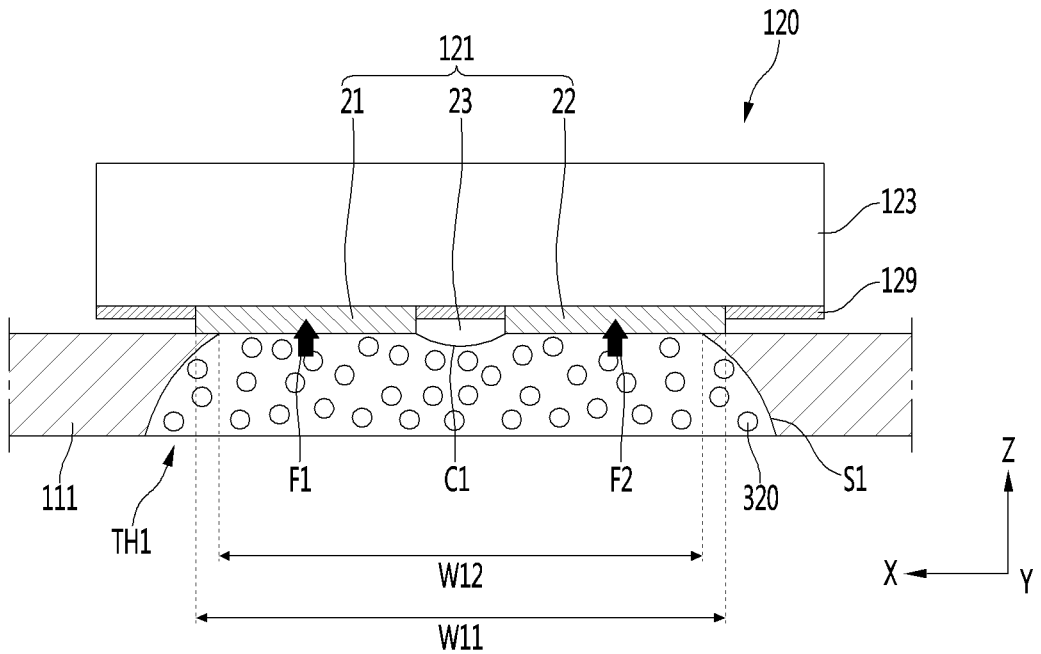

【FIG. 7】
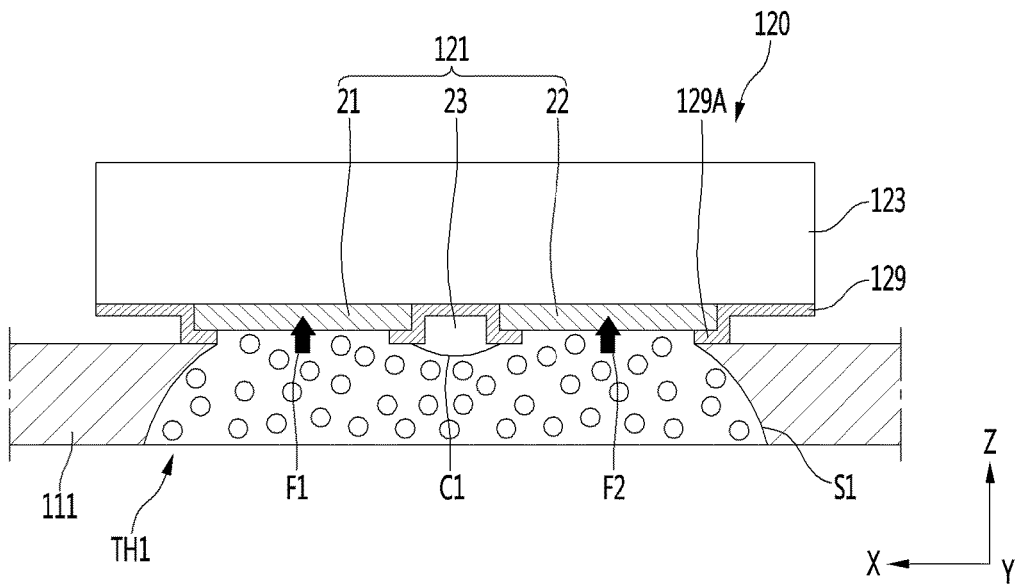
【FIG. 8】
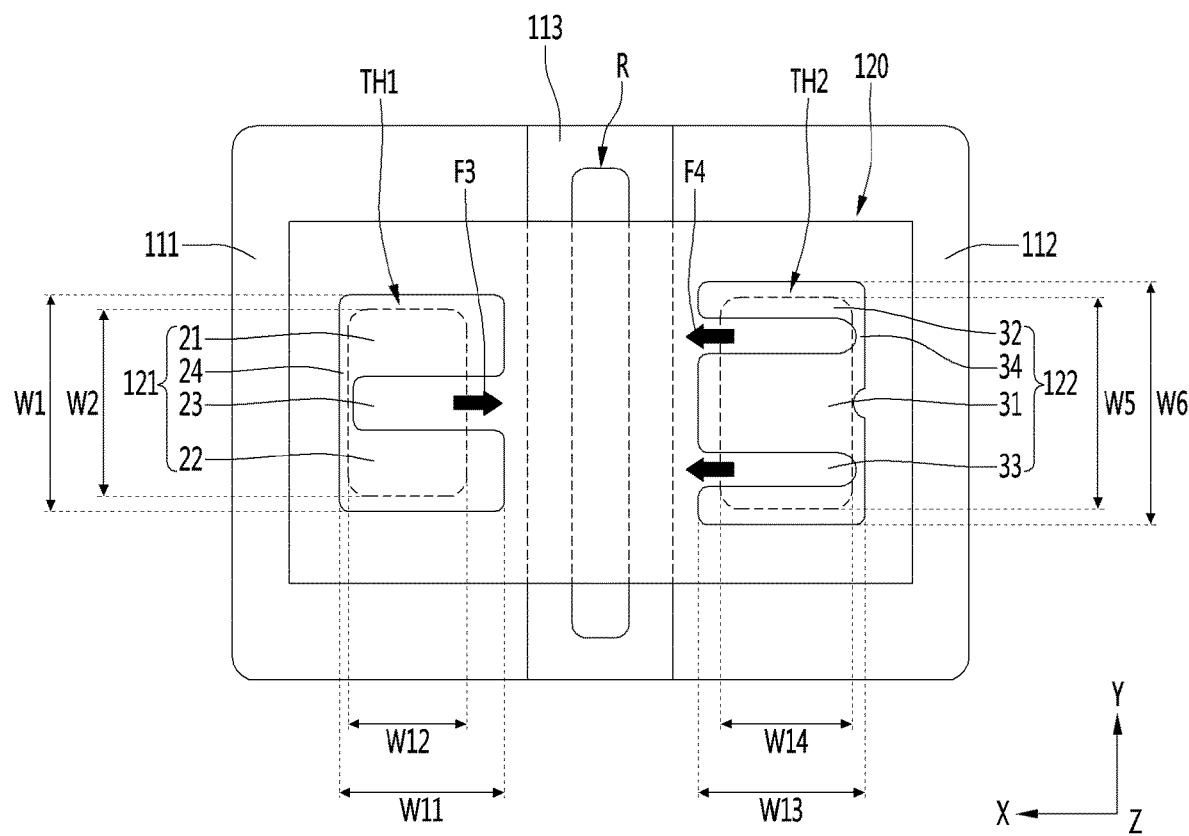

[FIG. 9]
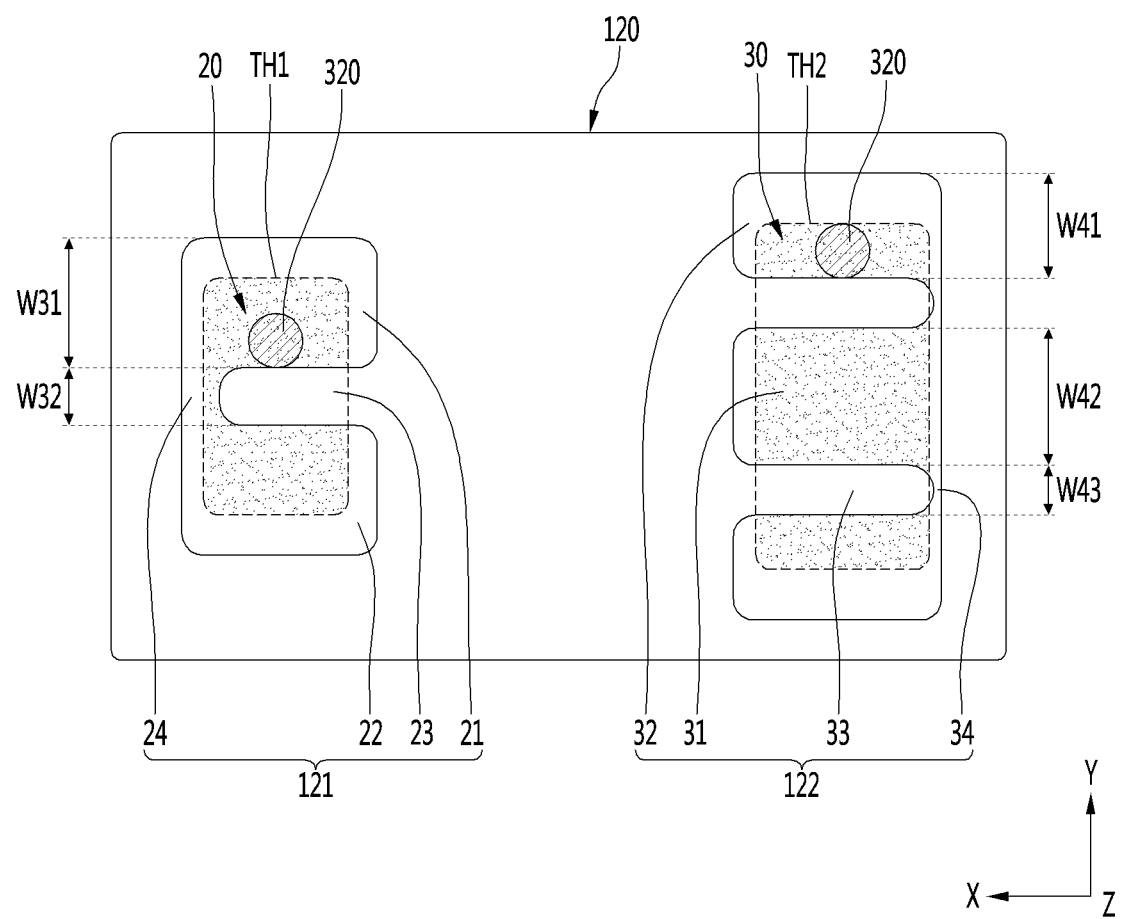

[FIG. 10]
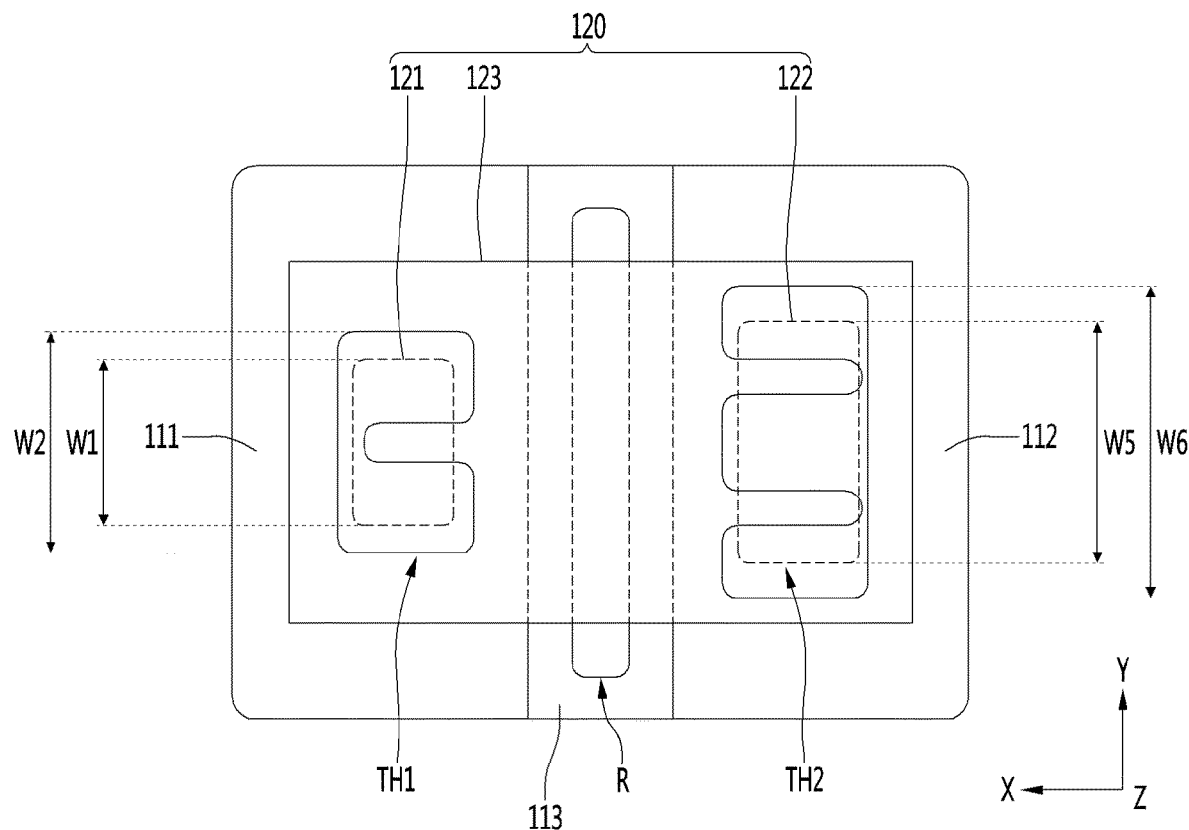

[FIG. 11]
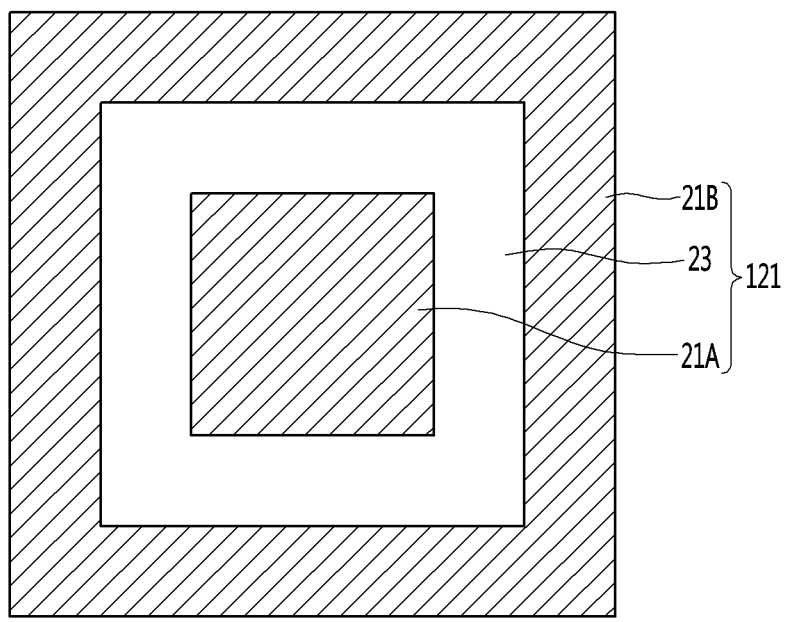
[FIG. 12]
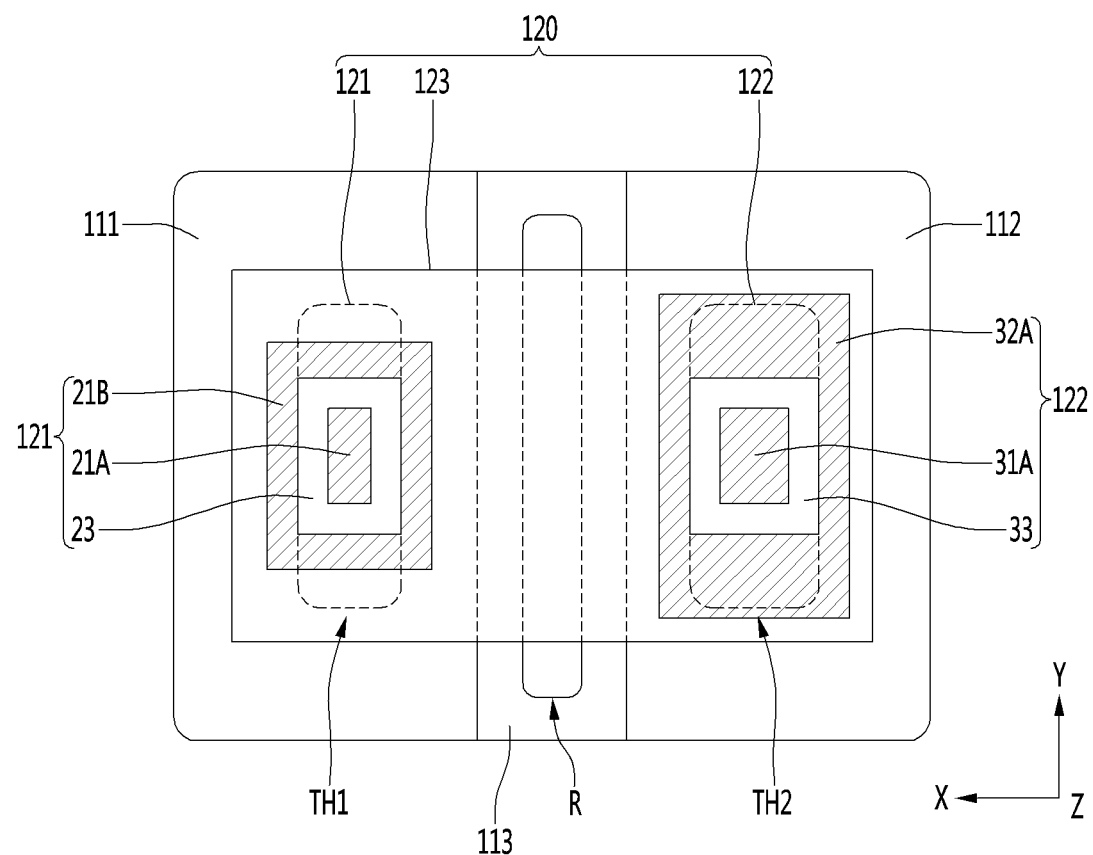

【FIG. 13】
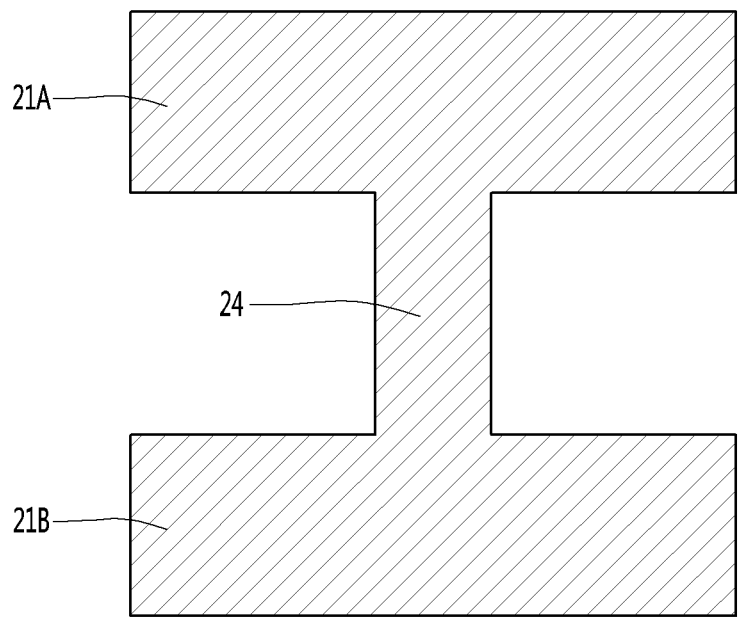
【FIG. 14】
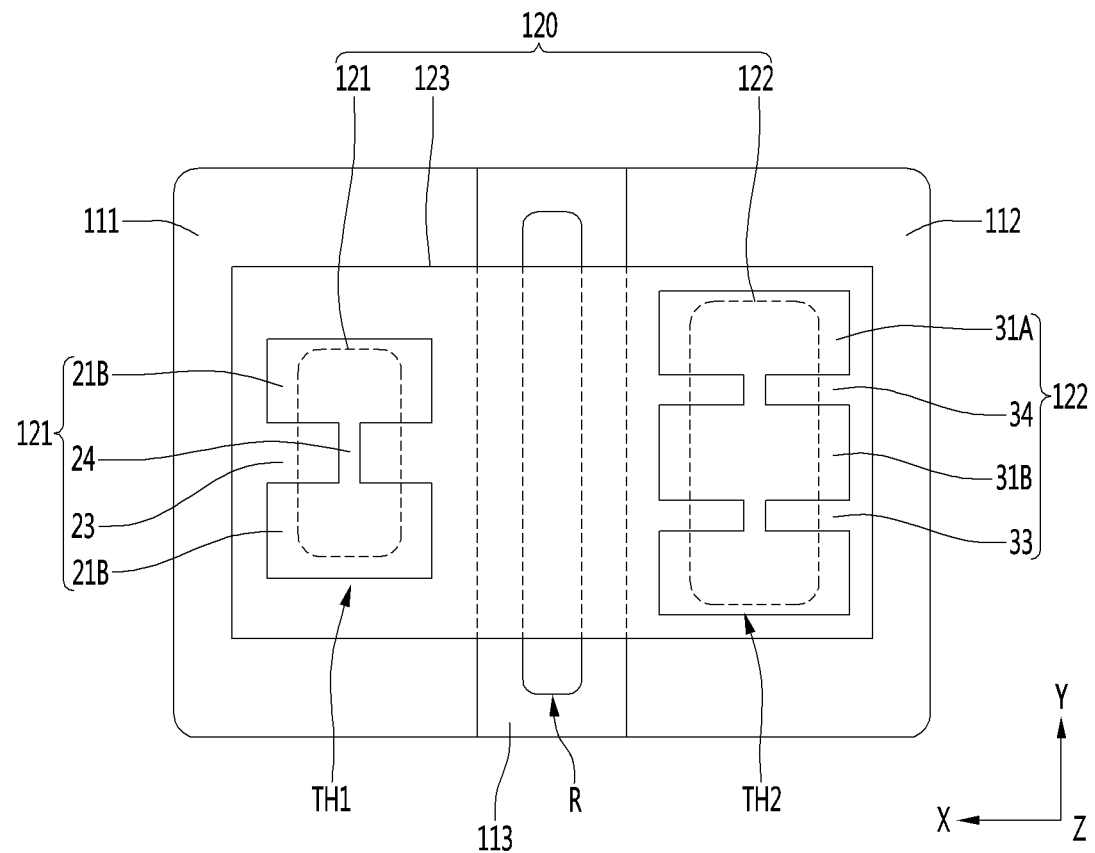

【FIG. 15】
121(122)
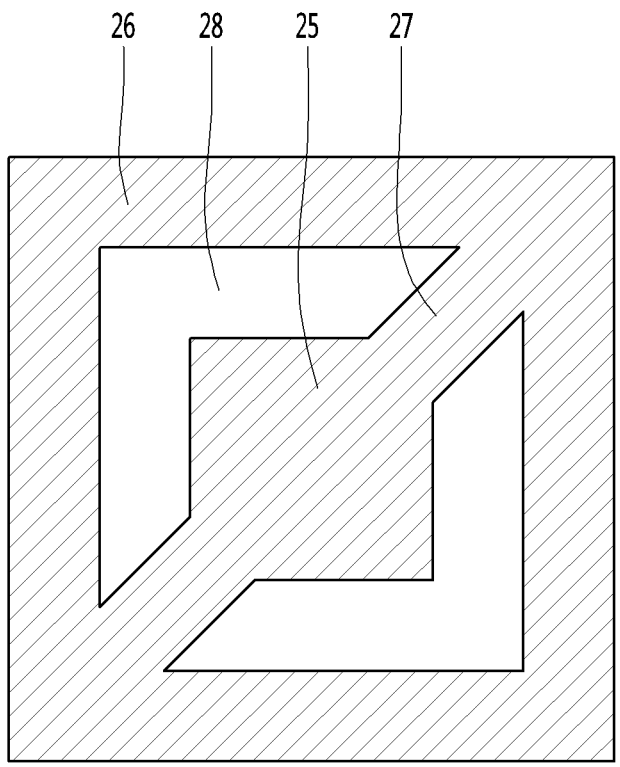

【FIG. 16】
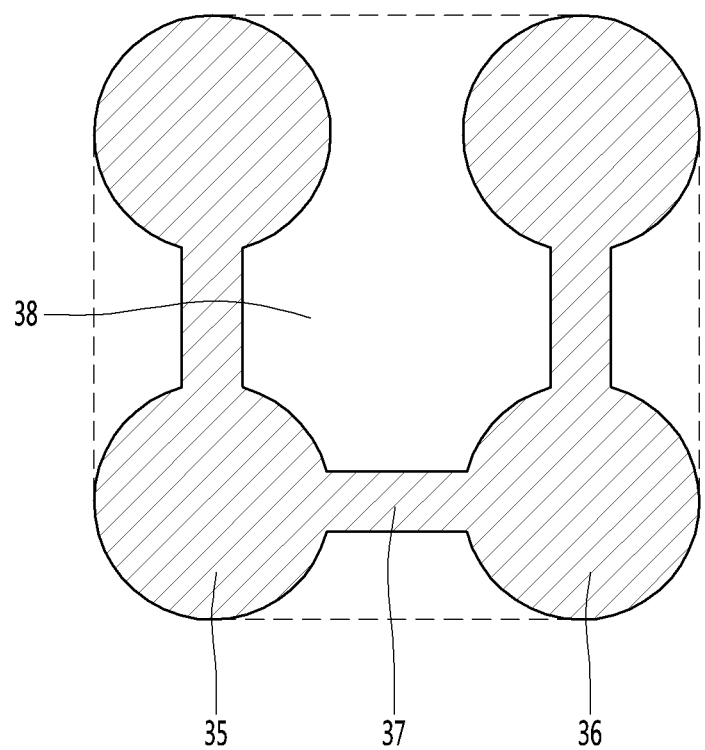

【FIG. 17】
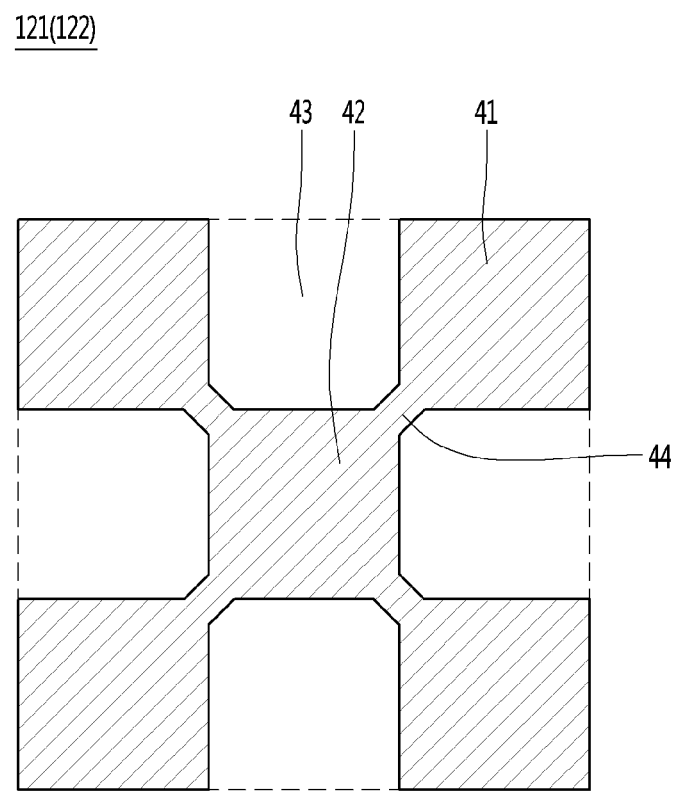

【FIG. 18】
121(122)
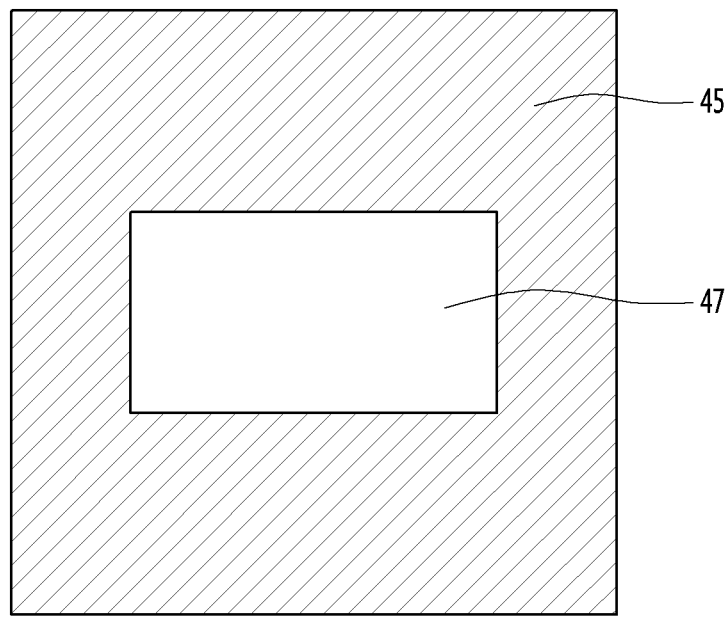

[FIG. 19]
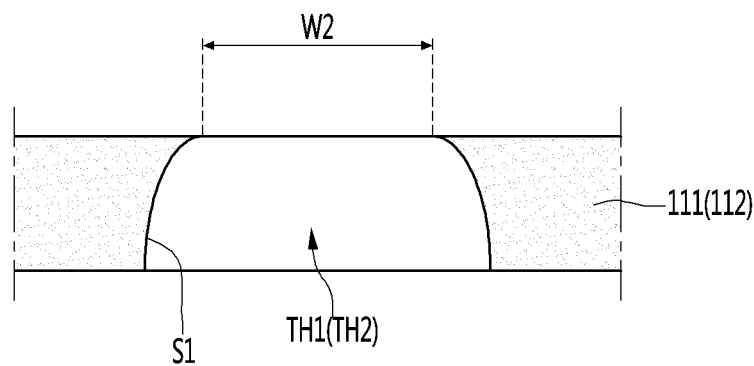
[FIG. 20]
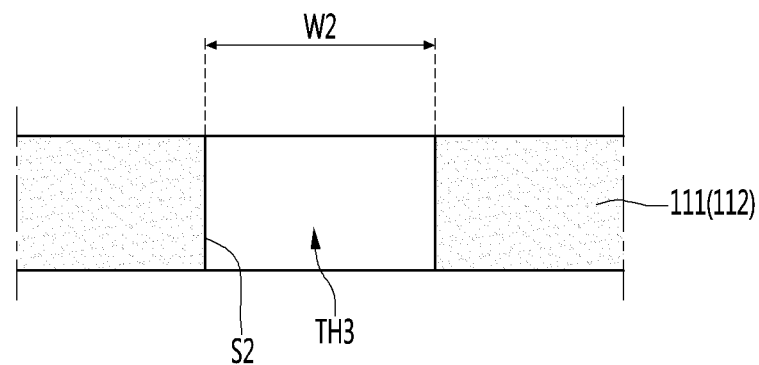

【FIG. 21】
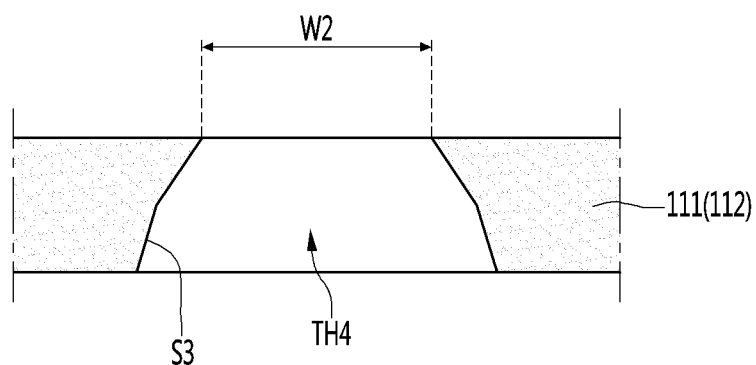
【FIG. 22】
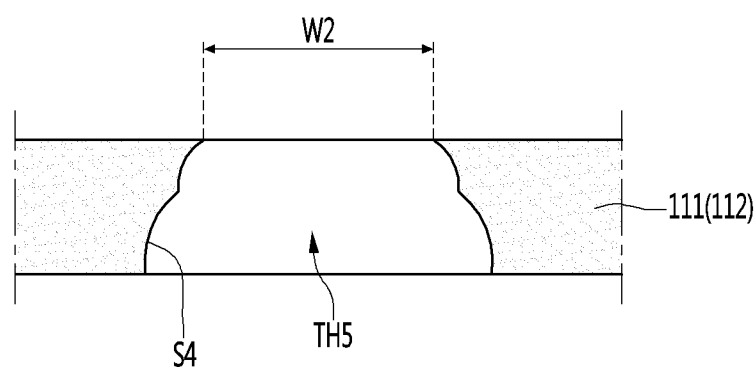

[FIG. 23]
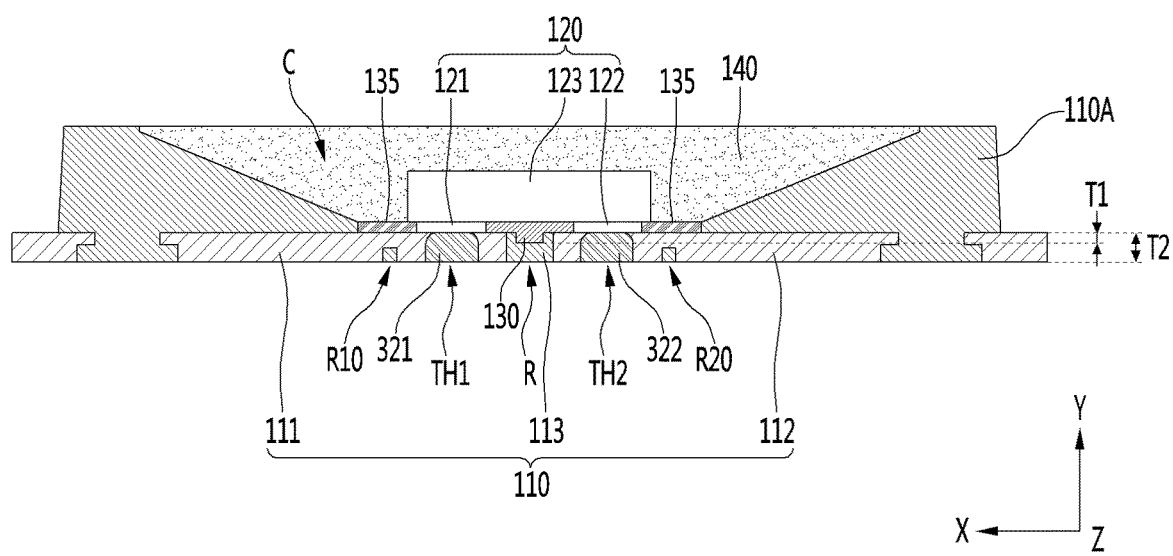
[FIG. 24]
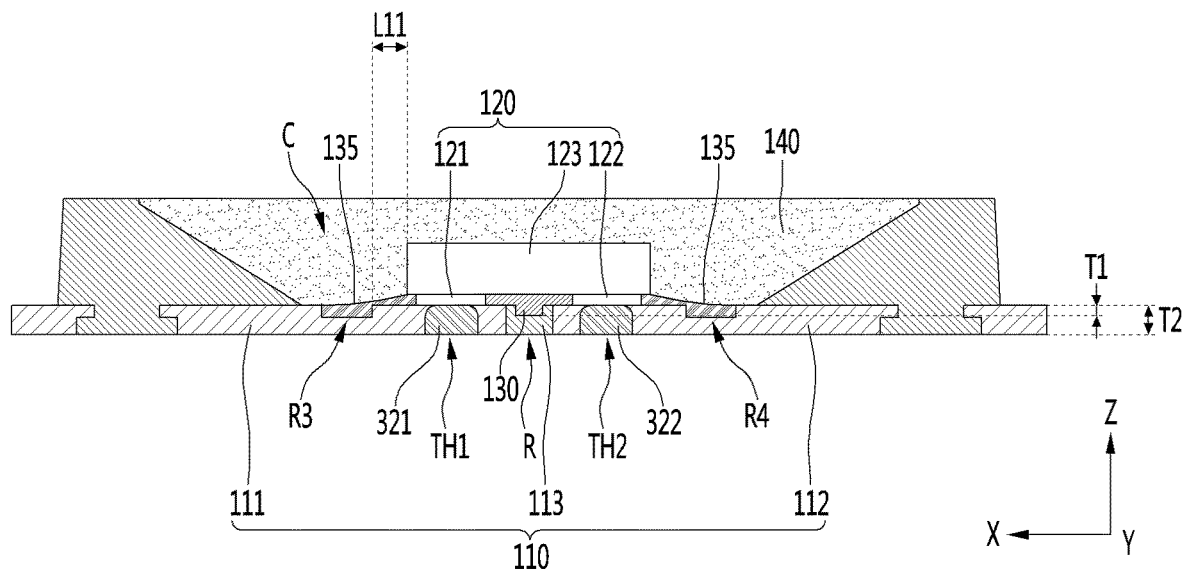

[FIG. 25]
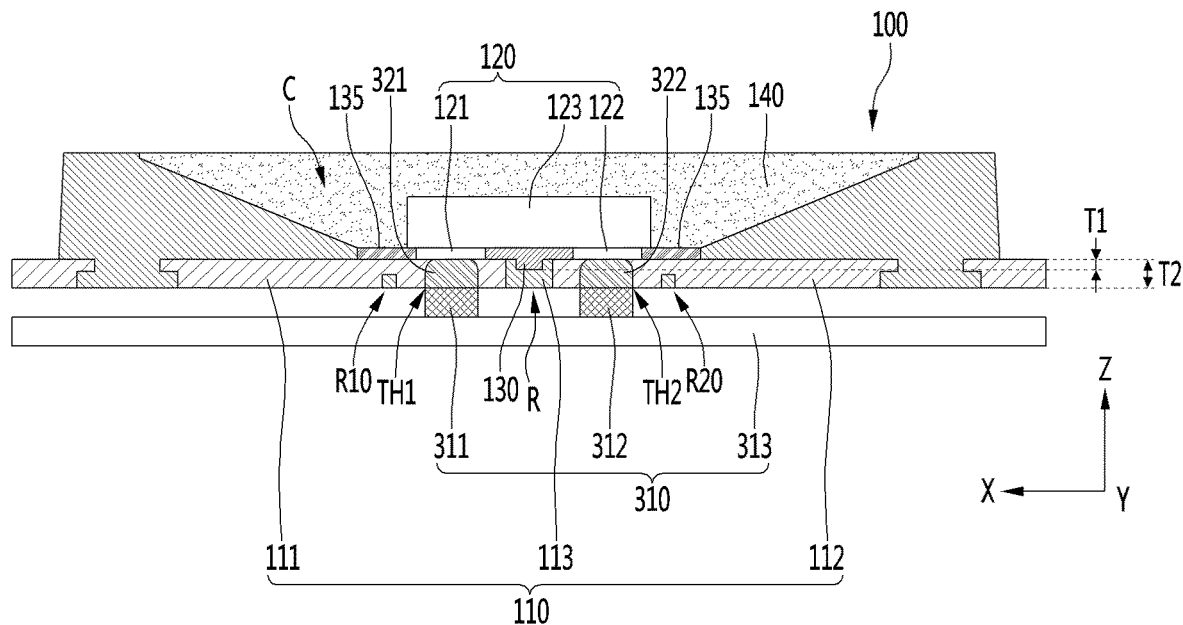
[FIG. 26]
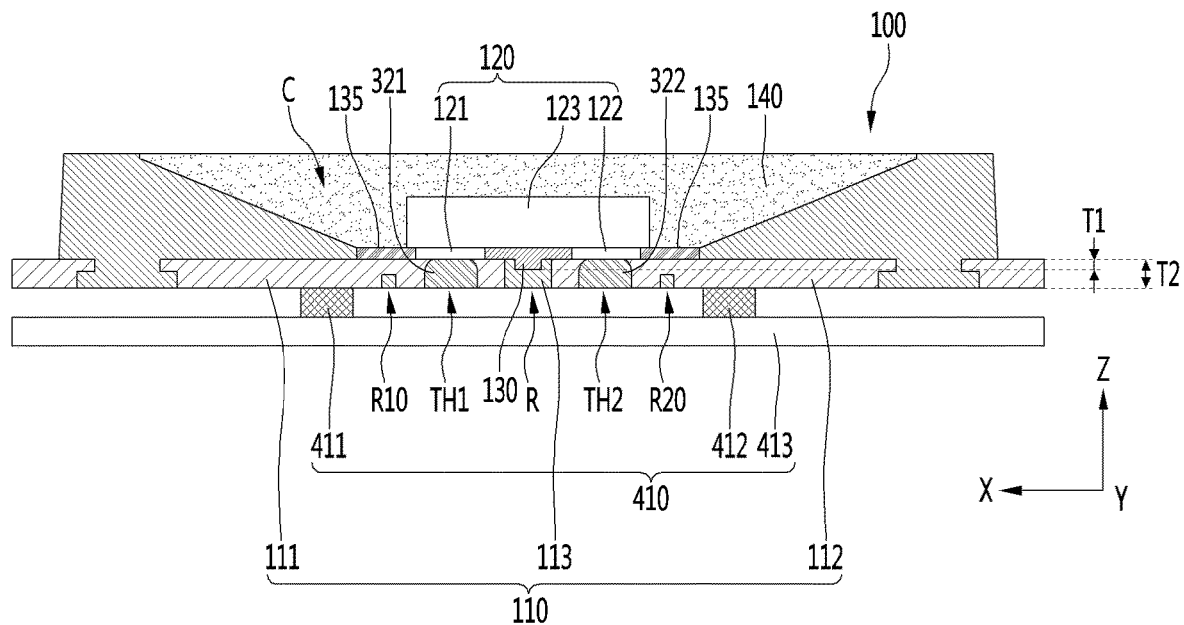

【FIG. 27】
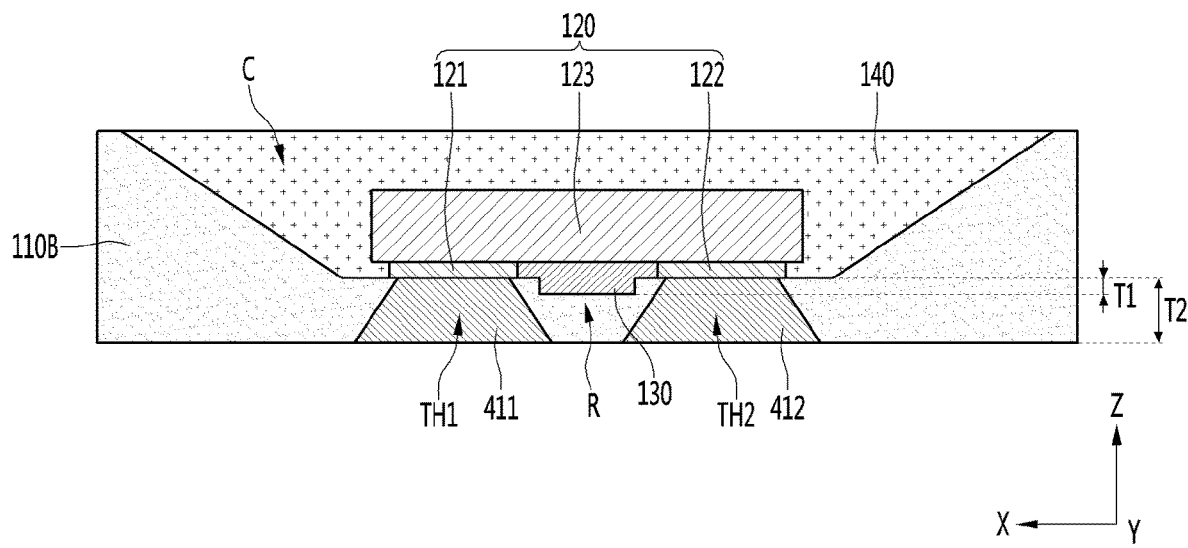
【FIG. 28】
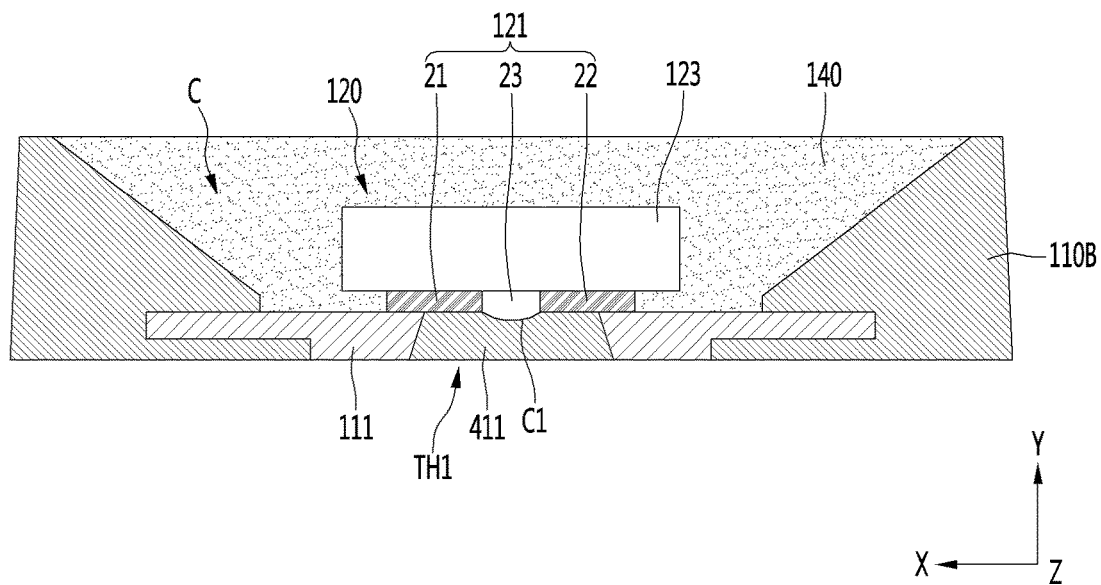

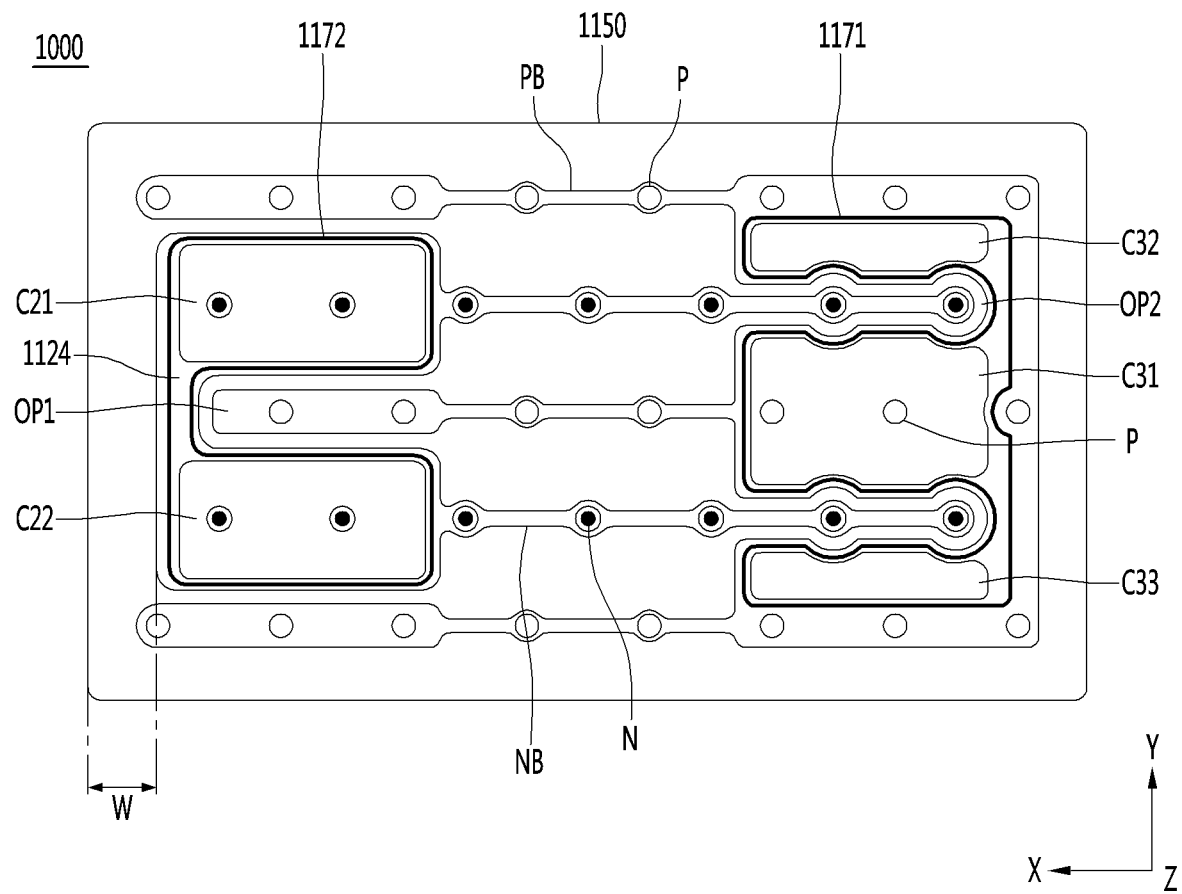
[FIG. 29]

[FIG. 30]
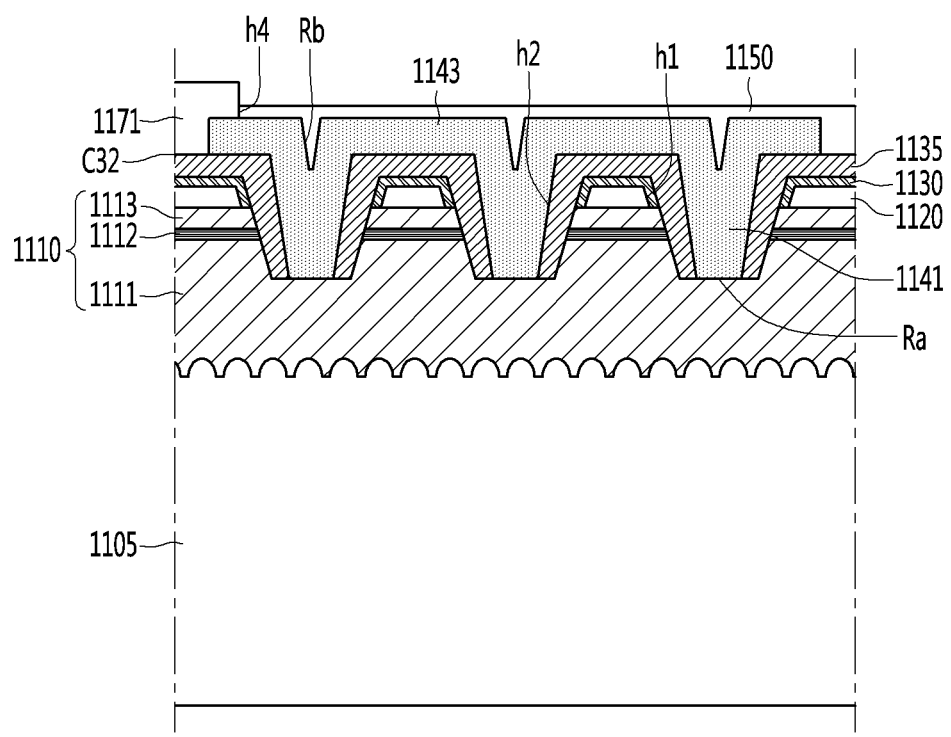

[FIG. 31]
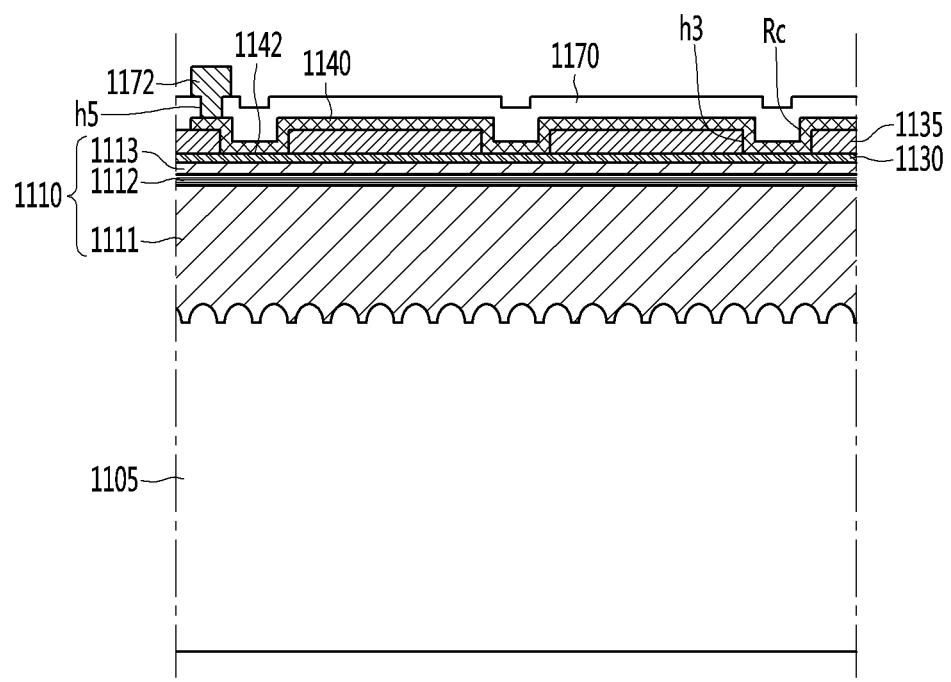

[FIG. 32]
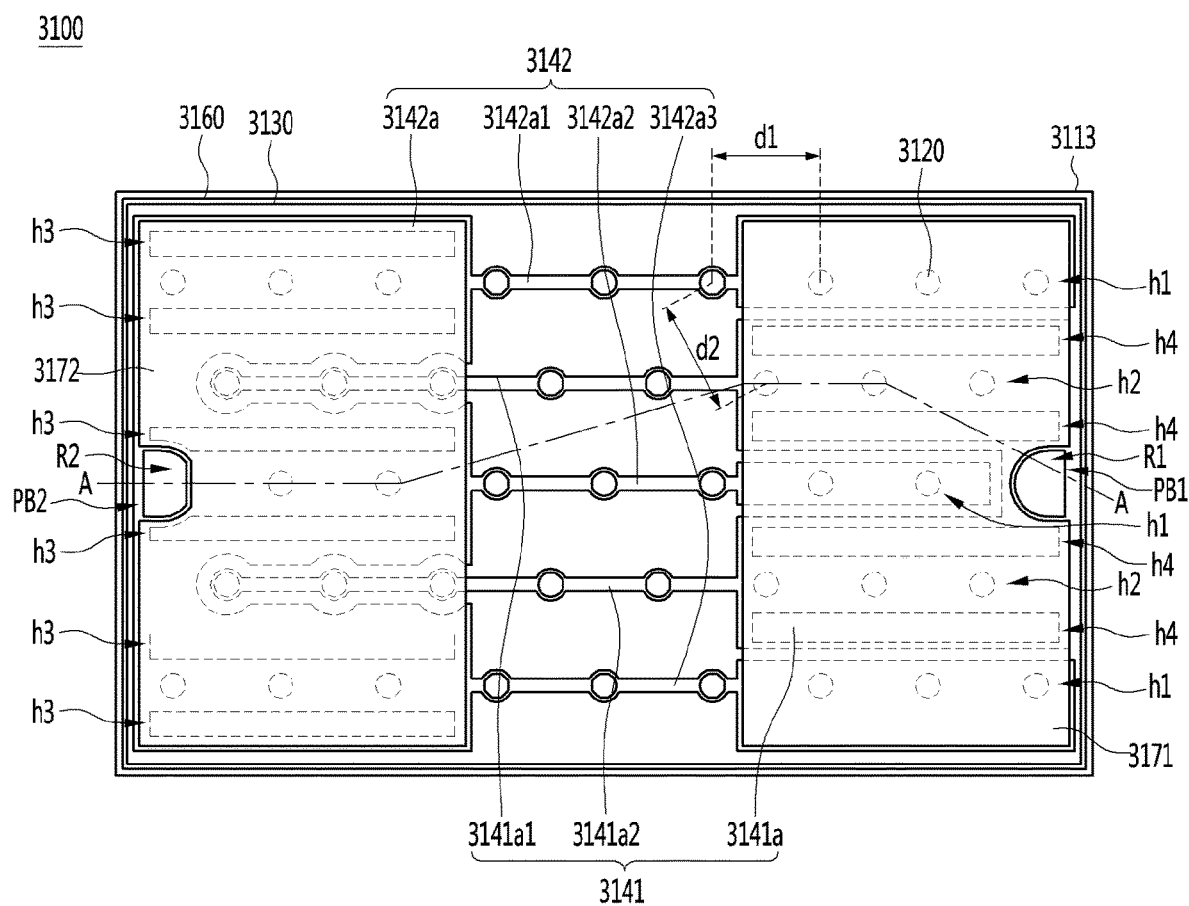

[FIG. 33]
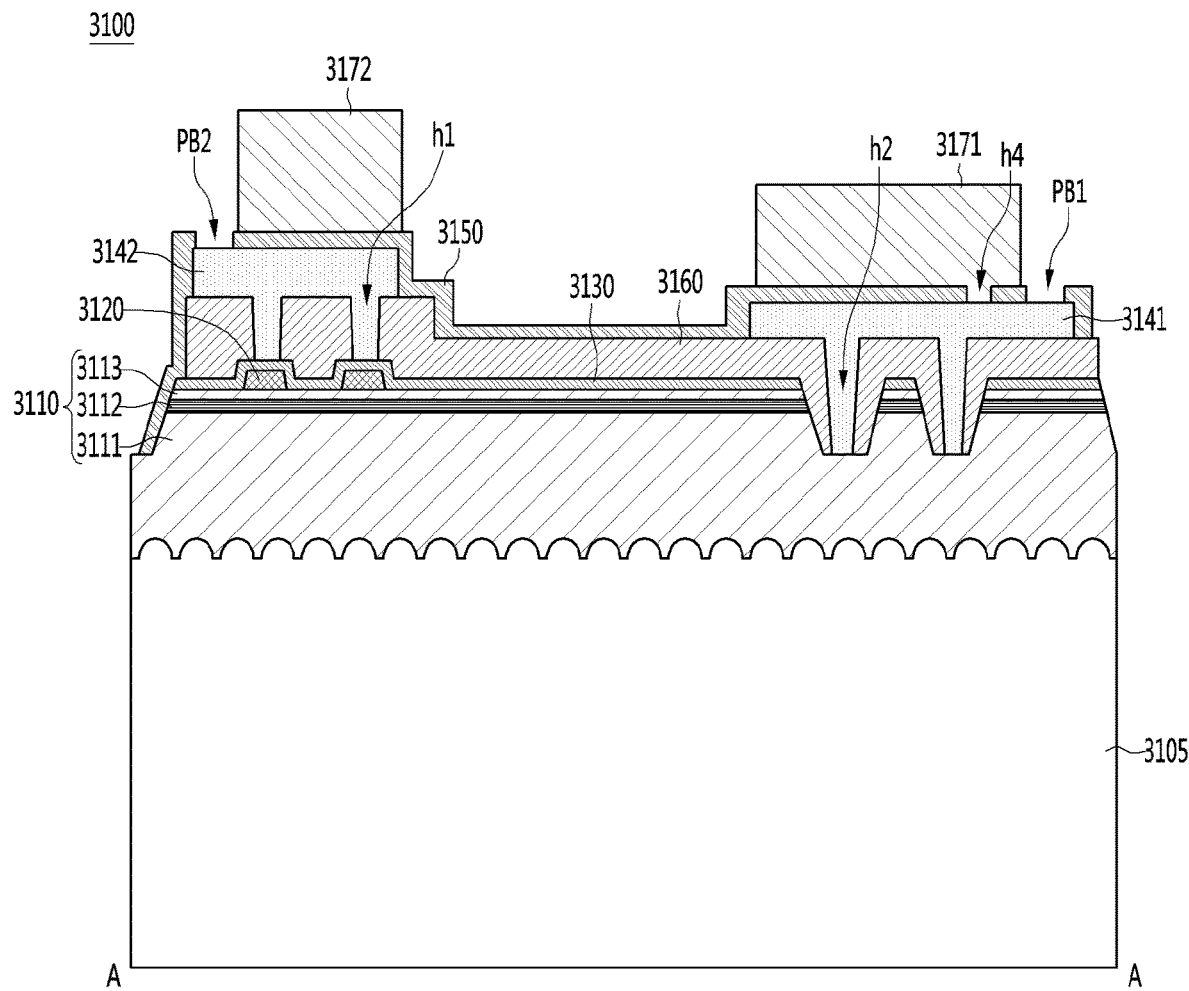

[FIG. 34a]
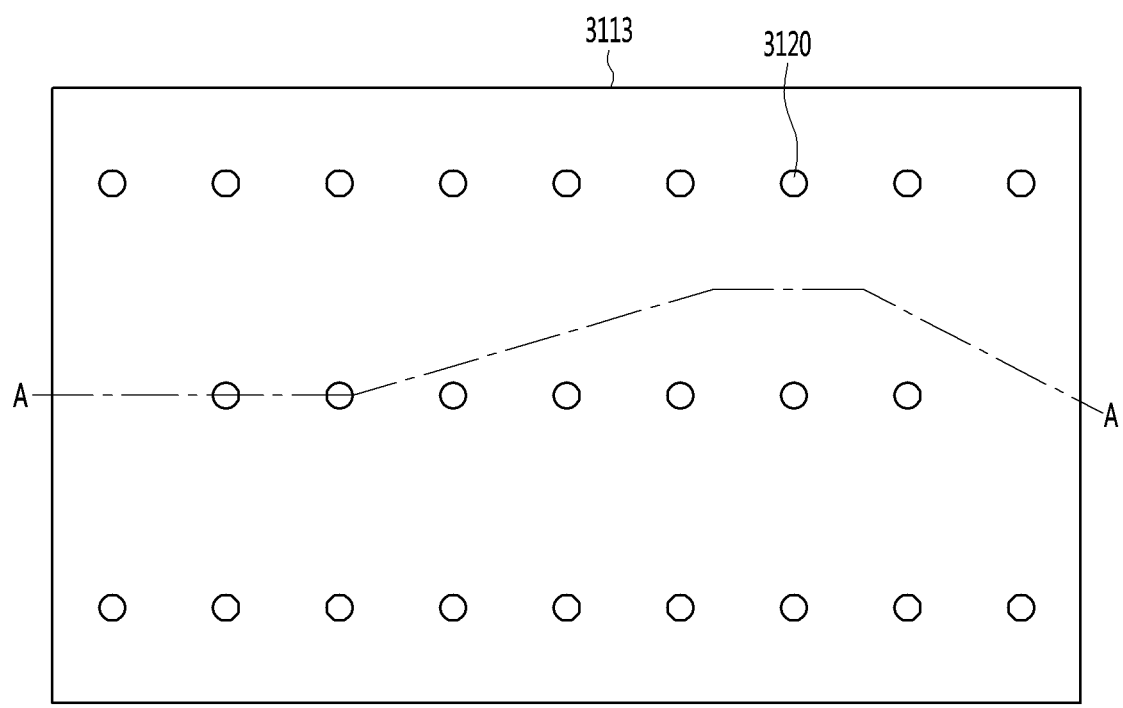

【FIG. 34b】
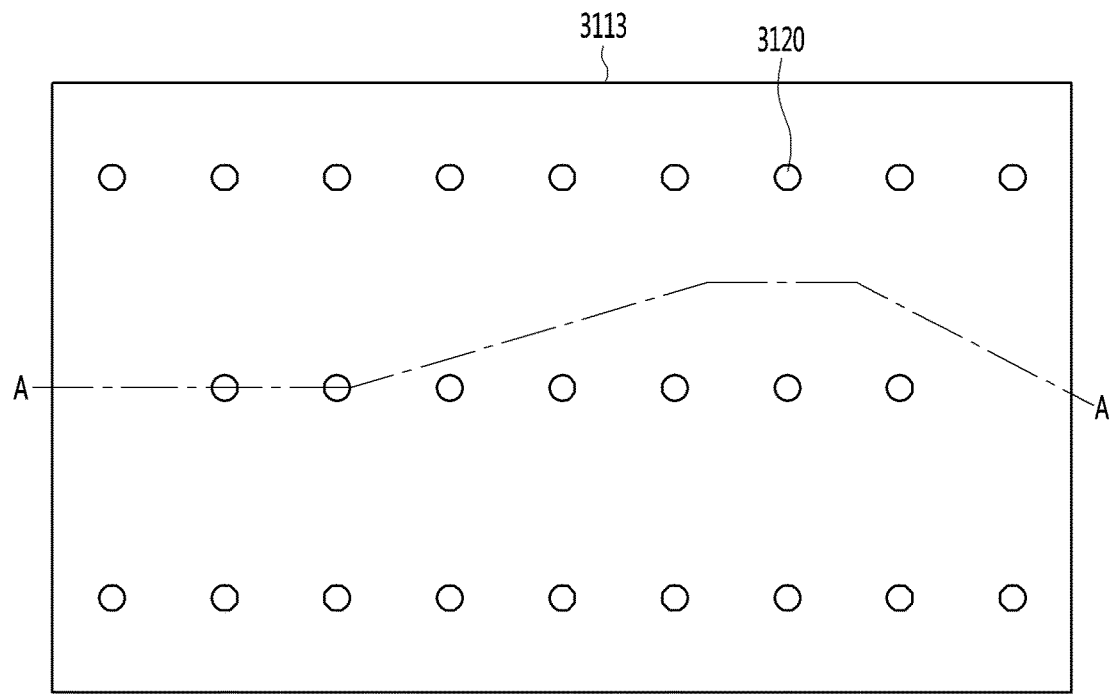
【FIG. 34c】
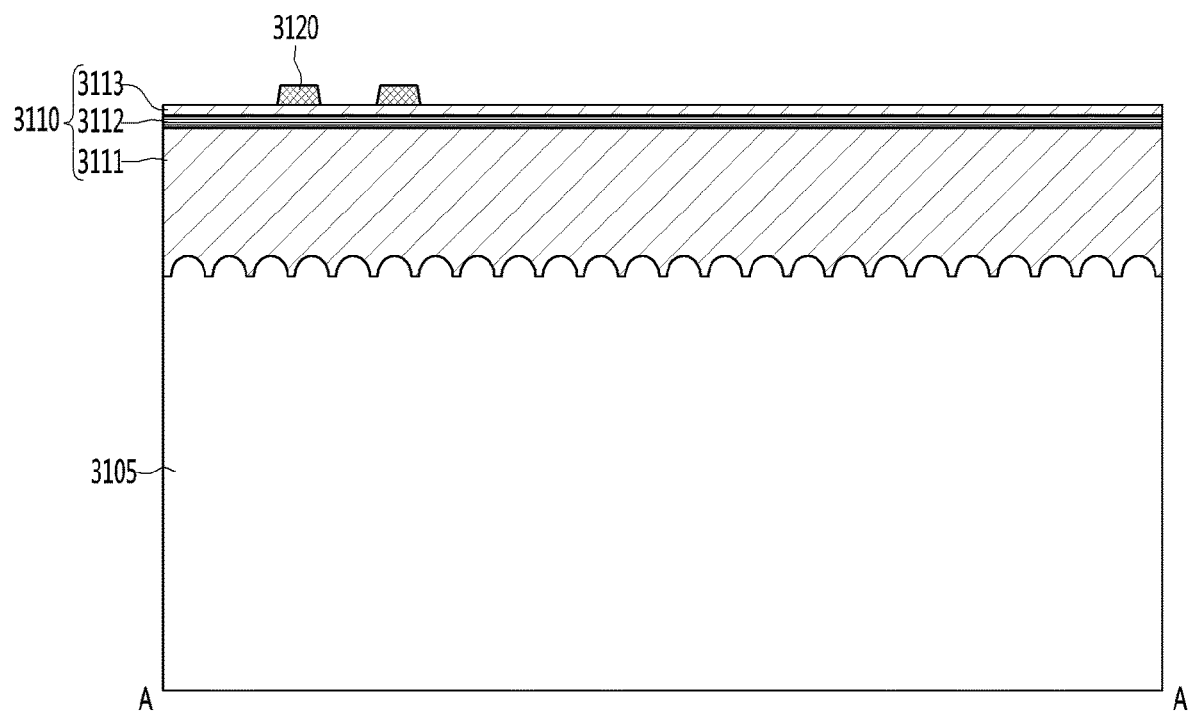

[FIG. 35a]
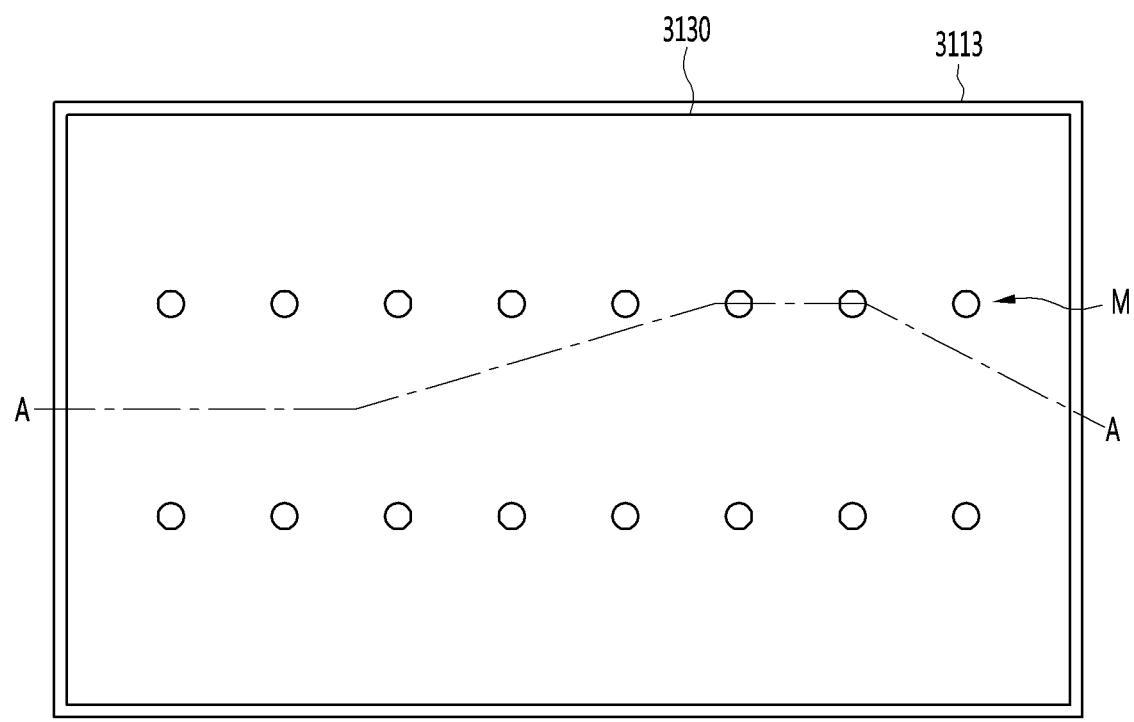

【FIG. 35b】
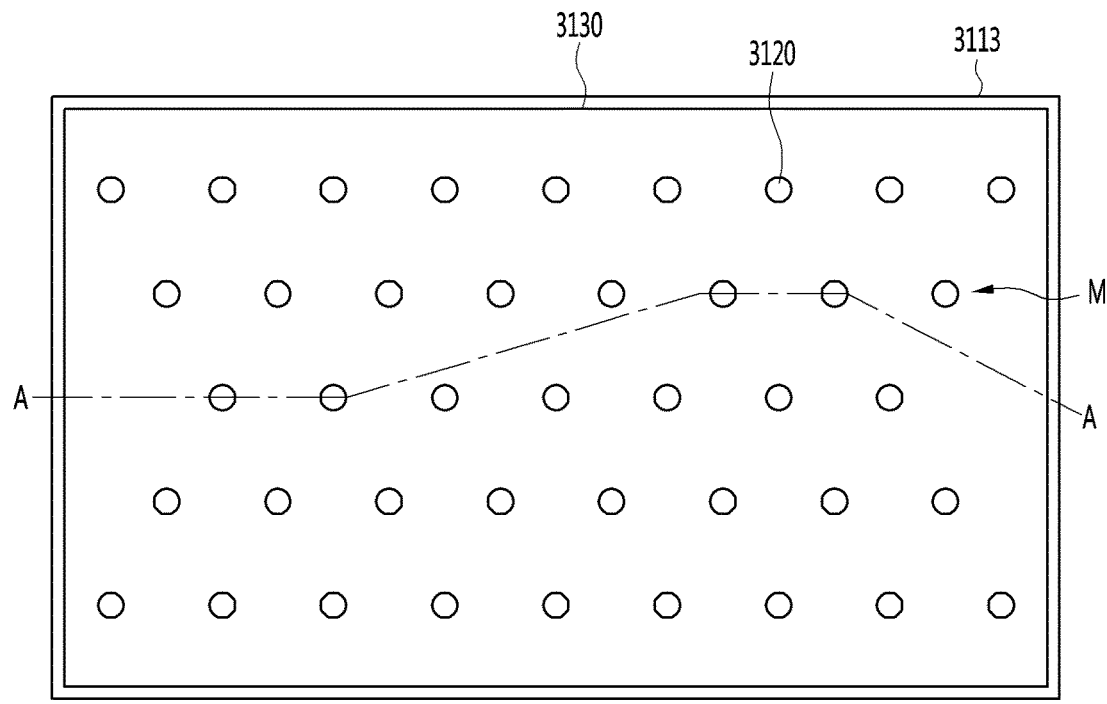
【FIG. 35c】
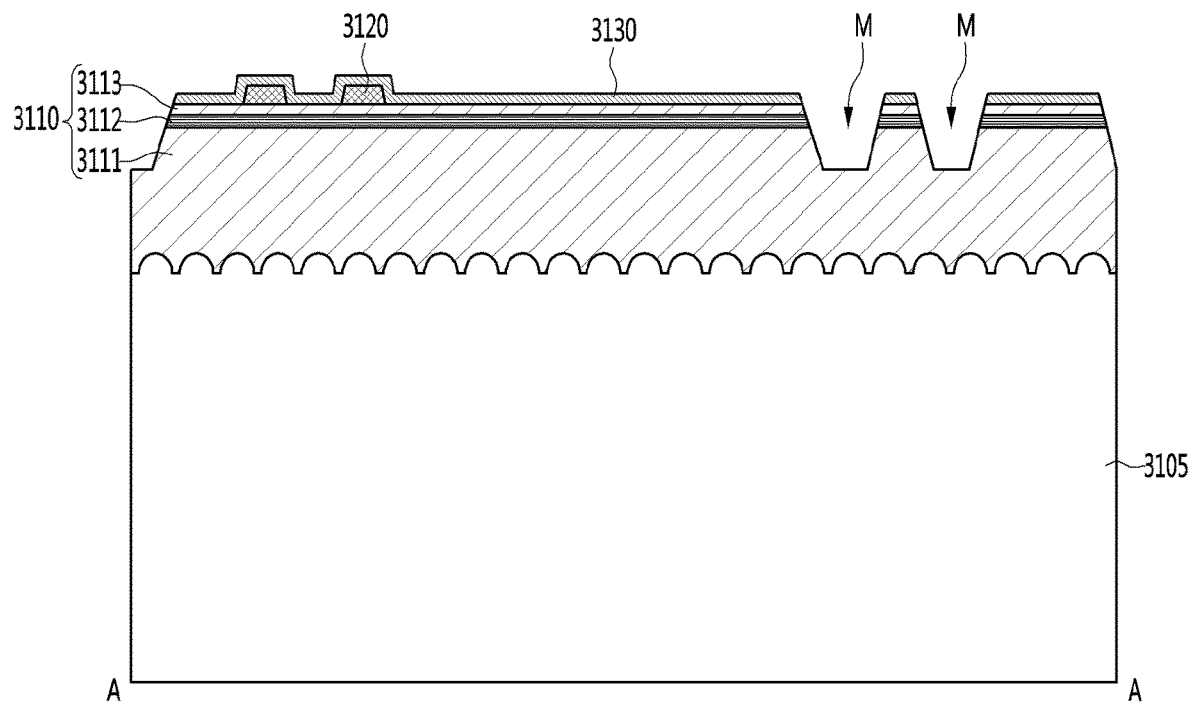

【FIG. 36a】
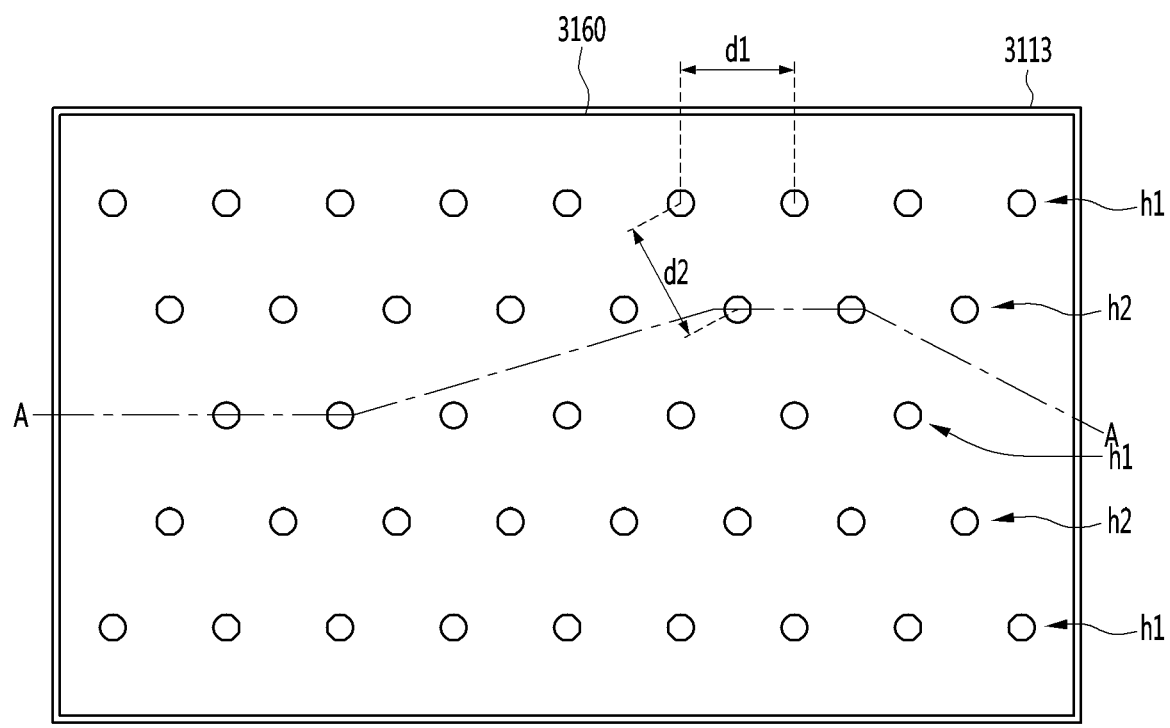

[FIG. 36b]
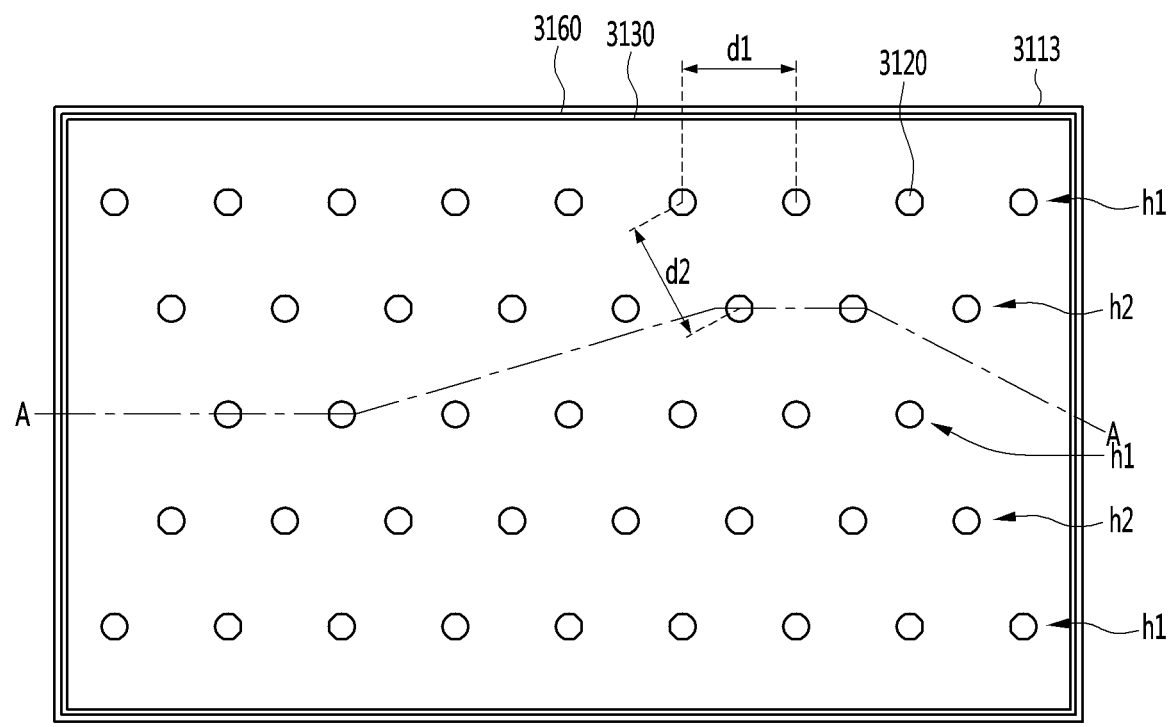

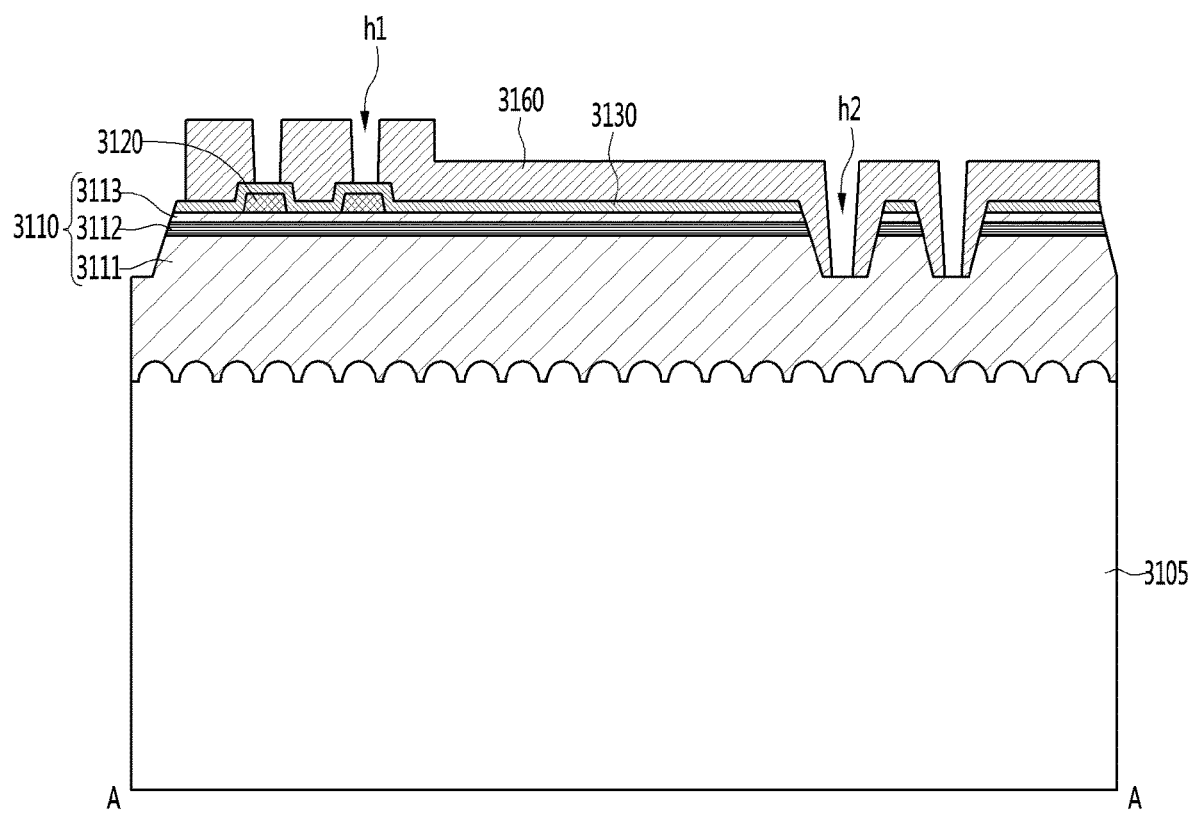
[FIG. 36c]

[FIG. 37a]
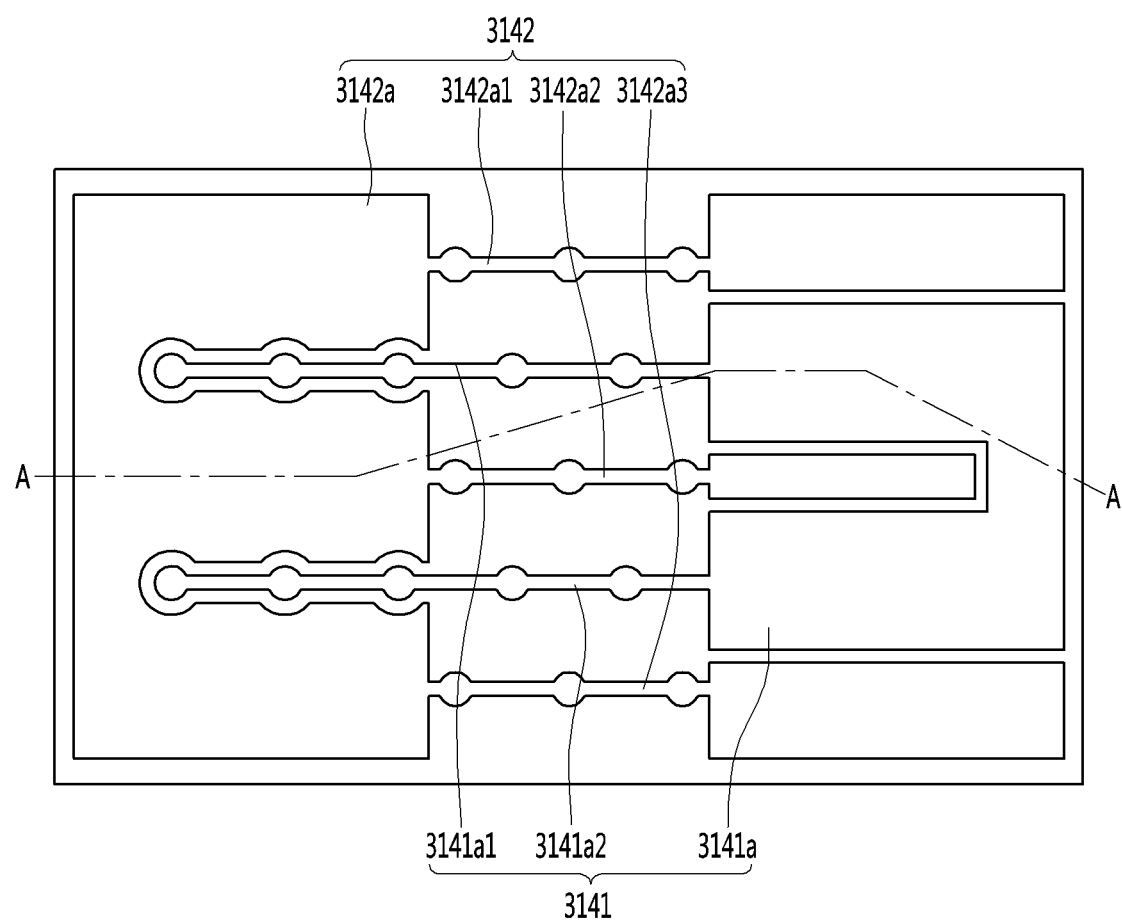

[FIG. 37b]
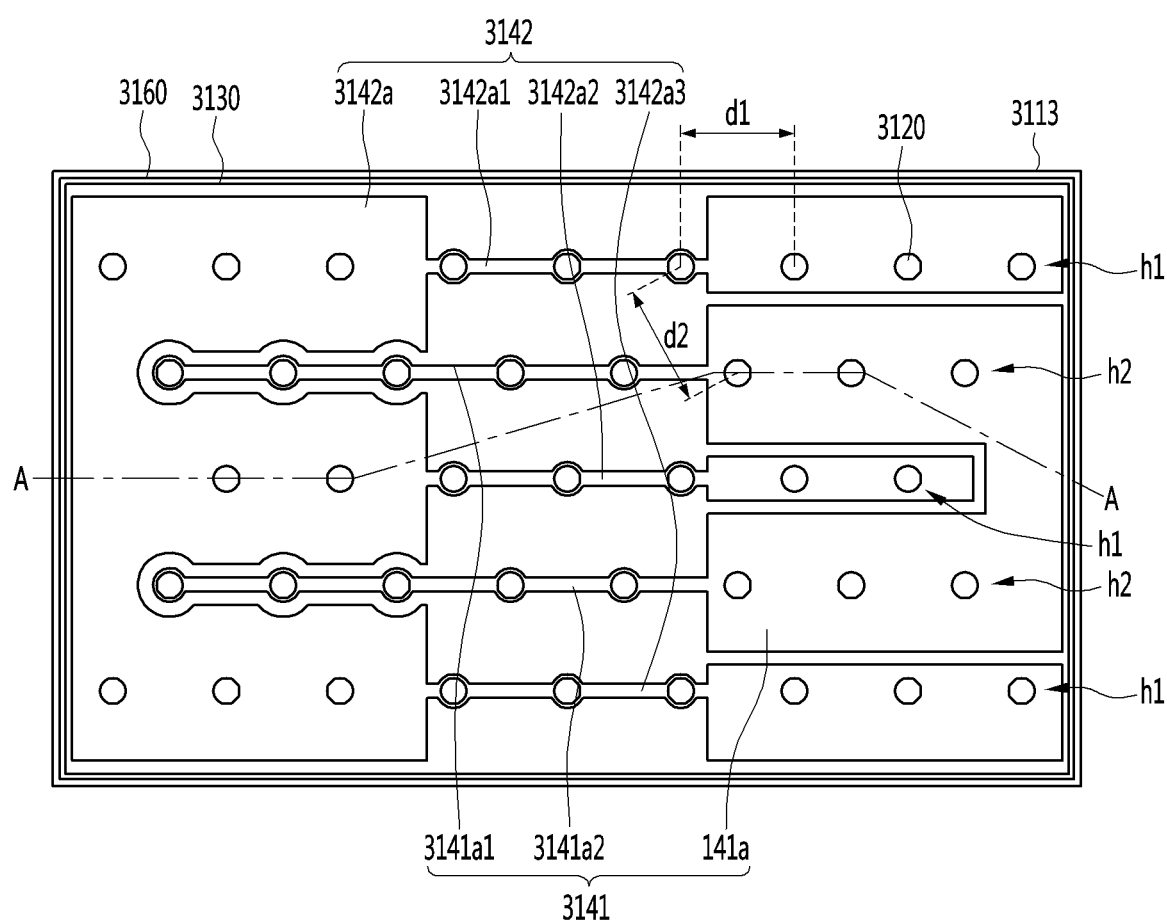

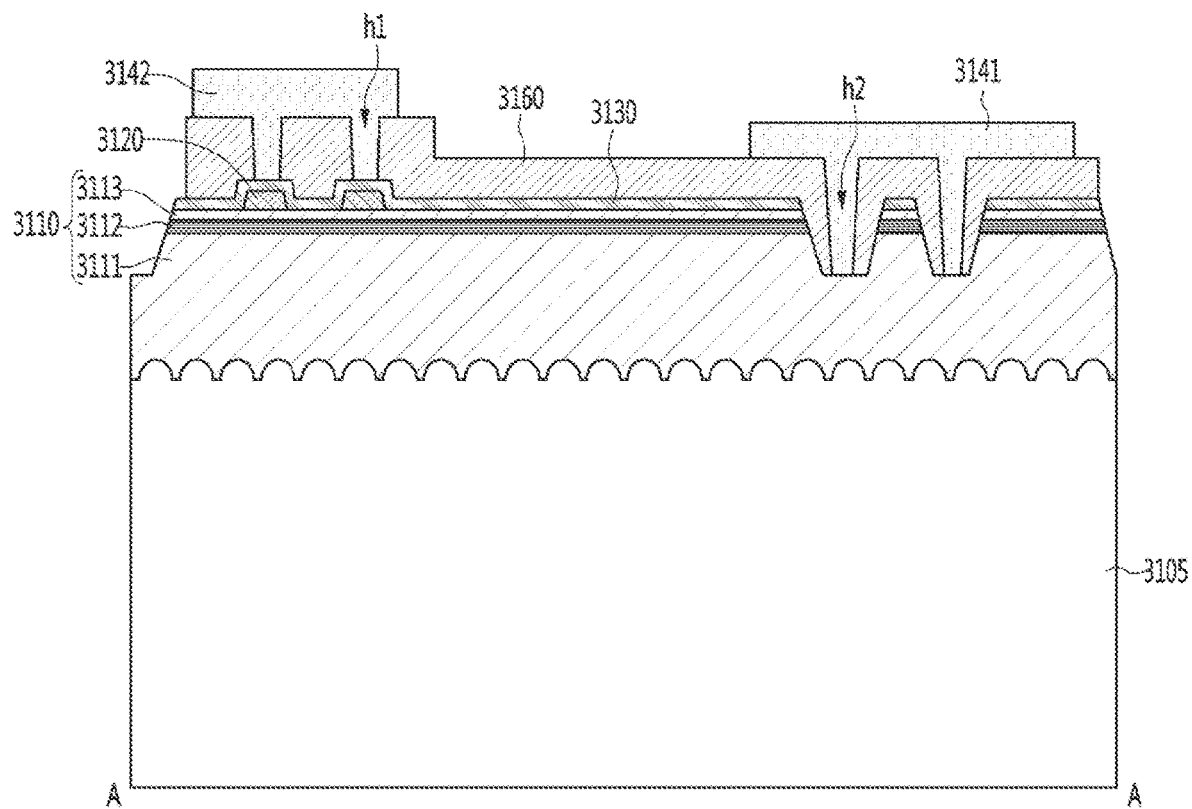
[FIG. 37c]

[FIG. 38a]
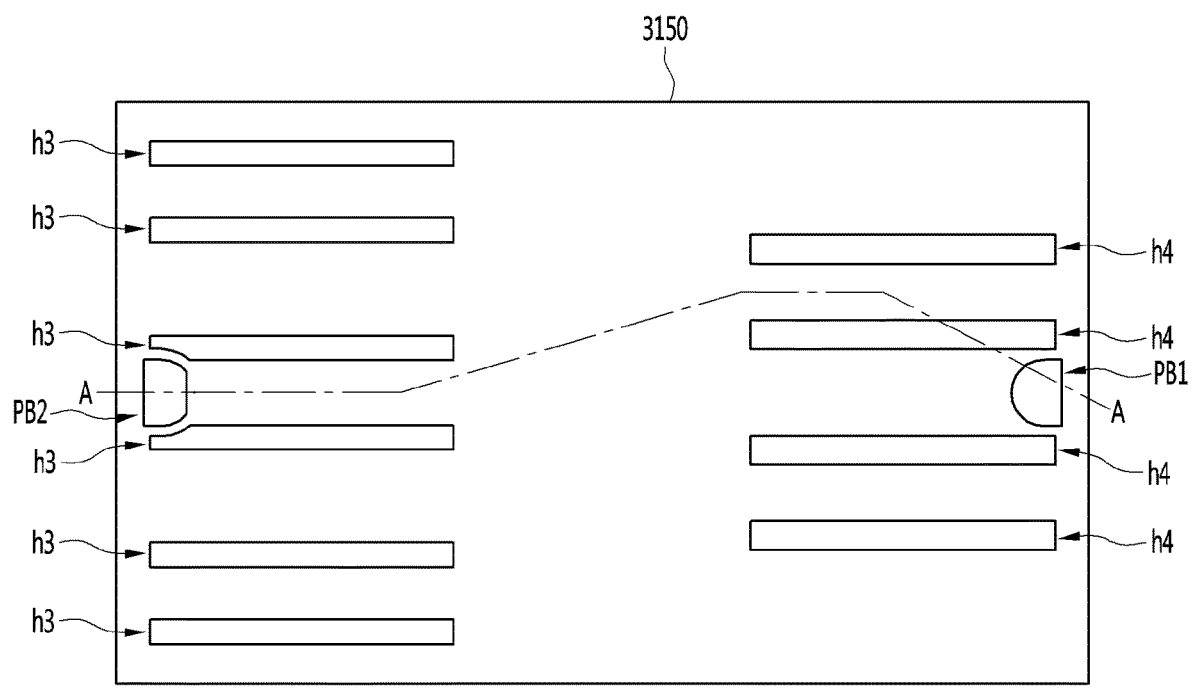

[FIG. 38b]
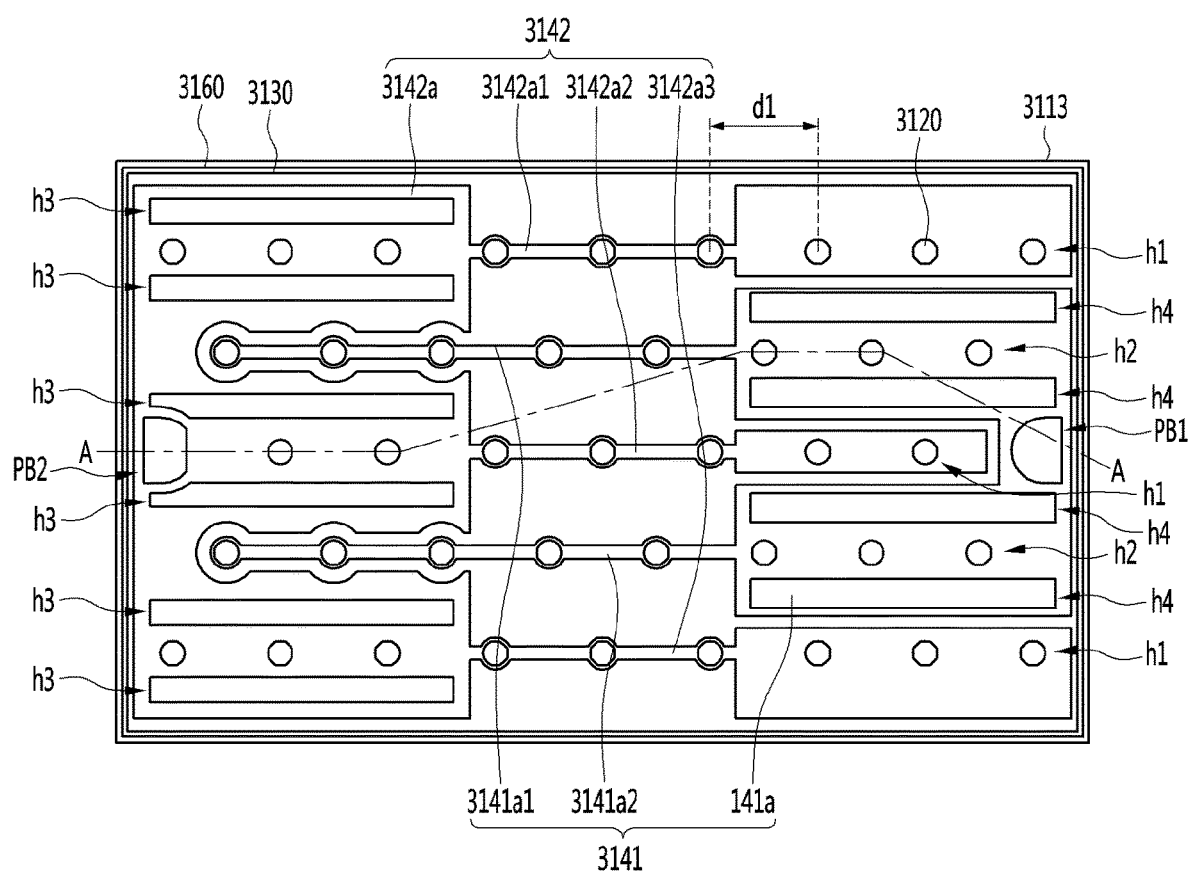

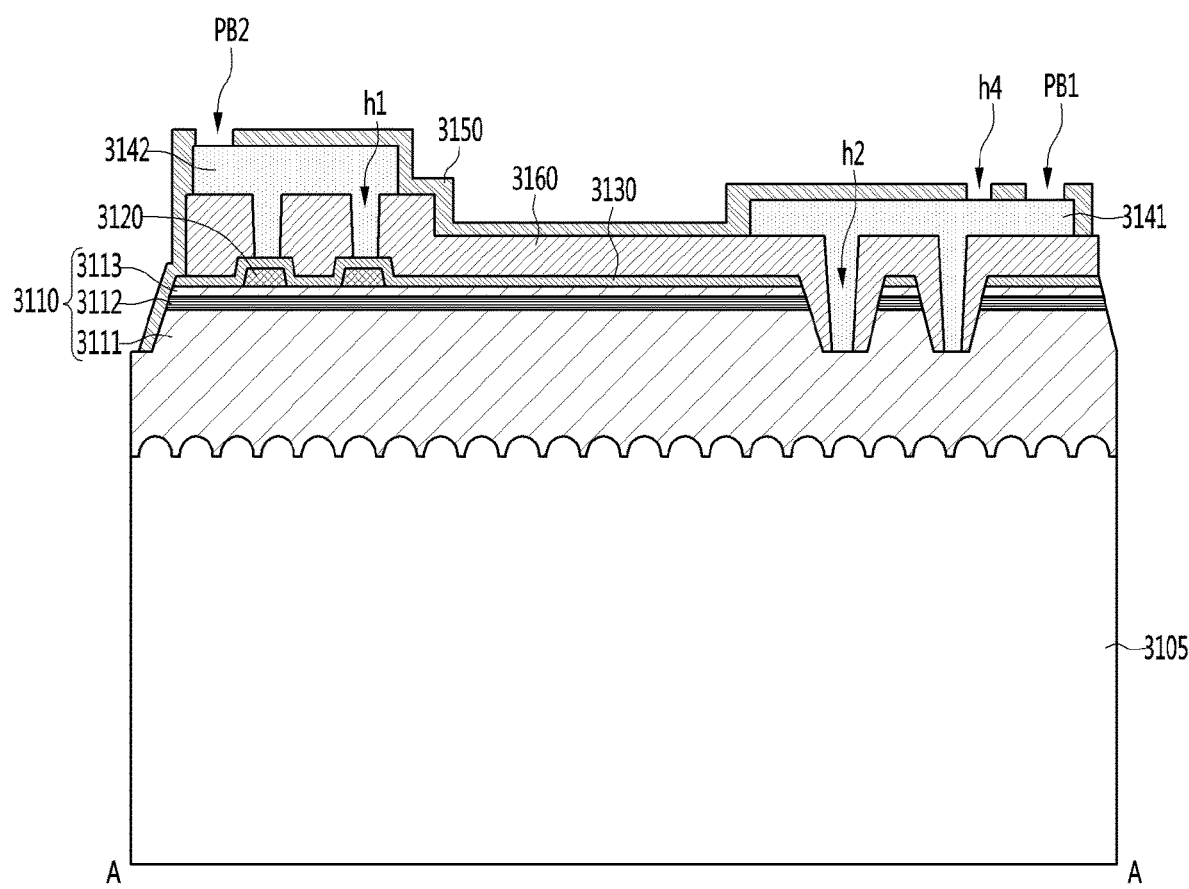
【FIG. 38c】

【FIG. 39a】
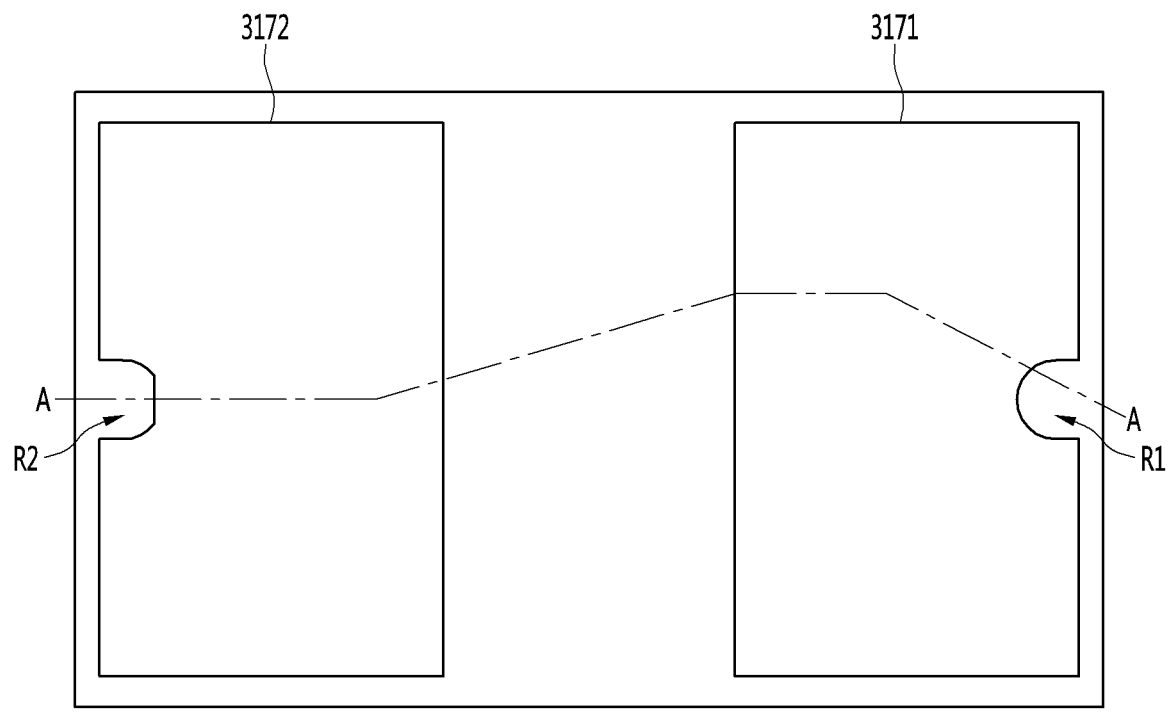

[FIG. 39b]
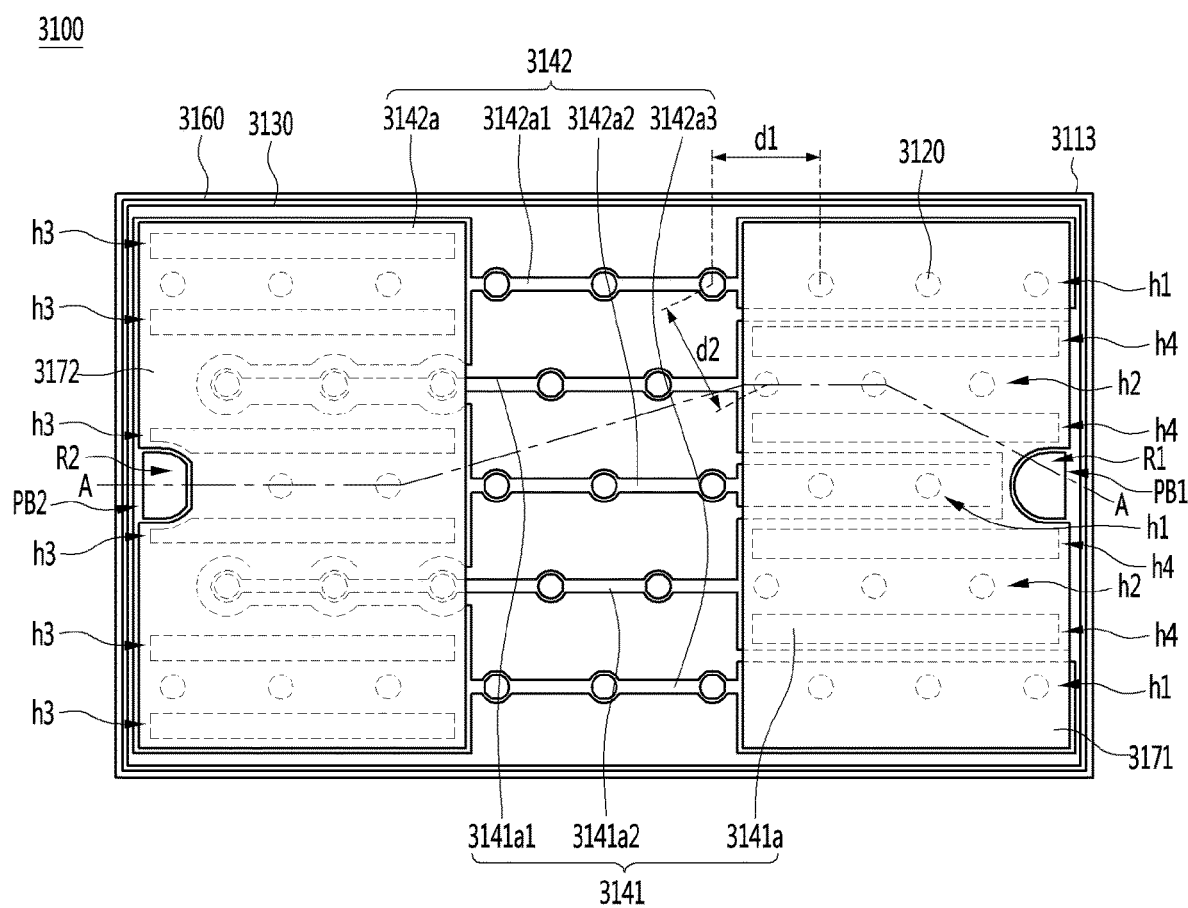

[FIG. 39c]
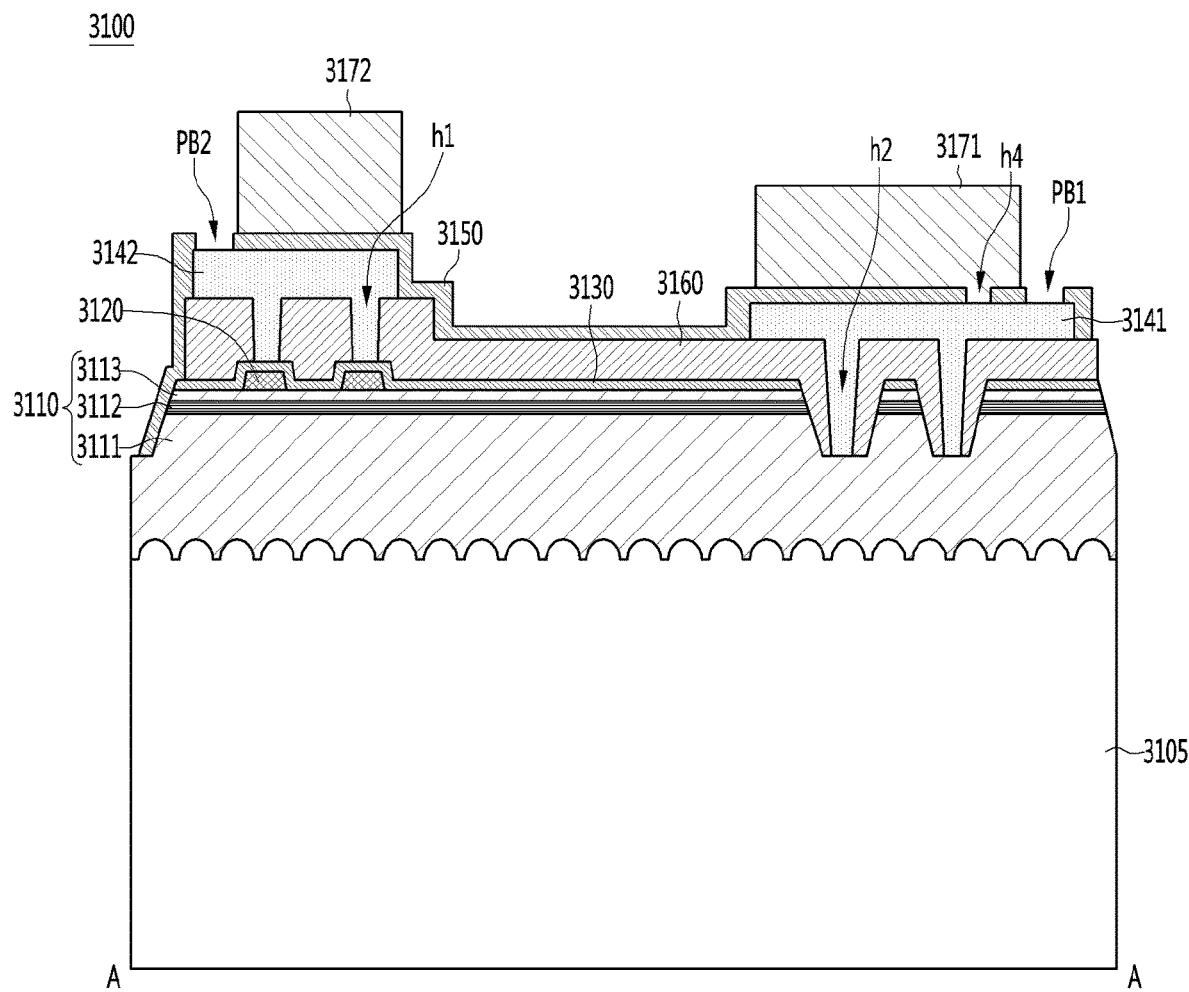

[FIG. 40]
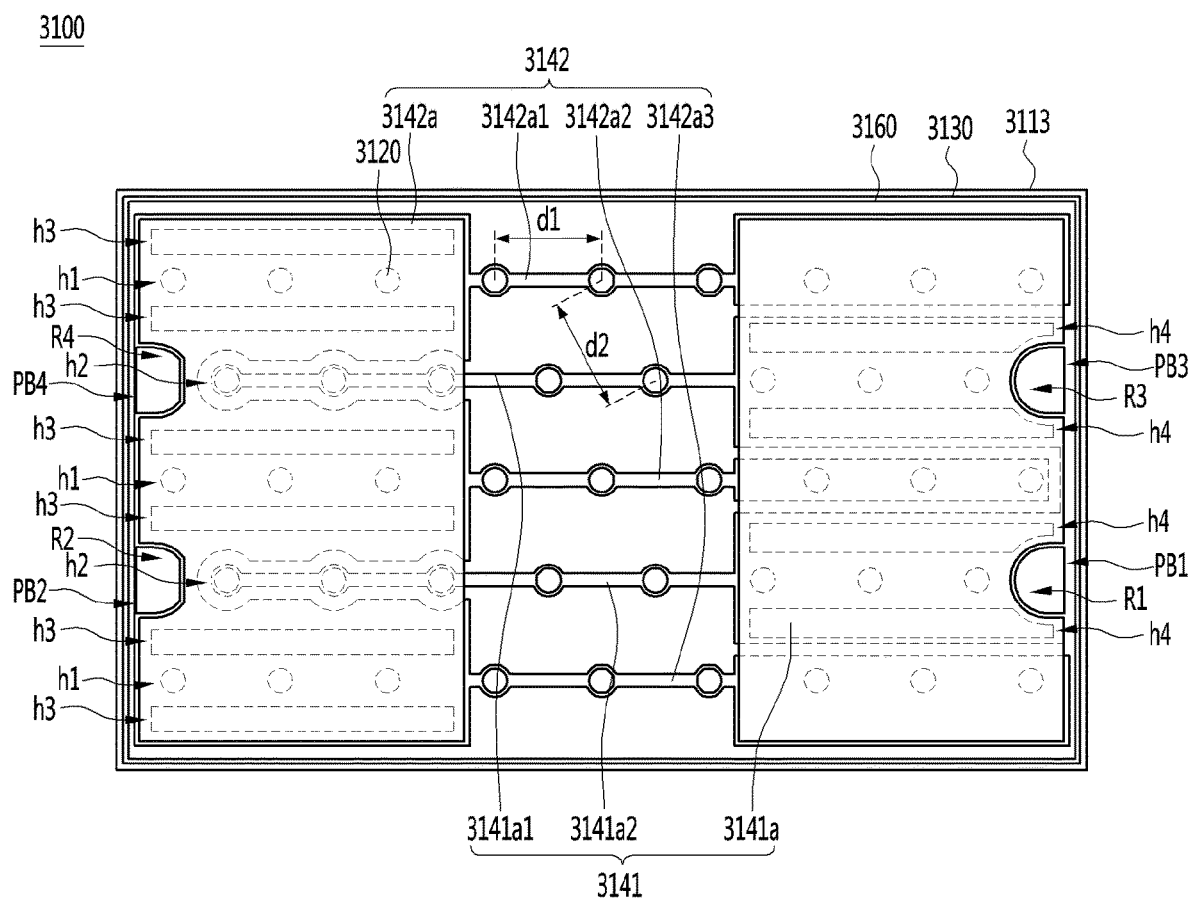

[FIG. 41a]
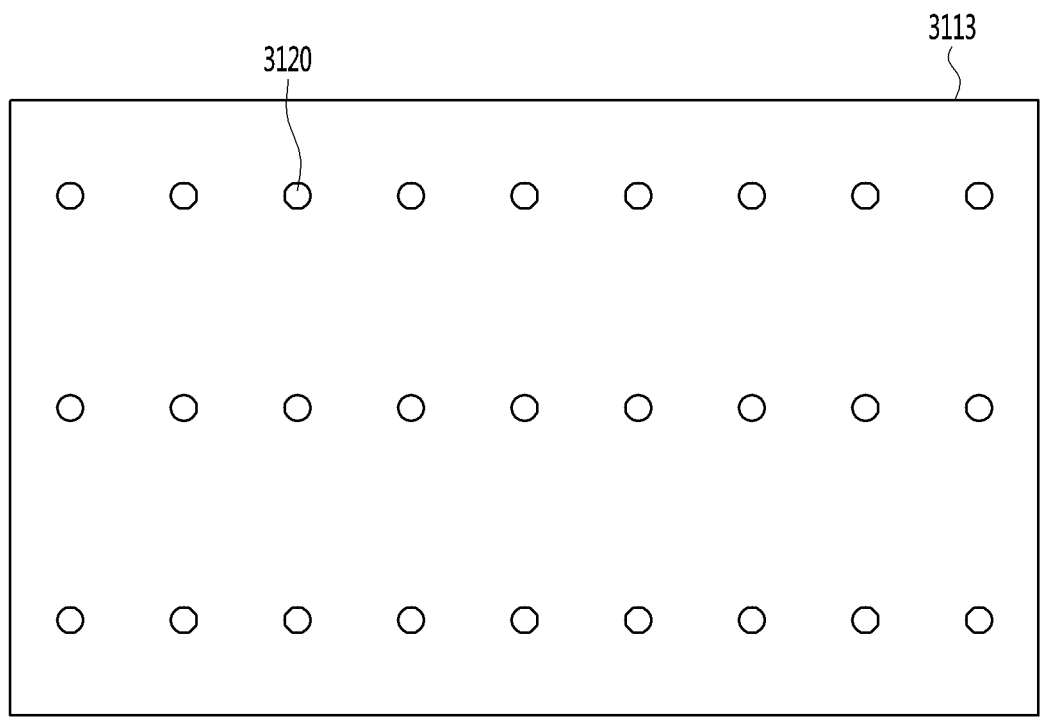

【FIG. 41b】
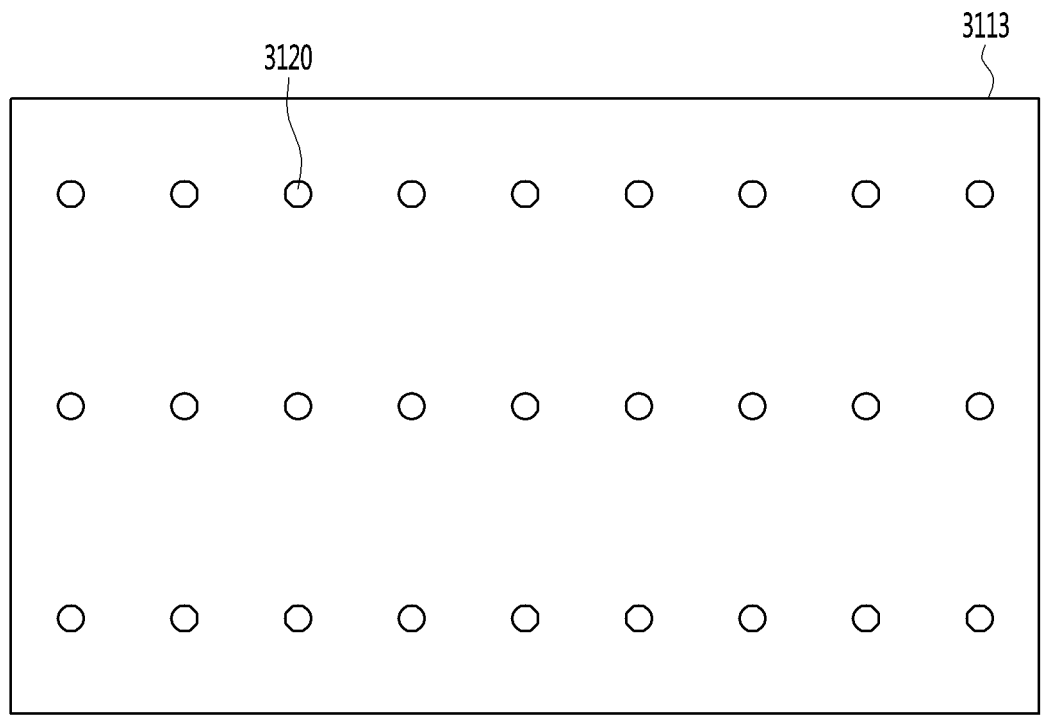
【FIG. 42a】
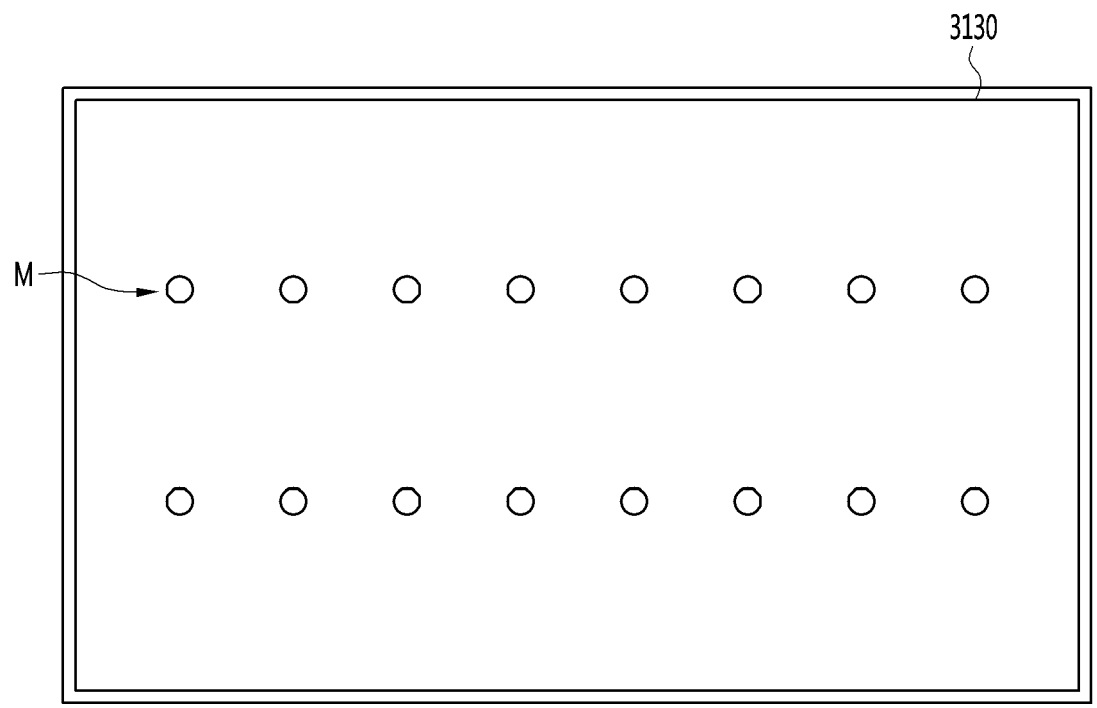

[FIG. 42b]
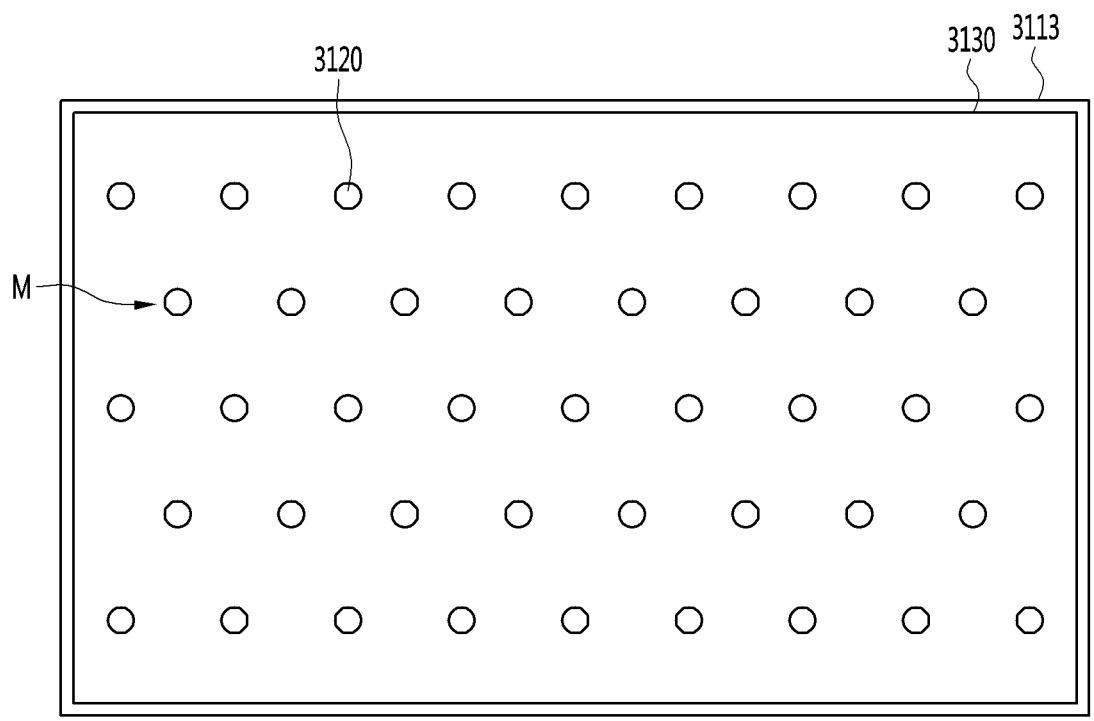
[FIG. 43a]
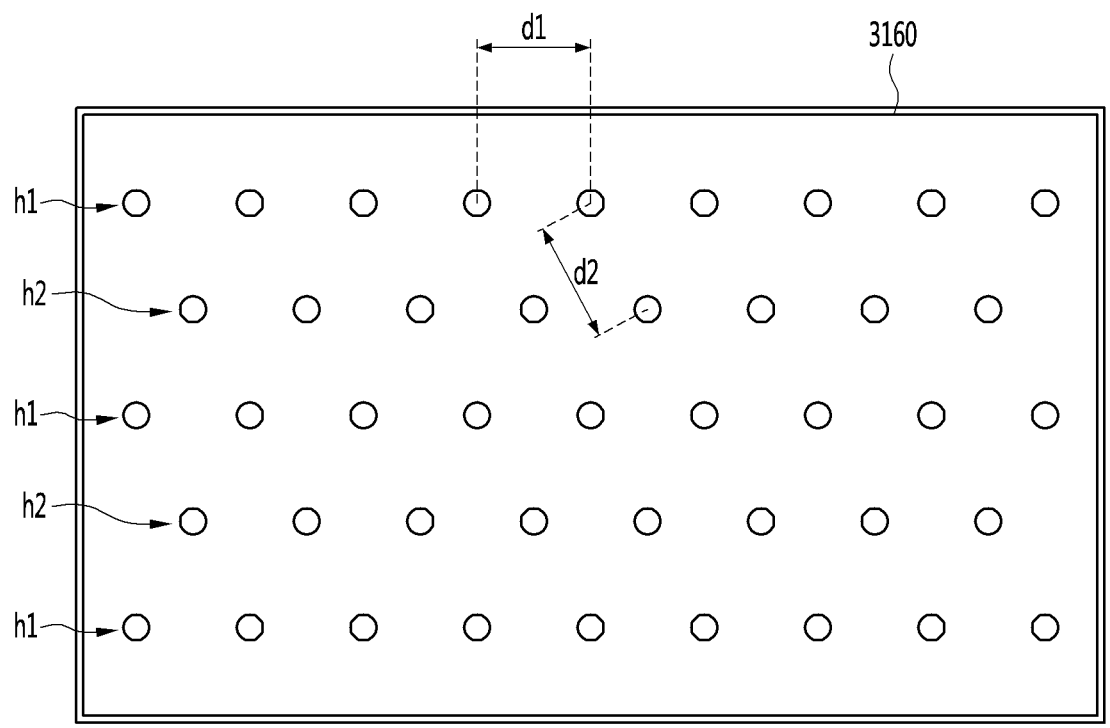

[FIG. 43b]
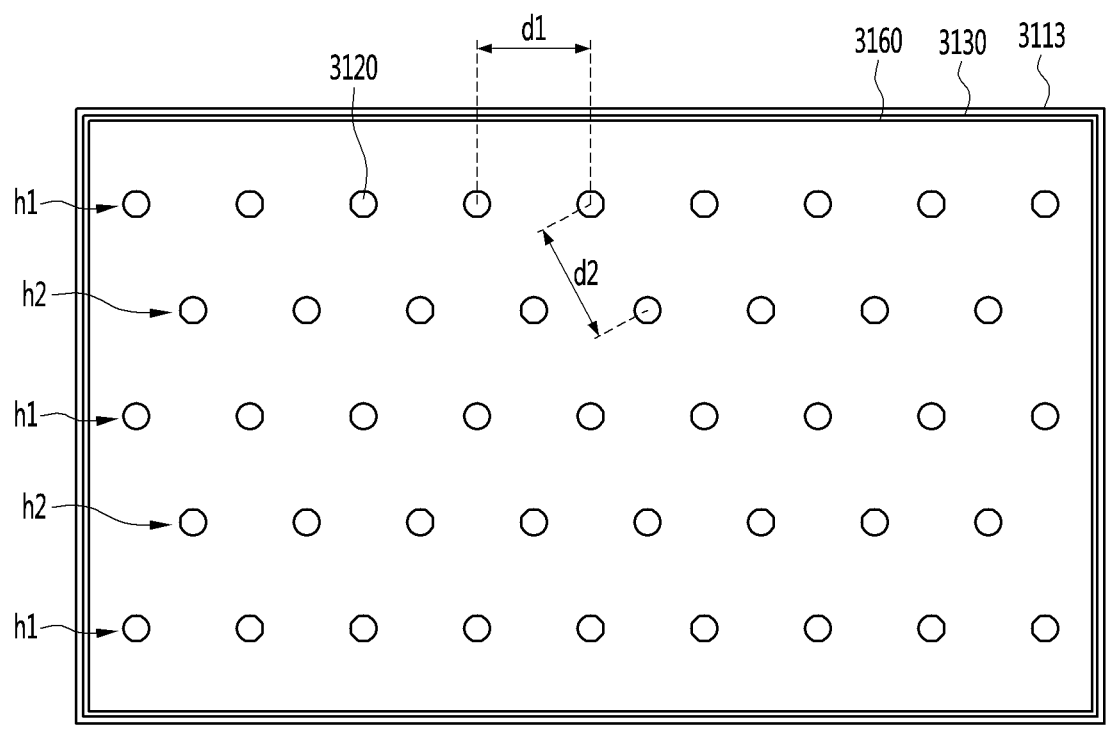

【FIG. 44a】
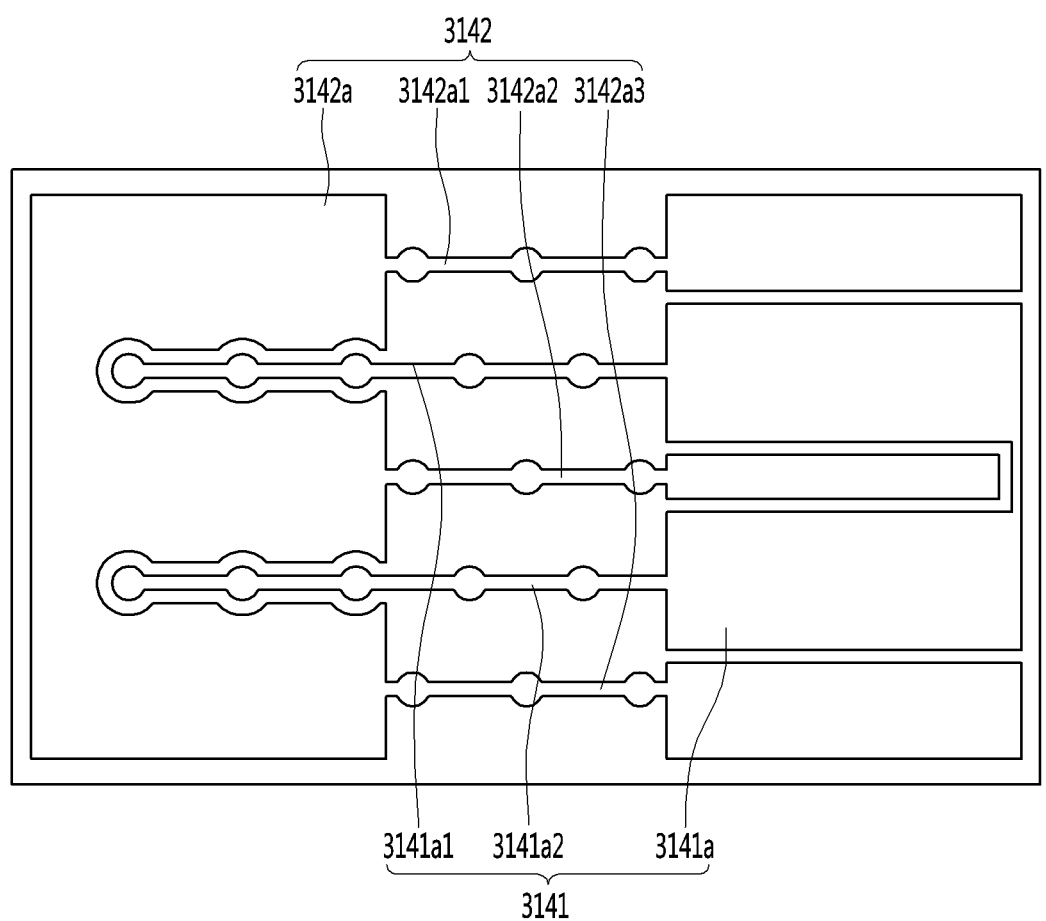

[FIG. 44b]
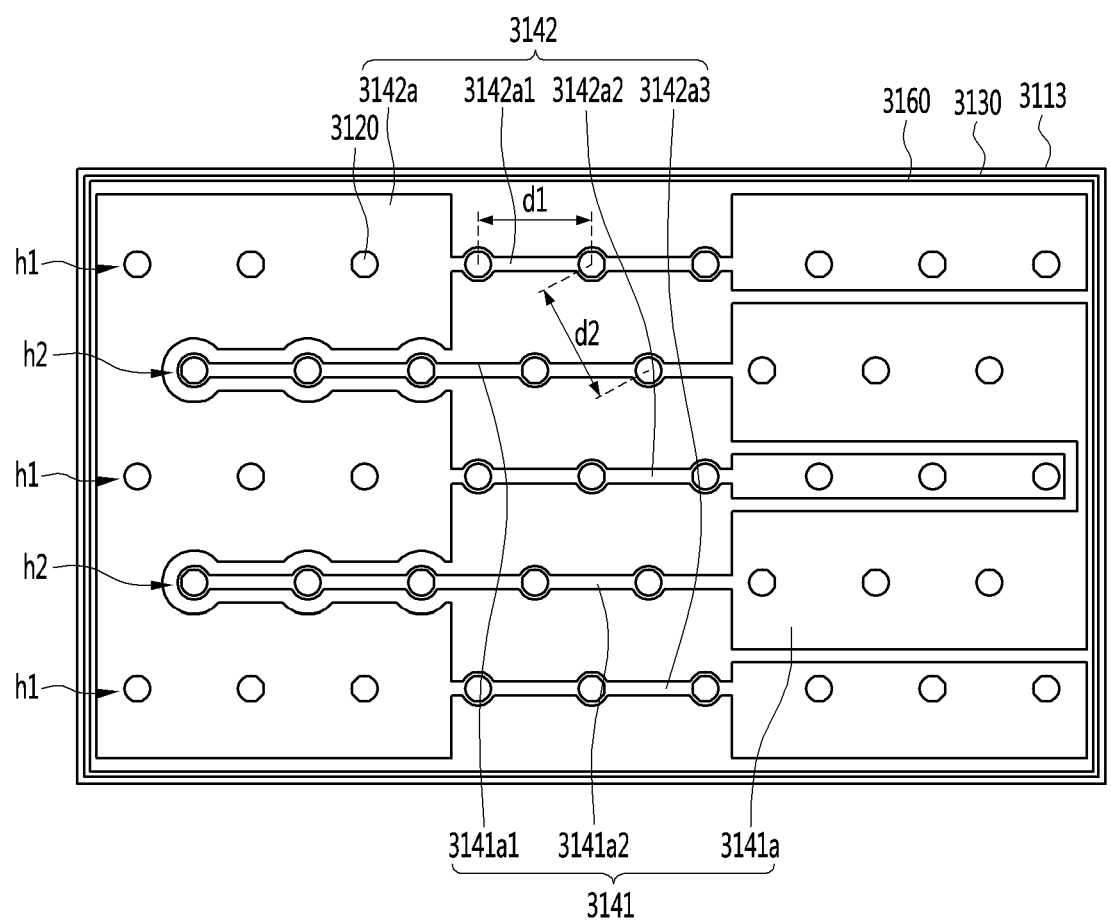

[FIG. 45a]
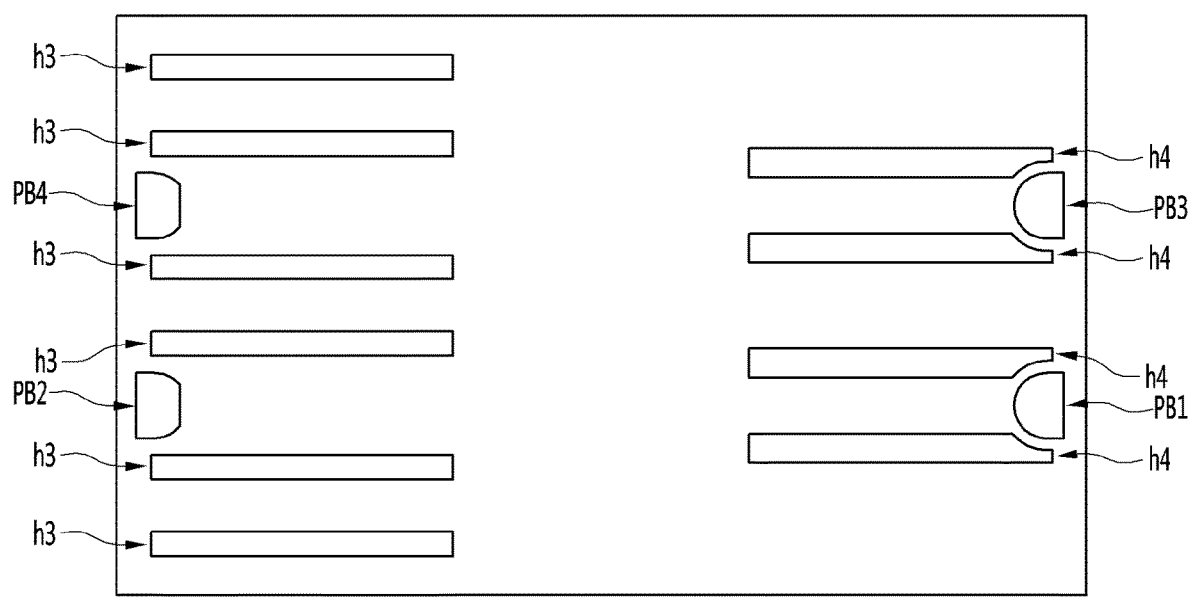

[FIG. 45b]
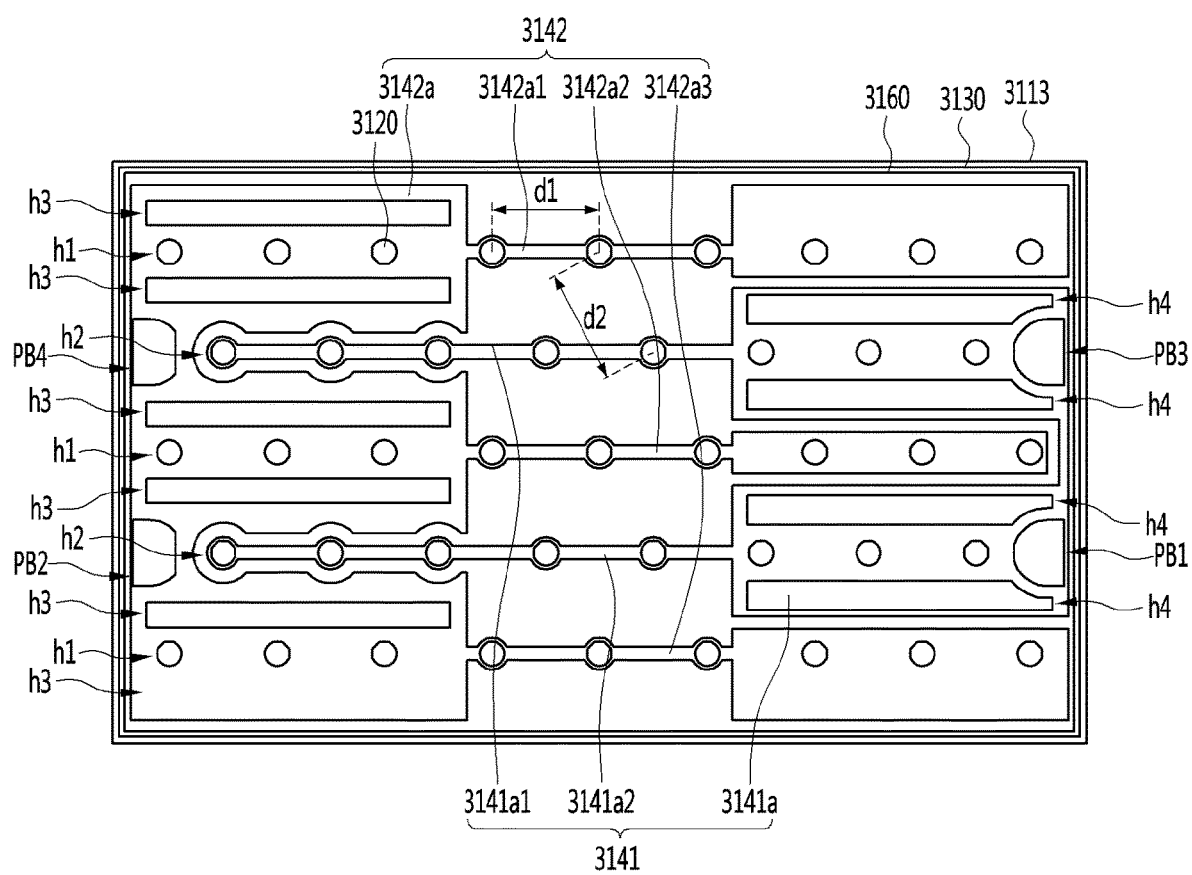

【FIG. 46a】
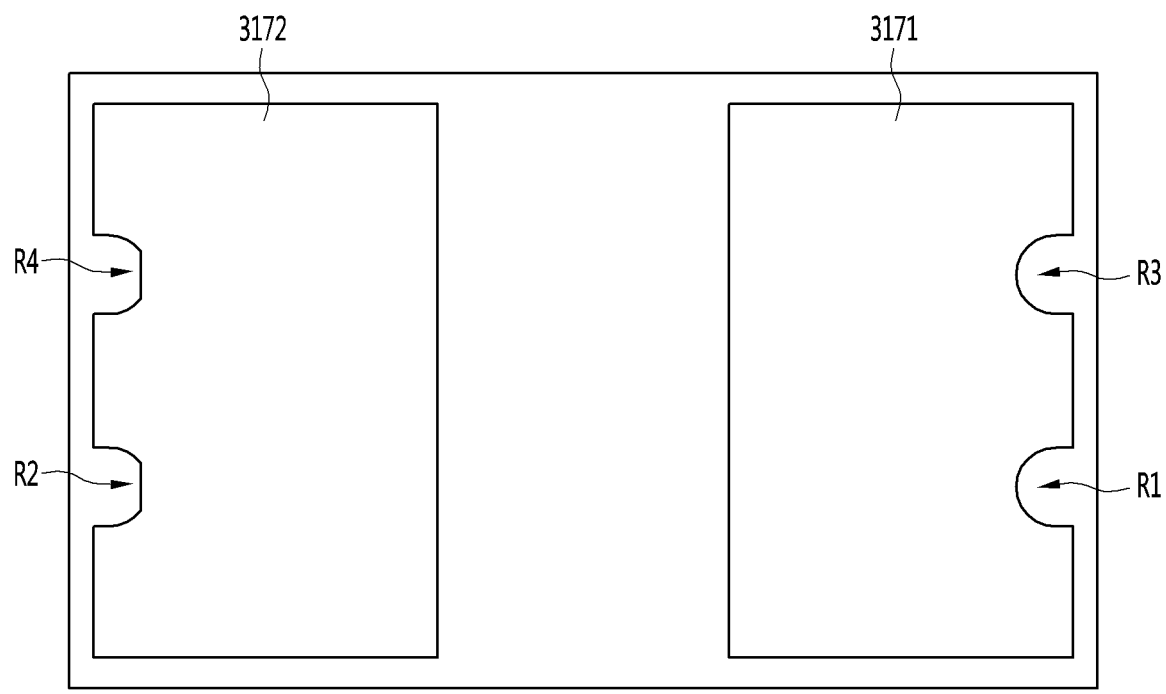

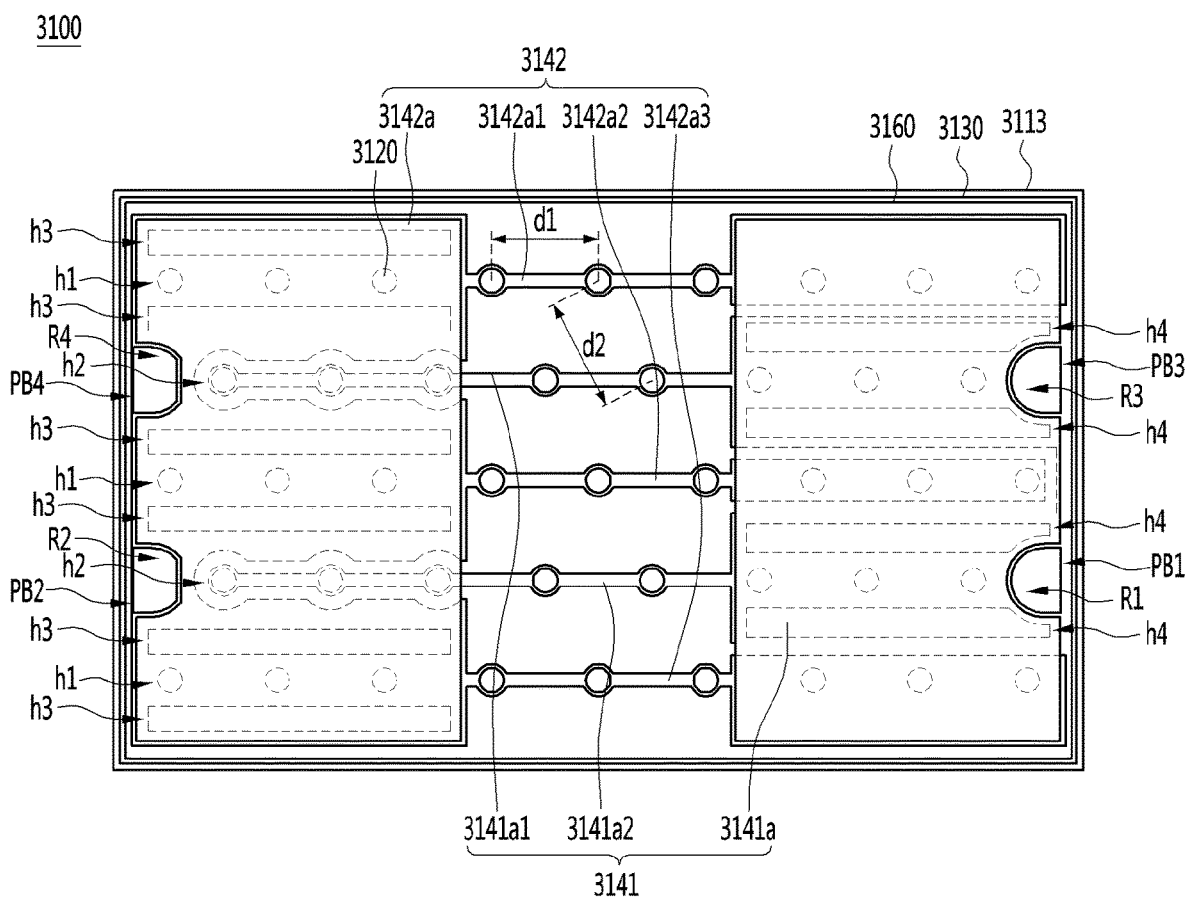
[FIG. 46b]

[FIG. 47]
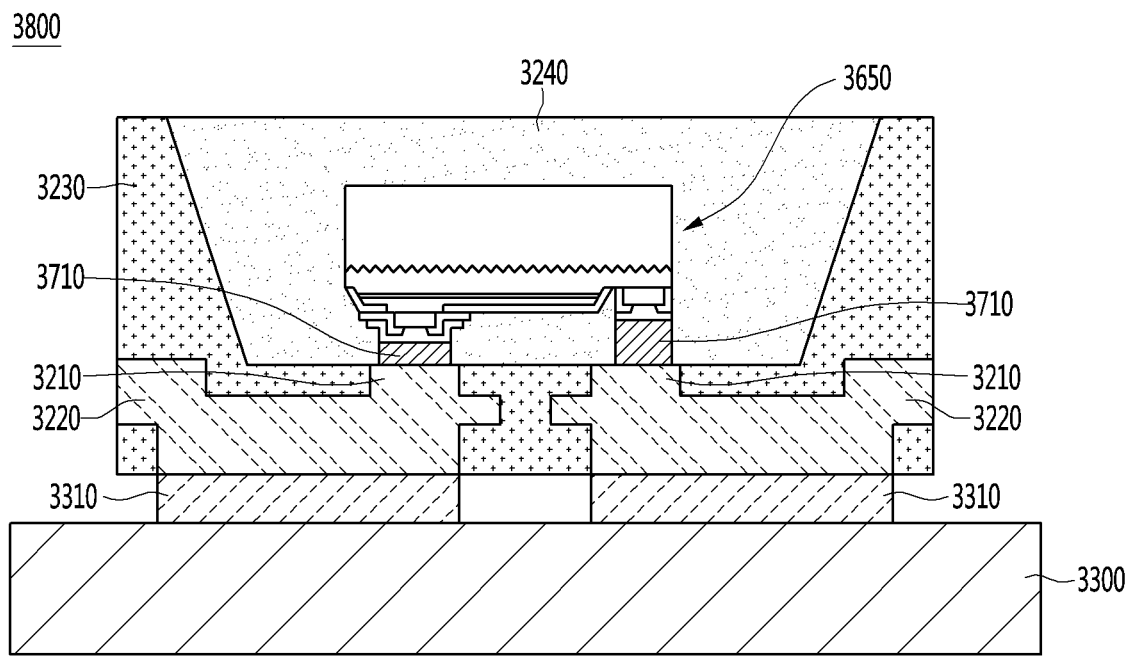

【FIG. 48】
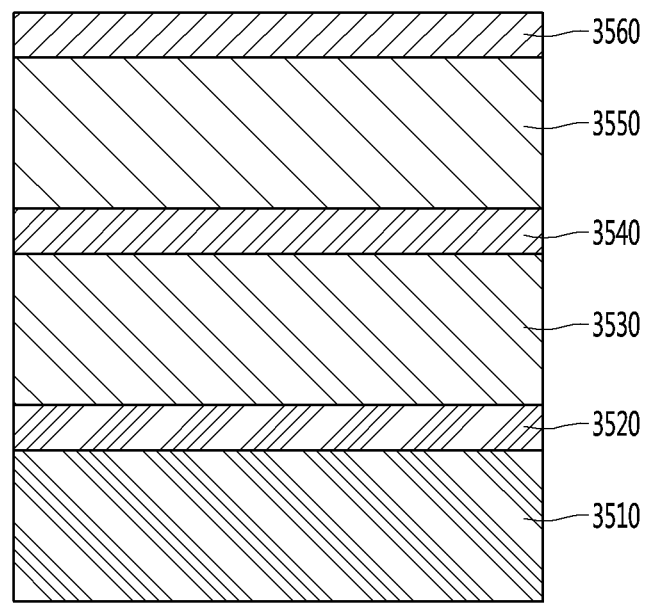
【FIG. 49】
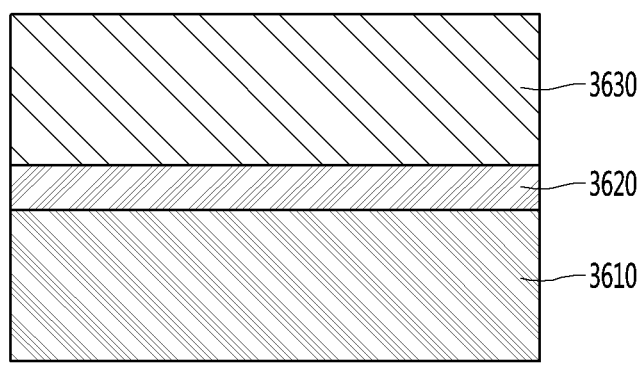

[FIG. 50]
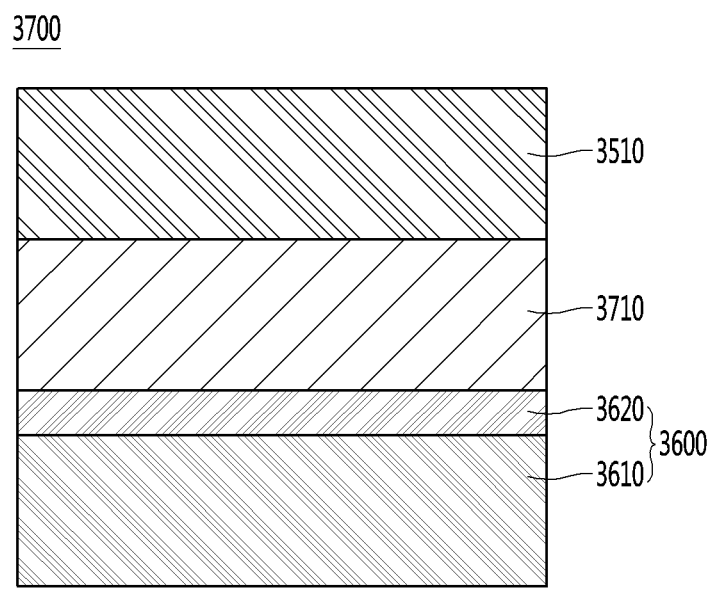

SEMICONDUCTOR DEVICE AND SEMICONDUCTOR DEVICE PACKAGE HAVING AN ELECTRODE RECESS WITH A DIFFERENT INCLINATION ANGLE THAN AN INCLINATION ANGLE OF AN ELECTRODE IN THE RECESS

CROSS-REFERENCE TO RELATED PATENT APPLICATIONS

This application is a U.S. National Stage Application under 35 U.S.C. § 371 of PCT Application No. PCT/KR2018/009815, filed Aug. 24, 2018, which claims priority to Korean Patent Application Nos. 10-2017-0108220, filed Aug. 25, 2017 and 10-2017-0108145, filed Aug. 25, 2017, whose entire disclosures are hereby incorporated by reference.

TECHNICAL FIELD

Embodiments relate to a semiconductor device, a method of manufacturing semiconductor device, and a semiconductor device package.

BACKGROUND ART

A semiconductor device comprising compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using a group III-V or a group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using a group III-V or a group II-VI compound semiconductor substances can implement a white light source having high efficiency by using fluorescent substances or combining colors. Such a semiconductor device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using a group or a group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication means, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For instance, a nitride semiconductor represents superior thermal stability and wide band gap energy so that the nitride semiconductor has been spotlighted in the field of optical devices and high-power electronic devices. In particular, blue, green, and UV semiconductor devices employing the nitride semiconductor have already been commercialized and extensively used.

For example, an ultraviolet semiconductor device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength.

Ultraviolet rays may be divided into three groups of UV-A (315 nm to 400 nm), UV-B (280 nm to 315 nm) and UV-C (200 nm to 280 nm) in the order of long wavelength. The UV-A (315 nm to 400 nm) has been applied to various fields such as UV curing for industrial use, curing of printing ink, an exposure machine, discrimination of counterfeit, photo-catalytic disinfection, special illumination (aquarium/agriculture and the like), the UV-B (280 nm to 315 nm) has been used for medical use, and the UV-C (200 nm to 280 nm) has been applied to air purification, water purification, sterilization products, and the like.

Meanwhile, as a semiconductor device capable of providing a high output has been requested, a semiconductor device capable of increasing an output by applying a high power source has been studied.

In addition, research on a method for improving the light extraction efficiency of a semiconductor device and enhancing the luminous intensity in a package stage in a semiconductor device package has been studied. Further, in the semiconductor device package, studies on a method of enhancing the bonding strength between the package electrode and the semiconductor device have been performed.

SUMMARY

An embodiment can provide a semiconductor device package and a method of manufacturing a semiconductor device package that are capable of improving process efficiency and providing a new package structure to reduce manufacturing cost and improve manufacturing yield.

An embodiment can provide a semiconductor device, a method of manufacturing a semiconductor device, a semiconductor device package, and a method of manufacturing a semiconductor device package that are capable of improving light extraction efficiency and electrical characteristics.

An embodiment can provide a semiconductor device, a method of manufacturing a semiconductor device, a semiconductor device package, and a method of manufacturing a semiconductor device package that are capable of performing stable bonding by providing a small pressure at a low temperature is provided.

An embodiment can provide a semiconductor device, a method of manufacturing a semiconductor device, a semiconductor device package, and a method of manufacturing a semiconductor device package that are capable of improving bonding force between a package electrode and a semiconductor device.

An embodiment can provide a semiconductor device, a method of manufacturing a semiconductor device, a semiconductor device package, and a method of manufacturing a semiconductor device package that are capable of improving reliability by preventing current concentration from occurring.

An embodiment can provide a semiconductor device, a method of manufacturing a semiconductor device, a semiconductor device package, and a method of manufacturing a semiconductor device package that are capable of preventing a re-melting phenomenon from occurring in a bonding region of a semiconductor device package in a process of re-bonding the semiconductor device package to the substrate or in a process of heat treatment.

An embodiment can provide a semiconductor device, a method of manufacturing a semiconductor device, a semiconductor device package, and a method of manufacturing a semiconductor device package that are capable of accurately detecting the electrical properties of a semiconductor device and a semiconductor device package.

A semiconductor device according to an embodiment may comprise a light emitting structure comprising a first conductivity type semiconductor layer, an active layer disposed on the first conductivity type semiconductor layer, and a second conductivity type semiconductor layer disposed on the active layer; a light transmitting electrode layer disposed on the light emitting structure; a reflective layer disposed on the light transmitting electrode layer, and comprising a plurality of first openings exposing an upper surface of the light transmitting electrode layer and a plurality of second openings exposing an upper surface of the first conductivity type semiconductor layer; a first electrode disposed on the reflective layer and in contact with the first conductivity type semiconductor layer through the plurality of second openings; a second electrode disposed on the reflective layer and spaced apart from the first electrode; and in contact with the light transmitting electrode layer through the plurality of first openings; a protective layer disposed on the first electrode and the second electrode, and comprising a plurality of third openings exposing an upper surface of the second electrode and a plurality of fourth openings exposing an upper surface of the first electrode; a first bonding pad disposed on the protective layer, and in contact with the first electrode through the plurality of fourth openings; and a second bonding pad disposed on the protective layer, and in contact with the second electrode through the plurality of third openings, wherein the first electrode may comprise a first sub-electrode and a plurality of first branch electrodes, wherein the first sub-electrode may be disposed under the first bonding pad, and the plurality of first branch electrodes may be disposed and extending in a direction from the first sub-electrode to the second electrode, wherein the second electrode may comprise a second sub-electrode and a plurality of second branch electrodes, wherein the second sub-electrode may be disposed under the second bonding pad, and the plurality of second branch electrodes may be disposed and extending in a direction from the second sub-electrode to the first electrode, wherein the plurality of first branch electrodes and the plurality of second branch electrodes may be alternately disposed on an upper surface of the reflective layer, wherein the first electrode and the second bonding pad may be disposed to be offset from each other, and wherein the second electrode and the first bonding pad may be disposed to be offset from each other.

According to the embodiment, wherein a distance between neighboring first openings among the plurality of first openings may be provided to be different from a distance between neighboring first and second openings among the plurality of first and second openings.

According to the embodiment, wherein a distance between neighboring first openings among the plurality of first openings may be 110 micrometers to 140 micrometers, wherein a distance between neighboring second openings among the plurality of second openings may be 110 micrometers to 140 micrometers, and wherein a distance between neighboring first and second openings among the plurality of first and second openings may be 120 micrometers to 160 micrometers.

According to the embodiment, wherein a distance between neighboring first and second branch electrodes among the plurality of first and second branch electrodes may be 110 micrometers to 140 micrometers.

According to the embodiment, wherein the plurality of first branch electrodes may be provided to be overlapped with the plurality of second openings in a first direction perpendicular to the upper surface of the reflective layer, and wherein the plurality of second branch electrodes may be provided to be overlapped with the plurality of first openings in the first direction.

According to the embodiment, wherein the first and second bonding pads may comprise a Ag layer disposed on the protective layer and a Sn layer disposed on the Ag layer.

According to the embodiment, wherein the first and second bonding pads may comprise a Sn layer or an In layer.

According to the embodiment, wherein the Sn layer or the In layer may be provided in a thickness of several micrometers.

According to the embodiment, wherein the protective layer may comprise a first measuring portion exposing an upper surface of the first electrode and a second measuring portion exposing an upper surface of the second electrode.

A semiconductor device package according to an embodiment may comprise a first frame and a second frame spaced apart from each other; a semiconductor device disposed on the first and second frames, and comprising a first electrode and a second electrode; a first intermetallic compound layer disposed between the first electrode and the first frame; and electrically connected with the first electrode and the first frame; and a second intermetallic compound layer disposed between the second electrode and the second frame, and electrically connected with the second electrode and the second frame, wherein the first and second intermetallic compound layers may comprise a AgSn layer, wherein the first electrode may comprise a first sub-electrode and a plurality of first branch electrodes, and the plurality of first branch electrodes may be disposed and extending in a direction from the first sub-electrode to the second electrode, wherein the second electrode may comprise a second sub-electrode and a plurality of second branch electrodes, and the plurality of second branch electrodes may be disposed and extending in a direction from the second sub-electrode to the first electrode; and wherein the plurality of first branch electrodes and the plurality of second branch electrodes may be alternately disposed.

A semiconductor device according to an embodiment may comprise a light emitting structure comprising a first conductivity type semiconductor layer, an active layer disposed on the first conductivity type semiconductor layer, and a second conductivity type semiconductor layer disposed on the active layer; a light transmitting electrode layer disposed on the light emitting structure; a reflective layer disposed on the light transmitting electrode layer, and comprising a plurality of first openings exposing an upper surface of the light transmitting electrode layer and a plurality of second openings exposing an upper surface of the first conductivity type semiconductor layer; a first electrode disposed on the reflective layer and in contact with the first conductivity type semiconductor layer through the plurality of second openings; a second electrode disposed on the reflective layer and spaced apart from the first electrode, and in contact with the light transmitting electrode layer through the plurality of first openings; a protective layer disposed on the first electrode and the second electrode, and comprising a plurality of third openings exposing an upper surface of the second electrode, a plurality of fourth openings exposing an upper surface of the first electrode, a first measuring portion exposing an upper surface of the first electrode, and a second measuring portion exposing an upper surface of the second electrode; a first bonding pad disposed on the protective layer and in contact with the first electrode through the plurality of fourth openings, and exposing the first measuring portion; and a second bonding pad disposed on the protective layer and in contact with the second electrode through the plurality of third openings, and exposing the second measuring portion, wherein the first electrode may comprise a first sub-electrode and a plurality of first branch electrodes, wherein the first sub-electrode may be disposed under the first bonding pad, and the plurality of first branch electrodes may be disposed and extending in a direction from the first sub-electrode to the second electrode, wherein the second electrode may comprise a second sub-electrode and a plurality of second branch electrodes, wherein the second sub-electrode may be disposed under the second bonding pad, and the plurality of second branch electrodes may be disposed and extending in a direction from the second sub-electrode to the first electrode, wherein the plurality of first branch electrodes and the plurality of second branch electrodes may be alternately disposed on an upper surface of the reflective layer, and wherein a distance between neighboring first openings among the plurality of first openings may be provided to be different from a distance between neighboring first and second openings among the plurality of first and second openings.

A semiconductor device according to an embodiment may comprise a light emitting structure comprising a first conductivity type semiconductor layer, a second conductivity type semiconductor layer, an active layer disposed between the first conductivity type semiconductor layer and the second conductivity type semiconductor layer, and a plurality of recesses passing through the second conductivity type semiconductor layer and the active layer to expose a portion of the first conductivity type semiconductor layer; a first insulating layer disposed on the light emitting structure and comprising a plurality of first openings in a region overlapping with the plurality of recesses in a vertical direction; a second insulating layer disposed on the first insulating layer and comprising a plurality of second openings overlapping in a vertical direction with the plurality of first openings and a plurality of third openings spaced apart from the plurality, of second openings; a first electrode disposed on the second insulating layer and electrically connected with the first conductivity type semiconductor layer in the second opening; a second electrode disposed on the second insulating layer and electrically connected with the second conductivity type semiconductor layer in the third opening; a third insulating layer disposed on the first and second electrodes and comprising a plurality of fourth and fifth openings vertically, overlapping with a portion of the first and second electrodes; and first and second bonding pads disposed on the third insulating layer and electrically connected with the first and second electrodes, respectively, in the fourth and fifth openings, wherein the first and second electrodes each may comprise a plurality of first and second branch electrodes extending in a first direction, respectively, wherein the first bonding pad may comprise a first concave portion in which the plurality of second branch electrodes are extended, wherein the second bonding pad may comprise a second concave portion in which the plurality of first branch electrodes are extended, wherein the first and second bonding pads overlap in the first direction, wherein the first concave portion may be a non-contact region of the first bonding pad adjacent to the second bonding pad, and wherein the second concave portion may be a non-contact region of the second bonding pad adjacent to the first bonding pad.

According to the embodiment, wherein the first and second concave portions may be disposed to be offset from each other in the first direction.

According to the embodiment, wherein a number of the second concave portion may be greater than a number of the first concave portion, wherein a number of the second branch electrodes may be greater than the number of the second concave portion, and wherein a number of the first branch electrodes may be provided to be equal to the number of the first concave portion.

According to the embodiment, wherein a size of the second bonding pad may be provided to be greater than a size of the first bonding pad.

A semiconductor device package according to an embodiment may comprise a first frame comprising a first opening; a second frame comprising a second opening; a body disposed between the first and second frames; a light emitting device comprising a first bonding pad and a second bonding pad; a first conductive part in the first opening; and a second conductive part in the second opening, wherein the first opening may pass through an upper surface and a lower surface of the first frame, wherein the second opening may pass through an upper surface and a lower surface of the second frame, wherein the first bonding pad may face the first frame and overlap the first opening in a vertical direction, wherein the second bonding pad may face the second frame and overlap the second opening in a vertical direction, wherein the first bonding pad may comprise a first contact region which is in contact with the first conductive part on the first opening and a first non-contact region which is non-contacted with the first conductive part.

According to the embodiment, wherein the second bonding pad may comprise a second contact region that is in contact with the second conductive part on the second opening and a second non-contact region that is not in contact with the second conductive part.

According to the embodiment, wherein the first and second conductive parts may comprise a solder paste.

According to the embodiment, wherein at least one of the first and second bonding pads may be provided to have an area of each of the first and second contact regions more than twice an area of a particle constituting the first and second conductive parts.

According to the embodiment, wherein at least one of the first and second bonding pads may be provided to have an area of each of the first and second non-contact regions more than 1.5 times an area of a particle constituting the first and second conductive parts.

According to the embodiment, wherein an area of the first contact region of the first bonding pad may be provided smaller than an area of an upper surface of the first opening, and an area of the second contact region of the second bonding pad may be provided smaller than an area of an upper surface of the second opening.

According to the embodiment, wherein the first contact region of the first bonding pad may be formed in one or more on the first opening, wherein the second contact region of the second bonding pad may be formed in one or more on the second opening, wherein the first non-contact region of the first bonding pad may be formed in one or more on the first opening and have an area smaller than an area of the first contact region, and wherein the second non-contact region of the second bonding pad may be formed in one or more on the second opening and have an area smaller than an area of the second contact region.

According to the embodiment, wherein the first and second conductive parts may comprise a curved surface that is concave on the first and second non-contact regions.

The semiconductor device package according to embodiments may comprise at least one of an adhesive and a resin part disposed between the body and the light emitting device.

According to the embodiment, wherein the body may comprise a recess recessed in a direction toward a lower surface from an upper surface of the body, and the adhesive may be disposed in the recess, wherein the adhesive may be contacted with the upper surface of the body, a lower surface of the light emitting device, and the first and second bonding pads.

According to the embodiment, wherein at least one of the adhesive and the resin part may be disposed outside the non-contact region of the first and second bonding pads.

According to the embodiment, wherein the first and second frames may be conductive frames, and the adhesive may be provided of an insulating resin material.

ADVANTAGEOUS EFFECTS

According to the semiconductor device, the method of manufacturing the semiconductor device, the semiconductor device package, the method of manufacturing the semiconductor device package of the embodiment, there is an advantage capable of improving an extraction efficiency, each of the interface adhesive property and electrical characteristics.

According to the semiconductor device, the method of manufacturing the semiconductor device, the semiconductor device package, the method of manufacturing the semiconductor device package of the embodiment, there is an advantage capable of performing stable bonding by providing a small pressure at a low temperature is provided.

According to the semiconductor device, the method of manufacturing the semiconductor device, the semiconductor device package, the method of manufacturing the semiconductor device package of the embodiment, there is an advantage capable of improving bonding force between a package electrode and a semiconductor device.

According to the semiconductor device, the method of manufacturing the semiconductor device, the semiconductor device package, the method of manufacturing the semiconductor device package of the embodiment, there is an advantage capable of improving reliability by preventing current concentration from occurring.

According to the semiconductor device, the method of manufacturing the semiconductor device, the semiconductor device package, the method of manufacturing the semiconductor device package of the embodiment, there is an advantage capable of preventing a re-melting phenomenon from occurring in a bonding region of a semiconductor device package in a process of re-bonding the semiconductor device package to the substrate and the like.

According to the semiconductor device, the method of manufacturing the semiconductor device, the semiconductor device package, the method of manufacturing the semiconductor device package of the embodiment, there is an advantage capable of accurately, detecting the electrical properties of a semiconductor device and a semiconductor device package.

BRIEF DESCRIPTION OF THE DRAWINGS

FIG. 1 is a plan view of a light emitting device package according to an embodiment of the invention.

FIG. 2 is a bottom view of the light emitting device package shown in FIG. 1.

FIG. 3 is a cross-sectional view taken along line D-D of the light emitting device package shown in FIG. 1, FIG. 4 is a cross-sectional view taken along line E-E of the light emitting device package shown in FIG. 1.

FIG. 5 is a cross-sectional view taken along line F-F of the light emitting device package shown in FIG. 1.

FIG. 6 is a detailed view illustrating a first bonding pad and a first conductive part of the light emitting device of FIG. 4.

FIG. 7 is a detailed view illustrating a second bonding pad and a second conductive part of the light emitting device of FIG. 5.

FIG. 8 is an enlarged view of a portion of the light emitting device package of FIG. 1.

FIG. 9 is a view explaining contact and non-contact regions between the first and second bonding pads and the first and second conductive parts of the light emitting device of FIG. 8.

FIG. 10 is another example of first and second bonding pads and an opening of the light emitting device of FIG. 8.

FIG. 11 is a first modification of a bonding pad of a light emitting device according to an embodiment.

FIG. 12 is an example of an opening of a body and a bonding pad of the light emitting device of FIG. 11.

FIG. 13 is a second modification of a bonding pad of the light emitting device of FIG. 11.

FIG. 14 is an example of an opening of a body and a bonding pad of the light emitting device of FIG. 11.

FIGS. 15 to 18 illustrate another variation of a bonding pad of a light emitting device according to an embodiment of the invention.

FIGS. 19 to 22 are examples of opening of a light emitting; device according to an embodiment of the invention.

FIG. 23 is a first modification of the light emitting device package of FIG. 3.

FIG. 24 is a second modification of the light emitting device package of FIG. 3.

FIG. 25 is an example of a module in which the light emitting device package of FIG. 3 is disposed on a circuit board.

FIG. 26 is an example of a module in which the light emitting device package of FIG. 3 is disposed on a circuit board.

FIG. 27 is a side sectional view of a light emitting device package according to another embodiment of the invention.

FIG. 28 is a cross-sectional view of another side of the light emitting device package of FIG. 27.

FIG. 29 is an example of a top view of a light emitting device of a light emitting device package according to an embodiment of the invention.

FIG. 30 is a side sectional view of a region passing through a first bonding pad in the light emitting device of FIG. 29.

FIG. 31 is a side sectional view of a region passing through a second bonding pad in the light emitting device of FIG. 29.

FIG. 32 is a plan view illustrating a semiconductor device according to an embodiment of the invention.

FIG. 33 is a cross-sectional view taken along line A-A of the semiconductor device shown in FIG. 32.

FIG. 34a to FIG. 34c are views explaining a step formed of a semiconductor layer by a method of manufacturing a semiconductor device according to an embodiment of the invention.

FIG. 35a to FIG. 35c are views explaining a step formed of a light transmitting electrode layer by the method of manufacturing the semiconductor device according to the embodiment of the invention.

FIG. 36a to FIG. 36c are views explaining a step formed of a reflective layer by the method of manufacturing the semiconductor device according to the embodiment of the invention.

FIG. 37a to FIG. 37c are views explaining a step formed of a first electrode and a second electrode by the method of manufacturing the semiconductor device according to the embodiment of the invention.

FIG. 38a to FIG. 38c are views explaining a step formed of a protective layer by the method of manufacturing the semiconductor device according to the embodiment of the invention.

FIG. 39a to FIG. 39c are views explaining a step formed of a first bonding pad and a second bonding pad by the method of manufacturing the semiconductor device according to the embodiment of the invention.

FIG. 40 is a plan view showing another example of a semiconductor device according to an embodiment of the present invention.

FIG. 41a and FIG. 41b are views explaining a step formed of a semiconductor layer by a method of manufacturing a semiconductor device according to an embodiment of the invention.

FIG. 42a and FIG. 42b are views explaining a step formed of a light transmitting electrode layer by the method of manufacturing the semiconductor device according to the embodiment of the invention.

FIG. 43a and FIG. 43b are views explaining a step formed of a reflective layer by the method of manufacturing the semiconductor device according to the embodiment of the invention.

FIG. 44a and FIG. 44b are views explaining a step formed of a first electrode and a second electrode by the method of manufacturing the semiconductor device according to the embodiment of the invention.

FIG. 45a and FIG. 45b are views explaining a step formed of a protective layer by the method of manufacturing the semiconductor device according to the embodiment of the invention.

FIG. 46a and FIG. 46b are views explaining a step formed of a first bonding pad and a second bonding pad by the method of manufacturing the semiconductor device according to the embodiment of the invention.

FIG. 47 is a view illustrating a semiconductor device package according to an embodiment of the invention.

FIG. 48 is a view showing another example of a semiconductor device according to an embodiment of the present invention.

FIG. 49 is a view showing an example of a frame applied to a semiconductor device package according to an embodiment of the invention.

FIG. 50 is a view explaining an intermetallic compound (MC) layer applied to a semiconductor device package according to an embodiment of the invention.

DETAILED DESCRIPTION

Hereinafter, an embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings, but the embodiments are not limited thereto.

Hereinafter, a semiconductor device package according to an embodiment of the invention will be described in detail with reference to the accompanying drawings. The semiconductor device of the semiconductor device package may comprise a light emitting device emitting light of an ultraviolet ray, an infrared ray, or a visible ray. Hereinafter, a description will be given based on a case where a light emitting device is applied as an example of a semiconductor device, and the package or light source device to which the light emitting device is applied may comprise a non-light emitting device such as a Zener diode or a sensing device for monitoring a wavelength or heat.

Referring to FIGS. 1 to 5, a semiconductor device package 100 according to an embodiment of the invention may comprise a package body 110 comprising a plurality of frames 111 and 112 and a body 113 disposed between the plurality of frames 111 and 112, and a semiconductor device, for example a light emitting device 120, disposed on the plurality of frames 111 and 112.

Hereinafter, the semiconductor device package 100 will be described as a light emitting device package in which the light emitting device 120 is disposed.

<Package Body 110>

The plurality of frames 111 and 112 may comprise at least two, for example, a first frame 111 and a second frame 112. The first frame 111 and the second frame 112 may be spaced apart from each other. The first and second frames 111 and 112 may be spaced apart in a first direction X. The first direction may be an X direction, a second direction may be a Y direction, and a third direction may be a thickness direction of the package or a direction orthogonal to the first and second directions.

The package body 110 may comprise a body 113. The body 113 may be disposed between the first frame 111 and the second frame 112. The body 113 may function as an electrode separation line. The body 113 may be referred to as an insulating member. The body 113 may be disposed in a second direction between two frames 111 and 112 facing each other.

The body 113 may be disposed on the first frame 111. The body 113 may be disposed on the second frame 112. The body 113 may provide an inclined surface disposed on the first frame 111 and the second frame 112. The body 113 may provide a wall portion 110A having a cavity C on the first frame 111 and the second frame 112 by the inclined surface. The wall portion 110A may be integrally formed with the body 113 or may be formed separately. According to an embodiment of the present invention, the package body 110 may be provided with a structure having a cavity C. The package body 110 may be provided with a flat structure without a cavity C on the upper portion, or the wall portion 110A may be removed.

The body 113 may comprise an insulating material or a resin material. For example, the body 113 may be formed of at least one selected from a group including of Polyphthalamide (PPA), Polychloro Tri phenyl (PCT), Liquid Crystal Polymer (LCP), Polyamide 9T (PA9T), Silicone, Epoxy molding compound (EMC), Silicone molding compound (SMC), Ceramic, Photo sensitive glass (PSG), sapphire (Al$_2$O$_3$), and the like. The body 113 may comprise high refractive index fillers such as TiO$_2$, SiO$_2$, and the like.

The first frame 111 and the second frame 112 may comprise a conductive frame. The first frame 111 and the second frame 112 can stably provide structural strength of the package body 110 and can be electrically connected with the light emitting device 120. When the first frame 111 and the second frame 112 are conductive frames, the first frame 111 and the second frame 112 may be defined as a lead frame and may dissipate heat or reflect light generated from the light emitting device 120.

The first and second frames 111 and 112 may comprise a conductive material. The first and second frames 111 and 112 may comprise at least one of metals such as Pt, Ti, Ni, Cu, Au, Ta, Al, or Ag, and may be a single layer or a multi-layer having different metal layers.

As another example, the first frame 111 and the second frame 112 may be provided as an insulating frame. When the first frame 111 and the second frame 112 are insulating frames, structural strength of the package body 110 can be stably provided. When the first frame 111 and the second frame 112 are an insulating frames, the body 113 and the frames 111 and 112 may be integrally formed of the same material or may be formed of different materials. The difference between the case where the first frame 111 and the second frame 112 are formed of an insulating frame and the case where the first frame 111 and the second frame 112 are formed of a conductive frame will be described later.

When the first and second frames 111 and 112 are formed of an insulating material, the first and second frames 111 and 112 may be formed of a resin material or an insulating material, for example, the first and second frames 111 and 112 may be formed of at least one selected from a group including Polyphthalamide (PPA), Polychloro Tri phenyl (PCT), liquid crystal polymer (LCP), Polyamide9T (PAST), Silicone, Epoxy molding compound (EMC), Silicone molding compound (SMC), ceramic, photo sensitive glass (PSG), sapphire (Al$_2$O$_3$), and the like. In addition, the first and second frames 111 and 112 may comprise an epoxy material and a high refractive index filler such as TiO$_2$ and SiO$_2$. The first and second frames 111 and 112 may be formed of a reflective resin. Hereinafter, for convenience of explanation, a case where the first and second frames 111 and 112 are formed of a metal material will be described.

As shown in FIGS. 1 and 2, the first frame 111 may protrude more outward than a first side of the package body 110. The second frame 112 may protrude more outward than a second side opposite to the first side of the package body 110.

<Light Emitting Device 120>

The light emitting device 120 may comprise a plurality of bonding pads 121 and 122 and a light emitting structure 123 including a semiconductor layer. One or a plurality of the light emitting devices 120 may be disposed on the first and second frames 111 and 112. For convenience of explanation, a structure in which one light emitting device is disposed on the first and second frames 111 and 112 will be described.

The light emitting structure 123 may comprise a first conductivity type semiconductor layer, a second conductivity type semiconductor layer, and an active layer disposed between the first conductivity type semiconductor layer and the second conductivity type semiconductor layer. The first bonding pad 121 may be electrically connected to the first conductivity type semiconductor layer. The second bonding pad 122 may be electrically connected to the second conductivity type semiconductor layer.

A semiconductor layer of the light emitting structure 123 may be provided as a compound semiconductor. The semiconductor layer may be provided, for example, as a Group II-VI or III-V compound semiconductor. For example, the semiconductor layer may be provided with at least two or more elements selected from aluminum (Al), gallium (Ga), indium (In), phosphorus (P), arsenic (As), and nitrogen (N).

The first and second conductivity type semiconductor layers may be formed of at least one of Group III-V or Group II-VI compound semiconductors. The first and second conductivity type semiconductor layers may be formed of a semiconductor material having a composition formula of In$_x$Al$_y$Ga$_{1-x-y}$N (0≤x≤1, 0≤y≤1, 0≤x+y≤1). For example, the first and second conductivity type semiconductor layers may comprise at least one selected from a group including GaN, AlN, AlGaN, InGaN, InN, InAlGaN, AlInN, AlGaAs, GaP, GaAs, GaAsP, and AlGaInP. The first conductivity type semiconductor layer may be an n-type semiconductor layer doped with an n-type dopant such as Si, Ge, Sn, Se, or Te. The second conductivity type semiconductor layer may be a p-type semiconductor layer doped with a p-type dopant such as Mg, Zn, Ca, Sr, or Ba.

The active layer may be formed of a compound semiconductor. The active layer may be formed of, for example, at least one of Group III-V or Group compound semiconductors. When the active layer is implemented as a multi-well structure, the active layer may comprise a plurality of well layers and a plurality of barrier layers which are alternately arranged. At least one of the well layer and the barrier layer may be disposed of a semiconductor material having a composition formula of In$_x$Al$_y$Ga$_{1-x-y}$N (0≤x≤1, 0≤y≤1, 0≤x+y≤1). For example, the pair of the well layer/barrier layer of the active layer may be formed of at least one selected from a group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

The light emitting device 120 may be disposed on the package body 110. The light emitting device 120 may be disposed on the first frame 111 and the second frame 112. The light emitting device 120 may overlap the first frame 111 and the second frame 112 in a vertical direction, for example, the Z axis direction. The light emitting device 120 may be disposed in the cavity C.

The first and second bonding pads 121 and 122 of the light emitting device 120 may be spaced apart from each other under the light emitting structure 123. The first and second bonding pads 121 and 122 may be disposed between the light emitting structure 123 and the first and second frames 111 and 112. The first and second bonding pads 121 and 122 may face the frames 111 and 112 in a vertical direction. The first bonding pad 121 may be disposed on the first frame 111. The second bonding pad 122 may be disposed on the second frame 112. The first bonding pad 121 may face the first frame 111 and the second bonding pad 122 may face the second frame 112. The first bonding pad 121 and the second bonding pad 122 may be spaced apart from each other on a lower surface of the light emitting device 120.

The first bonding pad 121 may be disposed between the semiconductor layer of the light emitting structure 123 and the first frame 111. The second bonding pad 122 may be disposed between the semiconductor layer of the light emitting structure 123 and the second frame 112. The first bonding pad 121 may be disposed between the first conductivity type semiconductor layer and the first frame 111. The second bonding pad 122 may be disposed between the second conductivity type semiconductor layer and the second frame 112.

The first bonding pad 121 and the second bonding pad 122 may be formed of at least one selected from a group including Ti, Al, In, Ir, Ta, Pd, Co, Cr, Mg, Zn, Ni, Si, Ge, Ag, Ag alloy, Au, Hf, Pt, Ru, Rh, ZnO, $IrO_x$, $RuO_x$, NiO, $RuO_x$/ITO, Ni/$IrO_x$/Au, Ni/$IrO_x$/Au/ITO, and the like, and may formed in single or multiple layers using at least one material or alloy selected from the group.

<Openings TH1 and TH2 of the Body>

Referring to FIGS. 2 to 5, the light emitting device package 100 according to an embodiment of the invention may comprise at least two openings. The opening may be disposed on the first and second frames 111 and 112 or on the body 113 disposed under the light emitting device 120. The opening may comprise an opening vertically passing through an upper surface and a lower surface of the frames or the body. The opening may comprise a first opening TH1 and a second opening TH2. The first frame 111 may comprise the first opening TH1. The second frame 112 may comprise the second opening TH2.

The first opening TH1 may be provided with one or more in the first frame 111. The first opening TH1 may be provided passing through the first frame 111. The first opening Till may be passing through the upper surface and the lower surface of the first frame 111 in the vertical direction Z.

The first opening TH1 may be disposed under the first bonding pad 121 of the light emitting device 120. The first opening TH1 may be provided to overlap with the first bonding pad 121 of the light emitting device 120 in the vertical direction. The first opening Till may be provided to be overlapped with the first bonding pad 121 of the light emitting device 120 in a vertical direction toward the lower surface from the upper surface of the first frame 111.

The second openings TH2 may be provided with one or more in the second frame 112. The second opening TH2 may be provided passing through the second frame 112. The second opening TH2 may be provided passing through the upper surface and the lower surface of the second frame 112 in a vertical direction.

The second opening TH2 may be disposed under the second bonding pad 122 of the light emitting device 120. The second opening TH2 may be provided to overlap with the second bonding pad 122 of the light emitting device 120. The second opening TH2 may be provided to be overlapped with the second bonding pad 122 of the light emitting device 120 in a direction toward the lower surface from the upper surface of the second frame 112.

The first opening TH1 and the second opening TH2 may be spaced apart from each other. The first opening TH1 and the second opening TH2 may be spaced apart from each other under the lower surface of the light emitting device 120. The first opening TH1 and the second opening TH2 may overlap the light emitting device 120 in the third direction. The first opening TH1 and the second opening TH2 may be disposed in a region overlapping the light emitting device 120 and may be spaced apart from the body 113.

Referring to FIGS. 3 and 8, according to an embodiment of the invention, the width W2 of the upper region of the first opening TH1 in the X direction may be equal to or smaller than the width W1 of the first bonding pad 121. In addition, the width of the upper region of the second opening TH2 in the X direction may be equal to or smaller than the width of the second bonding pad 122. The widths of the first and second openings TH1 and TH2 in the X direction may be equal to or different from each other. The widths of the first and second bonding pads 121 and 122 in the X direction may be the same or different from each other.

Referring to FIGS. 4 and 8, according to an embodiment of the invention, a length W12 of the upper region of the first opening TH1 in the Y direction may be equal to or smaller than the length W11 of the first bonding pad 121. The length W13 of the upper region of the second opening TH2 in the Y direction may be equal to or smaller than the length W14 of the second bonding pad 122 as shown in FIG. 5. The lengths W2 and W5 of the first and second openings TH1 and TH2 in the Y direction may be the same or different from each other. The lengths W1 and W6 of the first and second bonding pads 121 and 122 in the Y direction may be the same or different from each other. Here, when the lengths of the bonding pads 121 and 122 are W13=W11, the lengths of the openings TH1 and TH2 may have a relationship of W12=W14. The upper areas of the openings TH1 and TH2 may be at least 50% or 50% to 110% of the bottom area of the bonding pads 121 and 122, respectively. In addition, each of the openings and TH2 and each bonding pad 121 and 122 may have a partially overlapping region and a non-overlapping region, respectively. Accordingly, the first bonding pad 121 and the first frame 111 of the light emitting device 120 may be attached by a material provided in the first opening TH1. The second bonding pad 122 and the second frame 112 of the light emitting device 120 may be attached by a material provided in the first opening TH1.

A distance from the upper region of the second opening TH2 to the side end of the second bonding pad 122 in the X direction may be 40 micrometers or more, for example, 40 micrometers to 60 micrometers. When the distance is equal to or greater than 40 micrometers, a process margin for preventing the second bonding pad 122 from being exposed at the bottom of the second opening TH2 can be secured. When the distance is equal to or less than 60 micrometers, the area of the second bonding pad 122 exposed to the second opening TH2 can be ensured, a resistance of the second bonding pad 122 exposed by the second opening TH2 can be lowered, and a current injection through the second bonding pad 122 exposed by the second opening TH2 can be improved.

Referring to FIGS. 8 and 19, the width W2 of the upper region of the first opening TH1 in the X direction may be smaller than the width of the lower region of the first opening TH1 or may be equal to a width of the lower region such as an opening TH3 as shown in FIG. 20. The width of the upper region of the second opening TH2 may be smaller than the width of the lower region of the second opening TH2 or may be equal to the width of the lower region such as the opening TH3 as shown in FIG. 20. As shown in FIG. 19, the circumference surfaces of the openings TH1 and TH2 may be a convex surface S1 or may be a vertical flat plane S2 as shown in FIG. 20.

As shown in FIGS. 19, 21, and 22, the openings TH1, TH2, TH3, and TH5 may be provided in such a shape that the width in the X or Y direction gradually decreases from the lower region to the upper region thereof. The circumference surfaces S1, S3 and S4 between the upper and lower regions of the first and second openings TH1 and TH2 may be a plurality of inclined planes S3 having different slopes, curved surfaces S1 or a curved surface S4 having a different curvature. The circumference surfaces of the openings TH1, TH2, TH3, TH4 and TH5 may be at least one of a flat surface, a sloped surface, and a curved surface, if the material of the frames 111 and 112 is formed of an insulating material, the openings may be provided in a shape as shown in FIGS. 19 and 20. When the opening is formed of a conductive material, the opening may be provided in a shape as shown in FIGS. 19 to 22.

An interval between the first opening TH1 and the second opening TH2 in the lower surface region of the first frame 111 and the second frame 112 may be provided at least 100 micrometers, or 100 micrometers to 150 micrometers. The interval between the openings TH1 and TH2 may be a minimum distance to prevent an electrical short between the bonding pads when the light emitting device package 100 is mounted on a circuit board or a submount.

<Adhesive 130>

Referring to FIGS. 3 to 5, the light emitting device package 100 according to an embodiment of the invention may comprise an adhesive 130. The adhesive 130 may be disposed between the body 113 and the light emitting device 120. The adhesive 130 may be disposed between the upper surface of the body 113 and the lower surface of the light emitting device 120. The adhesive 130 may overlap the light emitting device 120 in the Z direction that is vertical direction. The adhesive 130 may be adhered to the light emitting device 120 and the body 113. The adhesive 130 may be disposed between the first bonding pad 121 and the second bonding pad 122 of the light emitting device 120 or may be in contact with the first and second bonding pads 121 and 122.

<Recess R of the Body>

As shown in FIGS. 1 to 5, the light emitting device package 100 according to an embodiment of the invention may comprise a recess R. The recess R may be provided in the body 113 or an upper portion of the body 113. The recess R may be provided between the first opening TH1 and the second opening TH2. The recess R may be recessed in a direction from an upper surface to a lower surface of the body 113. The recesses R may be disposed in one or more under the light emitting device 120. The recesses R may be provided to overlap with the light emitting device 120 in the Z direction. The adhesive 130 may be disposed in the recess R. The adhesive 130 may provide a stable fixing force between the light emitting device 120 and the package body 110. The adhesive 130 may provide a stable fixing force between the light emitting device 120 and the body 113. The adhesive 130 may be disposed in direct contact with the upper surface of the body 113. In addition, the adhesive 130 may be disposed in direct contact with the lower surface of the light emitting device 120.

For example, the adhesive 130 may comprise at least one of an epoxy-based material, a silicone-based material, and a hybrid material including an epoxy-based material and a silicone-based material. As an example, when the adhesive 130 comprises a reflective function, the adhesive 130 may comprise a white silicone.

The adhesive 130 may provide a stable fixing force between the body 113 and the light emitting device 120. The adhesive 130 may provide a light diffusion function between the light emitting device 120 and the body 113 when light is emitted through the lower surface of the light emitting device 120. When the light is emitted from the light emitting device 120 to the lower surface of the light emitting device 120, the adhesive 130 may provide a light diffusion function. Accordingly, the light extraction efficiency of the light emitting device package 100 can be improved. In addition, the adhesive 130 may reflect light emitted from the light emitting device 120. When the adhesive 130 comprises a reflection function, the adhesive 130 may be formed of materials including $TiO_2$, silicone, and the like.

As shown in FIG. 3, according to an embodiment of the invention, a depth T1 of the recess R may be smaller than a depth 12 of the first opening TH1 or a depth T2 of the second opening TH2. The depth T1 of the recess R may be determined in consideration of the adhesive force of the adhesive 130. The depth T1 of the recess may be determined in consideration of the stable strength of the body 113 or may be such that no crack is generated in the light emitting device package 100 due to heat emitted from the light emitting device 120.

The recess R may provide a suitable space in which a kind of an underfill process may be performed under the light emitting device 120. The underfill process may be a process of disposing the adhesive 130 under the light emitting device 120, after mounting the light emitting device 120 on the package body 110. The underfill process may be a process of disposing the light emitting device 120 to mount the light emitting device 120 using the adhesive 130, after disposing the adhesive 130 in the recess R in the process of mounting the light emitting device 120 on the package body 110. The recess R may be provided greater than or equal to the first depth to sufficiently provide the adhesive 130 between the lower surface of the light emitting device 120 and the upper surface of the body 113. In addition, the recess R may be provided smaller than or equal to a second depth to provide a stable strength of the body 113.

The depth T1 and the width W4 in the X direction of the recess R may affect the forming position and fixing force of the adhesive 130. The depth T1 and the width W4 of the recess R may be determined so that a sufficient fixing force can be provided by the adhesive 130 disposed between the body 113 and the light emitting device 120. By way of example, the depth T1 of the recess R may be greater than or equal to 40 micrometers or may be provided in a range of 40 micrometers to 60 micrometers.

The width W4 of the recess R may be provided narrower than the interval between the first bonding pad 121 and the second bonding pad 122 in the X direction of the light emitting device 120. The width W4 may be provided greater than or equal to 140 micrometers, or may be provided in a range of 140 micrometers to 160 micrometers. The length of the recess R in the Y direction may be greater or smaller than the length of the light emitting device 120 in the Y direction, and may guide forming of the adhesive 130 and strengthen the adhesion in the Y direction.

The depth T2 of the first opening TH1 may be equal to the thickness of the first frame 111. The depth T2 of the first opening TH1 may be provided to a thickness sufficient to maintain a stable strength of the first frame 111. The depth T2 of the second opening TH2 may be equal to the thickness of the second frame 112, The depth 12 of the second opening TH2 may be provided to a thickness capable of maintaining a stable strength of the second frame 112.

The depth 12 of the first opening TH1 and the depth T2 of the second opening TH2 may be the same as the thickness of the body 113. The depth T2 of the first opening TH1 and the depth T2 of the second opening TH2 may be provided of a thickness to maintain the stable strength of the body 113. For example, the depth T2 of the first opening TH1 may be provided 180 micrometers or more, or 180 micrometers to 220 micrometers. As an example, the thickness difference T2-T1 of the depths 12 and T1 may be selected to be 100 micrometers or more. This is in consideration of the thickness of the injection process capable of providing crack free of the body 113.

According to an embodiment of the invention, the ratio T2/T1 of the depth T1 to the depth T2 may be provided in a range of 2 to 10. As an example, if the depth T2 is provided of 200 micrometers, the depth. T1 may be provided of 20 micrometers to 100 micrometers.

<Molding Part 140>

As shown in FIGS. 1 to 5, the light emitting device package 100 according to the embodiment of the invention may comprise a molding part 140. The molding part 140 may be provided on the light emitting device 120. The molding part 140 may be disposed on the first frame 111 and the second frame 112. The molding part 140 may be disposed in the cavity C provided by the package body 110.

The molding part 140 may comprise an insulating material. The molding part 140 may comprise wavelength conversion means for receiving light emitted from the light emitting device 120 and providing wavelength-converted light. For example, the molding part 140 may comprise at least one selected from a group including phosphors, quantum dots, and the like. The light emitting device 120 may emit light of blue, green, red, white, infrared, or ultraviolet rays. The phosphors or quantum dots may emit blue, green or red light. The molding part 140 may not be formed.

<Conductive Parts 321 and 322>

As shown in FIGS. 3 to 5, the light emitting device package 100 according to an embodiment of the invention may comprise a first conductive part 321 and a second conductive part 322. The first conductive part 321 may be spaced apart from the second conductive part 322.

The first conductive part 321 may be disposed in the first opening TH1. The first conductive part 321 may be disposed under the first bonding pad 121. The width and length of the first conductive part 321 in the X and Y directions may be provided smaller than the width and length of the first bonding pad 121.

The first bonding pad 121 may have a width in the X direction perpendicular to the Z direction in which the first opening T1 is formed. The width of the first bonding pad 121 may be provided greater than the width W2 of the first opening TH1 in the X direction.

The first conductive part 321 may be disposed in direct contact with the lower surface of the first bonding pad 121. The first conductive part 321 may be electrically connected to the first bonding pad 121. The first frame 111 may be disposed around the first conductive part 311.

The second conductive part 322 may be disposed in the second opening TH2. The second conductive part 322 may be disposed under the second bonding pad 122. The width and length of the second conductive part 322 in the X and Y directions may be provided smaller than the width and length of the second bonding pad 122. The second bonding pad 122 may have a width W13 in the X direction perpendicular to the Z direction in which the second opening TH2 is formed. The width W13 of the second bonding pad 122 in the X direction may be provided greater than the width W14 of the second opening TH2 in the X direction.

The second conductive part 322 may be disposed in direct contact with the lower surface of the second bonding pad 122. The second conductive part 322 may be electrically connected to the second bonding pad 122. The second frame 112 may be disposed around the second conductive part 322.

The first conductive part 321 and the second conductive part 322 may comprise at least one material selected from a group including Ag, Au, Pt, Sri, Cu, Zn, In, Bi, Ti, or an alloy, thereof. The first conductive part 321 and the second conductive part 322 may be formed of materials capable of ensuring a conductive function. The first and second conductive parts 321 and 322 may be solder pastes, and may be formed by mixing powder particles or particles and flux. The solder paste may comprise Sn—Ag—Cu, and the weight percentage of each metal may be varied.

For example, the first conductive part 321 and the second conductive part 322 may be formed using a conductive paste. The conductive paste may comprise a solder paste, a silver paste, or the like, and may be composed of a multi-layer which is composed of different materials, or a multi-layer or a single layer which is formed of an alloy.

The light emitting device package 100 according to an embodiment of the invention can supply power to the first bonding pad 121 through the first conductive part 321 of the first opening TH1, and supply power to the second bonding pad 122 through the second conductive part 322 of the second opening TH2. When the first and second frames 111 and 112 are formed of a conductive material, the first and second frames 111 and 112 may be electrically, connected to the bonding pads 121 and 122 of the light emitting device 120, respectively. The bonding pads 121 and 122 of the light emitting device 120 may be electrically connected to at least one or both of the first and second conductive parts 321 and 322 and the frames 111 and 112. Accordingly, the light emitting device 120 can be driven by the driving power supplied through the first bonding pad 121 and the second bonding pad 122. The light emitted from the light emitting device 120 may be provided in an upward direction of the package body 110.

<Lower Recess R10 and R20>

As shown in FIGS. 1 to 3, the light emitting device package 100 according to an embodiment of the invention may comprise a first lower recess R10 and a second lower recess R20. The first lower recess 110 and the second lower recess R20 may be spaced apart from each other.

The first lower recess R10 may be provided on the lower surface of the first frame 111. The first lower recess R10 may be concave in a direction from the lower surface to the upper surface of the first frame 111. The first lower recess R10 may be spaced apart from the first opening TH1. A resin part may be provided in the first lower recess R10. For example, the resin part filled in the first lower recess R10 may be provided with the same material as that of the body 113. The resin part may be selected from materials having poor adhesion and poor wettability with the first and second conductive parts 321 and 322. Alternatively, the resin part may be selected from materials having a low surface tension with the first and second conductive parts 321 and 322. For example, the resin part filled in the first lower recess R10 may be provided in the process of forming the package body including the first frame 111, the second frame 112, and the body 113 through an injection process.

The resin part filled in the first lower recess R10 may be disposed around a first tower surface region of the first frame 111 providing the first opening TH1. The first lower surface region of the first frame 111 providing the first opening TH1 may be disposed as a kind of an island shape and may be separated from a second lower surface region surrounding the lower surface of the first frame 111. For example, as shown in FIG. 2, the first lower surface region of the first frame 111 providing the first opening TH1 may be isolated from the second lower surface region of first frame 111 by the resin part filled in the first lower recess R10 and the body 113.

Therefore, when the material of the resin part may be poor in adhesion or wettability with the first and second conductive parts 321 and 322, or may be low in surface tension with the first and second conductive parts 321 and 322, a portion of the first and second conductive parts 321 and 322 may be leak from the first and second openings TH1 and TH2. At this time, the material of the resin part filled in the first and second lower recesses R10 and R20 or the body 113 may prevent the conductive parts 321 and 322 disposed in the openings TH1 and TH2 from leaking or diffusing in the other direction. The resin part or the body 113 may be formed of a material having poor adhesion, poor wettability, and poor surface tension with the first and second conductive parts 321 and 322. The material of the first and second conductive parts 321 and 322 may be selected to have good adhesion properties with the first and second frames 111 and 112. The material constituting the first and second conductive parts 321 and 322 may be selected to have poor adhesion properties with the resin part and the body 113.

Whereby, the first conductive part 321 can be prevented from overflowing or spreading out of the region provided with the resin part or the body 113 in the first opening and can be stably disposed in a region where the first opening TH1 is provided. Therefore, the first conductive part 321 disposed in the first opening TH1 may be prevented from being extended by the resin part or the outer region of the first lower recess R10. In addition, the first conductive part 321 may be stably connected to the lower surface of the first bonding pad 121 in the first opening TH1.

The first conductive part 321 may extend from the first opening TH1 to the first lower recess R10. Therefore, the first conductive part 321 and/or the resin part may be disposed in the first lower recess R10. The second lower recess R20 may be provided on the lower surface of the second frame 112. The second lower recess R20 may be concave in a direction from the lower surface to the upper surface of the second frame 112. The second lower recess R20 may be spaced apart from the second opening TH2. For example, the resin part filled in the second lower recess R20 may be provided in the process of forming the first frame 111, the second frame 112, and the body 113 through an injection process.

The resin part filled in the second lower recess R20 may be disposed around a first lower surface region of the second frame 112 providing the second opening TH2. The first lower surface region of the second frame 112 providing the second opening TH2 may be disposed as a kind of an island shape and may be separated from a second lower surface region surrounding the lower surface of the second frame 112. For example, as shown in FIG. 2, the first lower surface region of the second frame 112 providing the second opening TH2 may be isolated from the second lower surface region of the second frame 112 by a material of the resin part filled in the second lower recess R20 and the body 113. Accordingly, the second conductive part 322 can be prevented from flowing outwardly of the second opening TH2, or can be prevented from overflowing or spreading outside the region where the resin part or the body 113 is provided. Accordingly, the second conductive part 322 can be stably disposed in the region provided with the second opening TH2, Therefore, the first conductive part 322 disposed in the second opening TH2 may be prevented from being extended by the resin part or the outer region of the second lower recess R20. In addition, the second conductive part 322 may be stably connected to the lower surface of the second bonding pad 122 in the second opening TH2.

Therefore, when the light emitting device package is mounted on the circuit board, the first conductive part 321 and the second conductive part 322 may not contact each other. The first and second conductive parts 321 and 322 may easily control the amount of the implantation.

The second conductive part 322 may extend from the second opening TH2 to the second lower recess R20, Accordingly, the second conductive part 321 and/or the resin part may be disposed in the second lower recess R20. The lower recesses R10 and R20 may be disposed in one or more in the frames 111 and 112, respectively.

In the embodiment of the invention, when the conductive parts 321 and 322 are filled in the openings TH1 and TH2 and then cured, the cured conductive parts 321 and 322 may attract the bonding pads 121 and 122 of the light emitting device 120 in contact with the conductive parts 321 and 322. When the conductive parts 321 and 322 attract the bonding pads 121 and 122 of the light emitting device 120, the bonding pads 121 and 122 may be partially separated from the light emitting structure 123 or the semiconductor layer, and a contact region between the bonding pads and the conductive part may be reduced, and a power supply efficiency may be lowered. The interface between the semiconductor layer and the bonding pads 121 and 122 may be separated so that the power supplied to the bonding pads 121 and 122 may not be smoothly supplied to the semiconductor layer, thereby reducing the reliability of the device.

In the embodiment of the invention, the contact region of the bonding pads 121 and 122 of the light emitting device 120 may be dispersed by the non-contact region or may be reduced in contacted area with the conductive parts 321 and 322 for partial contact with the conductive parts 321 and 322. In this case, since the light emitting device 120 secures a sufficient shear force (DST: Die Shear Strength) by the conductive parts 321 and 322 and the adhesive 130, even if the conductive parts 321 and 322 and the first and second bonding pads 121 and 122 are dispersed in contact or partial contact, the adhesive force between the adhesive 130 and the light emitting device 120 may not fall below a predetermined reference.

In the embodiment of the invention, at least one or both of the bonding pads 121 and 122 of the light emitting device 120 may comprise regions that are not in contact with the conductive parts 321 and 322 on the openings TH1 and TH2. At least one or both of the bonding pads 121 and 122 may comprise regions that are in contact with the conductive parts 321 and 322 and non-contacting regions that are not in contact with the conductive parts 321 and 322 on the openings TH1 and TH2. Each of the bonding pads 121 and 122 may comprise contact region and non-contact region. For convenience of explanation, a region contacting each of the conductive parts 321 and 322 in the bonding pads 121 and 122 may be defined as a contact region, and a non-contacting region may be defined as a non-contact region. In the bonding pads 121 and 122, the contact region may comprise one or a plurality of regions. The non-contact region in each of the bonding pads 121 and 122 may comprise one or a plurality of regions. The contact region may be a part of the lower surface of the bonding pads 121 and 122, and the non-contact region may be an open area without the bonding pads or an area where an insulating material is formed on a surface of the bonding pads. The non-contact region may be a concave part recessed from the bonding pads. The concave part may be a concave part of the bonding pads of the light emitting device to be described later.

Referring to FIGS. 4, 8 and 9, the first bonding pad 121 of the light emitting device 120 may comprise first contact regions 21 and 22 and a first non-contact region 23. The first contact regions 21 and 22 may be divided into one or a plurality of regions and the plurality of first contact regions 21 and 22 may be connected to each other by a first connection part 24. The first connection part 24 may be in contact with or non-contact with the conductive parts 321 and 322. The first connection part 24 may connect power between the plurality of first contact regions 21 and 22, and even if a contact region of a part of the first contact region with the conductive parts 321 and 322 is lowered, the power can be transmitted to the other area through the first connection part 24. The first non-contact region 23 may be an empty area or a region where the resin part may be filled.

A first non-contact region 23 in the first bonding pad 121 may be disposed adjacent to the first contact regions 21 and 22 or between the first contact regions 21 and 22. An area of the first non-contact region 23 may be smaller than an area of an upper surface of the first opening TH1. The first non-contact region 23 may be smaller than or equal to the width W11 of the first bonding pad 121 in the X direction or the length W1 of the first bonding pad 121 in the Y direction. The first non-contact region 23 may be disposed in one or a plurality of regions overlapping with the first opening TH1.

Referring to FIG. 8, the width W12 in the X direction in the first opening TH1 may be smaller than or equal to the length W2 in the Y direction. The width W14 in the X direction in the second opening TH2 may be smaller than or equal to the length W6 in the Y direction. The area of the virtual line connecting the outer edge of the first bonding pad 121 may be greater than the area of the upper surface of the first opening TH1. The area of the virtual line connecting the outer edge of the second bonding pad 122 may be greater than the area of the upper surface of the second opening TH2. The area of the upper surface of the first bonding pad 121 may be smaller than or equal to the area of the upper surface of the second bonding pad 122, but the invention is not limited thereto.

The second bonding pad 122 of the light emitting device 120 may comprise second contact regions 31, 32 and a second non-contact region 33. The second non-contact region 33 may be an empty region or a region where the resin part may be filled. The second contact regions 31 and 32 may be divided into one or a plurality of regions and the plurality of second contact regions 31 and 32 may be connected to each other by a second connection part 34. The second connection part 34 may be in contact with or non-contact with the conductive parts 321 and 322. The second connection part 34 may connect power between the plurality of second contact regions 31 and 32, and even if a contact region of a part of the second contact region with the conductive parts 321 and 322 is lowered, the power can be transmitted to the other area through the second connection part 34.

In the second bonding pad 122, the second non-contact region 33 may be adjacent to the second contact regions 31, 32 or may be disposed between the second contact regions 31 and 32. The area of the second non-contact region 33 may be smaller than the area of the upper surface of the second opening TH2. The second non-contact region 33 may be smaller than or equal to the width W13 of the second bonding pad 122 in the X direction or the length W6 of the second bonding pad 122 in the Y direction. The second non-contact region 33 may be disposed in one or a plurality of regions overlapping with the second opening TH2.

Referring to FIG. 8, the first and second openings TH1 and TH2 may have a relationship of W12<W11 and W14<W13 in the X direction, and W2<W1 and W5<W6 in the Y direction. Accordingly, the contact regions 21, 22, 31 and 32 of the conductive parts 321 and 322 and the bonding pads 121 and 122 may be dispersed through the first and second openings TH1 and TH2 and an external force transmitted to the bonding pads 121 and 122 may be dispersed.

Referring to FIG. 4, the first contact regions 21 and 22 of the first bonding pad 121 are in contact with the first conductive parts 321 filled in the first opening TH1 and the first non-contact region 33 may overlap the first opening TH1 and the first conductive part 321 in the Z direction. Since the first non-contact region 23 corresponds to the first conductive part 321, the first contact regions 21 and 22 may be spaced apart from the first conductive part 321. The upper surface of the first conductive part 321 corresponding to the first non-contact region 23 may have a concave curved surface C1. The first non-contact region 33 may be disposed between the first contact regions 21 and 22 in the Y direction or may be disposed adjacent to the center rather than an edge part of the light emitting device 120 in the Y direction.

Referring to FIG. 5, the second contact regions 31 and 32 of the second bonding pad 122 are in contact with the second conductive parts 322 filled in the second opening TH2, the second non-contact region 33 may overlap the second opening TH2 and the second conductive part 322 in the Z direction. Since the second non-contact region 33 corresponds to the second conductive part 322, the second contact regions 31 and 32 may be spaced apart from the second conductive part 322. The upper surface of the second conductive part 322 corresponding to the second non-contact region 33 may comprise a concave curved surface C1. The second non-contact region 33 may be disposed between the second contact regions 31 and 32 in the Y direction or may be disposed adjacent to the center rather than the edge part of the light emitting device 120 in the Y direction.

The adhesive 130 may be disposed on the outer sides of the first and second non-contact regions 23 and 33 of the first and second bonding pads 121 and 122 or the resin part 135 may be disposed as shown in FIG. 23. Thus a flow of the conductive part 321 and 322 may be blocked.

The contact area between the conductive parts 321 and 322 and the first and second bonding pads 121 and 122 may be smaller than the area of the upper surface of each of the openings TH1 and TH2 by a non-contact region. Each contact region of the first and second bonding pads 121 and 122 may have a circular shape, a polygonal shape, an elliptical shape, or a shape having a curved line or a straight line. The non-contact regions of the first and second bonding pads 121 and 122 may be opened in a downward direction and open in at least one of X direction, Y direction and diagonal direction, and a bottom view shape of the bonding pads 121 and 122 may be circular, polygonal, elliptical, or atypical geometry.

Referring to FIGS. 8 and 9, when the first and second conductive parts 321 and 322 contact the first and second contact regions 21, 22, 31 and 32 of the first and second bonding pads 121 and 122, an area of the second contact regions 21, 22, 31 and 32 are the areas of the portions 20 and 30 overlapping the first and second openings TH1 and TH2, and may be larger than areas of the particles 320 or powder (hereinafter, referred to as particles) constituting the first and second conductive parts 321 and 322. The size of the particle 320 may be 10 micrometers, a range of 10 micrometers to 40 micrometers, or a range of 20 micrometers to 40 micrometers. When the size of the particle 320 is out of the above range, the printability and wettability of the solder paste filled in the openings TH1 and TH2 may be deteriorated, and high reliability may not be maintained.

The areas of the portions 20 and 30 overlapping with the first and second openings TH1 and TH2 in the first and second contact areas 21, 22, 31 and 32 of the first and second bonding pads 121 and 122 may be at least twice the area of the particle 320. For example, when a radius of the particle 320 is r, the minimum area of each of the contact regions 21, 22, 32, and 33 contacting each of the first and second conductive parts 321 and 322 may be twice or more than an area of the particle obtained by $\pi \times r^2$ or equal to or more than the area of $n \times \pi \times r^2$, in which the n may be greater than or equal to 2. Since the first and second contact regions 21, 22, 31 and 32 of the first and second bonding pads 121 and 122 are provided at least twice the area of the particle 320, the first and second contact regions 21, 22, 31 and 32 can improve the printability and wettability with the solder paste and maintain high reliability.

The minimum area overlapping the first and second openings TH1 and TH2 in the first and second non-contact regions 23 and 33 of the first and second bonding pads 121 and 122 may be 1.5 times or more the area of the particle 320. For example, when the radius of the particle 320 is r, the minimum area of the non-contact regions 23 and 33 that are not in contact with the first and second conductive parts 321 and 322 is 1.5 times or more the area calculated by [$\pi \times r$. The first and second non-contact regions 23 and 33 of the first and second bonding pads 121 and 122 may be provided at least 1.5 times or more the area of the particle 320. Accordingly, the contact region between the first and second conductive parts 321 and 322 and the first and second bonding pads 121 and 122 on the openings TH1 and TH2 can be reduced, the pulling force of the first and second bonding pads 121 and 122 can be dispersed, and the contact failure with the bonding pads 121 and 122 can be reduced and the reliability can be improved.

Referring to FIG. 8, when the non-contact regions 23 and 33 are formed in the X direction in the bonding pads 121 and 122, the widths W31, W41 and W42 of the contact regions 21, 22, 31 and 32 in the Y direction may be at least two times the particle diameter or may be in a range of two to four times the particle diameter. The widths W31, W41 and W42 may be formed in a range of 40 micrometers or more, or in a range of 40 micrometers to 100 micrometers. The widths W32 and W43 in the Y direction of the non-contact regions 23 and 33 may be 1.5 times or more of the particle diameter. The widths W32 and W43 of the non-contact regions 23 and 33 in the Y direction may be formed in a range of 30 micrometers or more, for example, 30 micrometers to 80 micrometers. The width of the non-contact regions 23 and 33 in the X direction may be equal to or greater than the widths W32 and W43 in the Y direction. When the contact regions 21, 22, 31 and 32 of the first and second bonding pads 121 and 122 and the non-contact regions 23 and 33 have the above widths, the pulling force of the pads 121 and 122 in the contact regions 21, 22, can be dispersed and the defects of the bonding pads 121 and 122 of the light emitting device 120 can be reduced and the reliability can be improved.

As shown in FIG. 6, a protective layer 129 may be disposed around the first bonding pad 121. The protective layer 129 may be exposed to a region that does not cover the bottom surface of the first bonding pad 121, for example, a region facing the first frame 111. The protective layer 129 may have a thickness smaller than the thickness of the first bonding pad 121 to support and protect the first bonding pad 121. The protective layer 129 may be disposed on the lower surface of the light emitting device 120. An adhesive force F1 and F2 between the first conductive part 321 and the first bonding pad 121 may be dispersed in the first opening TH1. The non-contact region 23 of the first bonding pad 121 may be disposed on the protective layer 129 to face the conductive parts 321 and 322. The protective layer 129 may be disposed around the second bonding pad 122. The second bonding pad 122 and the protective layer 129 disposed at the periphery of the second bonding pad 122 may be the same as those described above, and will be described with reference to the above description.

As shown in FIG. 7, a protective layer 129 may be disposed around the first and second bonding pads 121 and 122. The protective layer 129 may cover the outer periphery of the bottom surface of the first and second bonding pads 121 and 122 and may expose an inner region of the bottom surface of the first and second bonding pads 121 and 122. The protective layer 129 can support the first bonding pad 121 when the bottom surface of the first bonding pad 121 and the first conductive part 321 are in contact with each other. Here, the protective layer 129 may comprise a portion that is partially in contact with the first conductive part 321, a portion that is not in contact with the first conductive part 321, and portions comprising a contact portion and a non-contact portion. The adhesive forces F1 and F2 between the first and second conductive parts 321 and 322 and the first and second bonding pads 121 and 122 may be dispersed in the first and second openings TH1 and TH2. The area of the non-contact region 23 can be controlled by the protective layer 129 disposed on the first and second bonding pads 121 and 122. The non-contact region 23 of the first and second bonding pads 121 and 122 may be disposed on the protective layer 129 to face the first and second conductive parts 321 and 322, The second bonding pad 122 and the protective layer 129 disposed around the second bonding pad 122 will be referred to the above description.

As shown in FIGS. 4 and 5, when the conductive parts 321 and 322 are filled in the first and second openings TH1 and TH2, the conductive parts 321 and 322 configured to be filled are contacted with the contact regions 21, 22, 31, and 32 of the first and second bonding pads 121 and 122, and may leak laterally through the non-contact regions 23, 33. For example, as shown in FIG. 8, the conductive parts 321 and 322 may flow out through lateral directions F3 and F4 in which the non-contact regions 23 and 33 of the bonding pads 121 and 122 are opened. In this case, as shown in FIG. 3, the adhesive 130 adhered between the light emitting device 120 and the body 113 can prevent the conductive parts 321 and 322 from leaking.

As shown in FIG. 8, the connection part 24 and 34 of the first and second bonding pads 121 and 122 are adjacent to the frames 111 and 112 or bonded to the conductive parts 321 and 322, respectively. In this case, an outflow of the conductive parts 321 and 322 can be blocked as shown in FIG. 3.

FIG. 10 is another example of the opening and the bonding pad in the embodiment of the invention. Referring to, FIG. 10, the length W2 in the Y direction of the first opening TH1 may be greater than the length W1 of the first bonding pad 121 in the Y direction. The Y direction length W5 of the second opening TH2 may be greater than the Y direction length W6 of the second bonding pad 122. At least one of the first and second bonding pads 121 and 122 may have a length W1 and W5 in the Y direction smaller than at least one of a length W2 and W6 in the Y direction of the first and second openings TH1 and TH2. In this case, the non-contact region of the first and second bonding pads 121 and 122 can be further increased.

As shown in FIG. 11, at least one of the plurality of bonding pads may comprise an inner contact region 21A and an outer contact region 21B. The non-contact region 23 of the bonding pad 121 may be disposed between the inner contact region 21A and the outer contact region 21B. The non-contact region 23 may separate the inner and outer contact regions 21A and 21B. When the inner and outer contact regions 21A and 21B are separated on the bonding pads 121, the two separated contact regions may be connected by a different patterns. The bonding pads may be applied to the first and second bonding pads as shown in FIG. 12.

As shown in FIG. 12, the first bonding pad 121 may comprise a non-contact region 23 between the inner and outer contact regions 21A and 21B. The outer contact region 21B may be electrically connected to the frame 111. The second bonding pad 122 may have a non-contact region 33 disposed between the inner and outer contact regions 31A and 32A and may be electrically connected to the frame 112. In this case, an area of the contact regions 21A, 21B, 31A, and 32A of the first and second bonding pads 121 and 122 which is contacted with the first and second frames 111 and 112 may be larger than an area contacting with the first and second conductive parts 321 and 322, respectively. Accordingly, even if the contact regions 21A, 21B, 31A, and 32A of the bonding pads 121 and 122 are separated from each other, a reduction in electrical characteristics can be prevented and a pulling force of the bonding pads can be reduced. The width of the outer contact regions 21B and 32A may be twice or more the diameter of the particle, so that the outer contact regions 213 and 32A may be stably connected with the frames 111 and 112.

The area of the upper surface of the first bonding pad 121 may be equal to or smaller than the area of the upper surface of the second bonding pad 122. The area of the upper surface of the first opening TH1 may be equal to or smaller than the area of the upper surface of the second opening TH2.

Referring to FIG. 13, in at least one of the plurality of bonding pads, a plurality of contact regions 21A and 21B may be connected by a connection part 24, The position of the connection part 24 may be a center position of the plurality of contact regions 21A and 21B. The connection part 24 may extend in a direction perpendicular or inclined to the respective contact regions 21A and 21B. The connection part 24 may be one or more. The connection part 24 may be a region in contact with the conductive parts 321 and 322. The shape of the bonding pad can be applied as shown in FIG. 14.

Referring to FIG. 14, the first bonding pad 121 may comprise a connection part 24 between a plurality of contact regions 21A and 21B and a non-contact region 23 on both sides of the connection part 24. In the first bonding pad 121, a connection part 24 may be connected between the plurality of contact regions 21A and 21B and the first bonding pad 121 may be in contact with a conductive part. The non-contact region 23 of the first bonding pad 121 may be separated on both sides by the connection part 24. The minimum width of the connection part 24 may be larger or smaller than the particle diameter, but is not limited thereto. The first bonding pad 121 may have a connection part 24 disposed between the plurality of contact regions 21A and 21B and may be in contact with the conductive part. The width in the X direction and the length in the Y direction of the first bonding pad 121 may be larger than the opening.

The second bonding pad 122 may have a connection part 34 between a plurality of contact regions 31A and 31B and a non-contact region 33 on both sides of the connection part 34. The second bonding pad 122 may have a connection part 34 disposed between the plurality of contact regions 31A and 31B and may be in contact with the conductive part. The width in the X direction and the length in the Y direction of the second bonding pad 122 may be larger than the opening.

The area of the upper surface of the first bonding pad 121 may be equal to or smaller than the area of the upper surface of the second bonding pad 122. The area of the upper surface of the first opening TH1 may be equal to or smaller than the area of the upper surface of the second opening TH2.

FIGS. 15 to 18 are modifications of the bonding pad according to the embodiment of the invention.

As shown in FIG. 15, in the bonding pads 121 and 122, the inner contact region 25 and the outer contact region 26 may be connected by the connection part 27 in the diagonal direction. At least two or more non-contact regions 28 may be disposed in the outer contact region 26 by a connection part 27, The minimum width of the non-contact region 28 may be at least 1.5 times the particle diameter, and the minimum width of the contact regions 25 and 26 may be at least twice the particle diameter. By the dispersed contact regions 25 and 26, the printability and wettability of the solder paste as the conductive parts 321 and 322 can be improved and high reliability can be maintained. The inner and outer contact regions 25 and 26 may comprise circular or polygonal shapes.

As shown in FIG. 16, the bonding pads 121 and 122 may comprise a plurality of contact regions 35 and 36 disposed at corner portions of a polygonal shape, and the contact regions 35 and 36 may be connected by the connection part 37. The contact regions 35 and 36 may be circular, polygonal, or elliptical shapes, Each of the contact regions 35 and 36 may comprise a shape having a curved line or a straight line. The non-contact region 37 may be provided between the contact regions 35 and 36. The minimum width of the non-contact region 37 may be at least 1.5 times the particle diameter, and the minimum width of the contact regions 35 and 36 may be at least twice the particle diameter. The printability and wettability of the solder paste as the conductive parts 321 and 322 can be improved and high reliability can be maintained.

As shown in FIG. 17, the bonding pads 121 and 122 may have a plurality of contact regions 41 and 42 disposed in a matrix, and the contact regions 41 and 42 may be connected by the connection part 44. The non-contact region 43 may be provided between the contact regions 41 and 42. Two or three or more of the non-contact regions 43 may be separated by the connection part 44. The contact regions 41 and 42 may be disposed to surround at least three sides of the non-contact region 43, and an area of the non-contact region 43 may be smaller than an area of the contact regions 41 and 42.

The minimum width of the non-contact region 43 may be at least 1.5 times the particle diameter, and the minimum width of the contact regions 41 and 42 may be at least twice the particle diameter. By disposing the contact regions 35 and 36 around the non-contact region 38, the printability and wettability of the solder paste can be improved upon bonding with the conductive parts 321 and 322, and high reliability can be maintained.

As shown in FIG. 18, the bonding pads 121 and 122 may comprise a contact region 45 around the non-contact region 47. The contact region 45 may block the periphery of the non-contact region 47 and may have an area larger than the area of the non-contact region 47. The minimum width of the non-contact region 47 may be at least 1.5 times the particle diameter, and the minimum width of the contact region 45 may be at least twice the particle diameter. By disposing the contact region 45 around the non-contact region 47, the printability and wettability, of the solder paste can be improved when bonded to the conductive part, and high reliability can be maintained.

In an embodiment of the invention, the first and second bonding pads 121 and 122 may be connected to the conductive part through the contact region and separated from the conductive part through the non-contact region on the opening. The contact region may be electrically connected to the frame through the conductive part. In this case, in the contact region of the first and second bonding pads 121 and 122, an area in contact with the frame may be larger than an area in contact with the conductive part. Thus, even if the contact regions of the respective bonding pads are separated from each other, it is possible to prevent deterioration of electrical characteristics and reduce the pulling force of the bonding pads. The width of the outer contact region may be at least two times the diameter of the particle, so that the outer contact region can be stably connected to the frame.

As shown in FIG. 23, as another example, the light emitting device package 100 may comprise a resin part 135. The resin part 135 may be disposed between the first frame 111 and the light emitting device 120. The resin part 135 may be disposed between the second frame 112 and the light emitting device 120. The resin part 135 may be provided on the bottom surface of the cavity C provided in the package body 110.

The resin part 135 may be disposed on a side surface of the first bonding pad 121, The resin part 135 may be disposed on a side surface of the second bonding pad 122. The resin part 135 may be disposed under the light emitting structure 123.

For example, the resin part 135 may comprise at least one of an epoxy-based material, a silicone-based material, and a hybrid material including an epoxy-based material and a silicone-based material. The resin part 135 may be a reflecting part that reflects light emitted from the light emitting device 120, and may be a resin including a reflective material such as $TiO_2$, or may comprise white silicone.

The resin part 135 may be disposed under the light emitting device 120 to perform a sealing function. The resin part 135 can improve adhesion between the light emitting device 120 and the first frame 111. The resin part 135 can improve adhesion between the light emitting device 120 and the second frame 112, The resin part 135 can prevent the tilting of the light emitting device 120.

The resin part 135 may seal the periphery of the first bonding pad 121 and the second bonding pad 122. The resin part 135 may prevent the first conductive part 321 and the second conductive part 322 from being diffused and moved toward the outer surface of the light emitting device 120 from the first opening TH1 region and the second opening TH2 region. When the first and second conductive parts 321 and 322 are diffused and moved in the outer surface direction of the light emitting device 120, the first and second conductive parts 321 and 322 are electrically connected to the active layer of the light emitting device 120 and short-circuit problems may occur. Accordingly, when the resin part 135 is disposed, the first and second conductive parts 321 and 322 and the active layer can be prevented from being short-circuited, thereby improving the reliability of the light emitting device package.

In addition, when the resin part 135 comprises a material having a reflective property such as white silicone, the resin part 135 may reflect light emitted from the light emitting device 120 toward the upper portion of the package body 110, so that the light extraction efficiency of the light emitting device package 100 can be improved.

Meanwhile, according to another example, the molding part 140 may directly, contact the first frame 111 and the second frame 112 without the resin part 135.

FIG. 24 is another example of a light emitting device package according to an embodiment of the invention.

Referring to FIG. 24, the light emitting device package may comprise a first upper recess R3 on the first frame 111 and a second upper recess R4 on the second frame 112. The first upper recess R3 may be provided on the upper surface of the first frame 111. The first upper recess R3 may be recessed in a downward direction from the upper surface of the first frame 111. The first upper recess R3 may be spaced apart from the first opening TH1. The first upper recess R3 may be provided adjacent to three sides of the first bonding pad 121 in a top view. For example, the first upper recess R3 may be disposed along at least one side or three sides of the first bonding pad 121.

The second upper recess R4 may be provided on the upper surface of the second frame 112. The second upper recess R4 may be recessed in a downward direction from the upper surface of the second frame 112. The second upper recess R4 may be spaced apart from the second opening TH2. The second upper recess R4 may be provided adjacent to three sides of the second bonding pad 122 in a top view. For example, the second upper recess R4 may be disposed along at least one side or three sides of the second bonding pad 122.

The resin part 135 may be provided in the first upper recess R3 and the second upper recess R4. The resin part 135 may be disposed on a side surface of the first bonding pad 121. The resin part 135 may be provided in the first upper recess R3 and extended to a region where the first bonding pad 121 is disposed. The resin part 135 may be disposed under the light emitting structure 123.

The distance L11 from the end of the first upper recess R3 to the adjacent end of the light emitting device 120 may be provided several hundred micrometers or less. For example, the distance L11 from the end of the first upper recess R3 to the adjacent end of the light emitting device 120 may be equal to or less than 200 micrometers.

The distance L11 from the end of the first upper recess R3 to the adjacent end of the light emitting device 120 may be determined by viscosity of a resin part 135 filled in the first upper recess R3.

The distance L11 from the end of the first upper recess R3 to the adjacent end of the light emitting device 120 may be selected as a distance that the resin part 135 filled in the first upper recess R3 may extend to a region where the first bonding pad 121 is disposed.

In addition, the resin part 135 may be disposed on a side surface of the second bonding pad 122. The resin part 135 may be provided in the second upper recess R4 and extended to a region where the second bonding pad 122 is disposed. The resin part 135 may be disposed under the light emitting structure 123.

In addition, the resin part 135 may be provided on a side surface of the light emitting structure 123. The resin part 135 is disposed on the side surface of the light emitting structure 123 to effectively prevent the first and second conductive parts 321 and 322 from moving to the side surface of the light emitting structure 123. In addition, when the resin part 135 is disposed on the side surface of the light emitting structure 123, the resin part 135 may be disposed under the active layer of the light emitting structure 123, and accordingly, the light extraction efficiency of the light emitting device 120 can be improved.

The first upper recess R3 and the second upper recess R4 may provide a sufficient space for the resin part 135 to be provided. For example, the resin part 135 may comprise at least one of an epoxy-based material, a silicone-based material, and a hybrid material including an epoxy-based material and a silicone-based material. In addition, the resin part 135 may comprise a reflective material, for example, and may comprise a white silicone including $TiO_2$ and/or Silicone.

The resin part 135 may be disposed under the light emitting device 120 to perform a sealing function. In addition, the resin part 135 may improve the adhesion between the light emitting device 120 and the first frame 111. The resin part 135 may improve adhesion between the light emitting device 120 and the second frame 112.

The resin part 135 may seal the periphery of the first bonding pad 121 and the second bonding pad 122. The resin part 135 may prevent the first conductive part 321 and the second conductive part 322 from being diffused and moved toward the outer surface of the light emitting device 120 from the first opening TH1 region and the second opening TH2 region.

When the resin part 135 comprise a material having a reflective characteristic such as white silicone, the resin part 135 may reflect light provided from the light emitting device 120 toward the upper portion of the package body 110, so that the light extraction efficiency of the light emitting device package 100 can be improved.

Meanwhile, in the manufacturing process of the light emitting device package, after the first conductive part 321 and the second conductive part 322 are formed in the openings, and then the resin part 135 and the molding part 140 may be formed. Conversely, after the resin part 135 and the molding part 140 are formed, the first conductive part 321 and the second conductive part 322 may be formed in the opening. In addition, according to another example of the manufacturing process of the light emitting device package according to the embodiment of the invention, only the molding part 140 may be formed in the cavity of the package body 110 without forming the resin part 135.

One or a plurality of the light emitting device packages may be disposed on a circuit board, in addition, the bonding regions with the conductive parts can be dispersed by the contact and non-contact regions of the respective bonding pads of the light emitting device, and the bonding efficiency can be improved.

The light emitting device package 100 according to the embodiment described above may be mounted on a submount, a circuit board, or the like. However, when a conventional light emitting device package is mounted on a submount, a circuit board or the like, a high temperature process such as reflow can be applied. At this time, in the reflow process, a re-melting phenomenon may occur in the bonding region between the lead frame and the light emitting device provided in the light emitting device package, and thereby the stability of the electrical connection and physical connection between the light emitting device and the frame may be weakened. However, according to the light emitting device package and the method of manufacturing the light emitting device package according to the embodiment, the first bonding pad and the second bonding pad of the light emitting device may receive driving power through the conductive part disposed in the opening. And, the melting point of the conductive part disposed in the opening may be selected to have a higher value than the melting point of the common bonding material.

Therefore, even when the light emitting device package 100 according to the embodiment is bonded to the main substrate and the like through a reflow process, re-melting phenomenon does not occur, so that electrical connection and physical bonding force are not deteriorated.

In addition, according to the light emitting device package 100 of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

Accordingly, the selection range for the material constituting the body 113 can be widened. According to the embodiment, the body 113 may be provided using not only expensive materials such as ceramics but also relatively inexpensive resin materials. For example, the body 113 may comprise at least one material selected from a group including Polyphthalamide (PPA) resin, PolyCyclohexylenedimethylene Terephthalate (PCT) resin, Epoxy Molding Compound (EMC) resin and Silicone Molding Compound (SMC).

<Light Source Module>

Referring to FIG. 25, one or a plurality of light emitting device packages 100 may be disposed on a circuit board 310 in the light source module 300 according to the embodiment.

The circuit board 310 may comprise a first pad 311, a second pad 312, and a board 313. The board 313 may be provided with a power supply circuit for controlling the driving of the light emitting device 120.

The first bonding pad 121 may be connected to the first pad 311 of the circuit board 310 through the first conductive part 321 of the first opening TH1 of the light emitting device package 100 so that power can be connected to the first bonding pad 121, and the second bonding pad 122 may be connected to the second pad 312 of the circuit board 310 through the second conductive part 322 of the second opening TH2 so that power can be connected to the second bonding pad 122. The board 313 of the circuit board 310 may be a flexible or non-flexible member.

The package body 110 may be disposed on the circuit board 310. The first pad 311 and the first bonding pad 121 may be electrically connected to each other. The second pad 312 and the second bonding pad 122 may be electrically connected to each other. The first pad 311 and the second pad 312 may comprise a conductive material. For example, the first pad 311 and the second pad 312 may comprise at least one material selected from a group including Ti, Cu, Ni, Au, Cr, Ta, Pt, Sn, Ag, P, Fe, Sn, Zn, Al, or an alloy thereof. The first pad 311 and the second pad 312 may be provided as a single layer or a multilayer.

When the first frame 111 and the second frame 112 are formed as an insulating frame, power can be supplied through the first and second conductive parts 321 and 322. When the first frame 111 and the second frame 112 are formed as a conductive frame, power may be supplied through the first and second conductive parts 321 and 322, and the first and second frames 111 and 112.

FIG. 26 is another example of a light source module having a light emitting device package according to an embodiment.

Referring to FIG. 26, one or more light emitting device packages 100 may be disposed on a circuit board 410. The circuit board 410 may comprise a first pad 411, a second pad 412, and a board 413, The board 413 may be provided with a power supply circuit for controlling the driving of the light emitting device 120.

The package body 110 may be disposed on the circuit board 410. The first pad 411 and the first bonding pad 121 may be electrically connected to each other. The second pad 412 and the second bonding pad 122 may be electrically connected to each other.

According to the embodiment, the first pad 411 of the circuit board 410 and the first conductive part 321 may be electrically connected to each other. In addition, the second pad 412 of the circuit board 410 and the second conductive part 322 may be electrically connected to each other. The first pad 411 may be electrically connected to the first frame 111. The second pad 412 may be electrically connected to the second frame 112. According to the embodiment, a separate bonding layer may be additionally provided between the first pad 411 and the first frame 111. Further, a separate bonding layer may be additionally provided between the second pad 412 and the second frame 112. According to the light emitting device package of the embodiment, the first bonding pad and the second bonding pad of the light emitting device may receive driving power through a conductive part disposed in the opening. And, the melting point of the conductive part disposed in the opening may be selected to have a higher value than the melting point of the common bonding material. The light emitting device package according to the embodiment has an advantage that the electrical connection and the physical bonding force are not deteriorated because the re-melting phenomenon does not occur even when the light emitting device package according to the embodiment is bonded to the main substrate through a reflow process. According to the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

The light emitting device package 100 according to the embodiment may be mounted on a submount, a circuit board, or the like. However, when a conventional light emitting device package is mounted on a submount, a circuit board or the like, a high temperature process such as reflow can be applied. At this time, in the reflow process, re-melting phenomenon occurs in the bonding region between the frame and the light emitting device provided in the light emitting device package, so that the stability of electrical connection and physical coupling may be weakened, thereby a location of the light emitting device may be changed, and the optical and electrical characteristics and reliability of the light emitting device package may be deteriorated. However, according to the light emitting device package of the embodiment, the first bonding pad and the second bonding pad of the light emitting device according to the embodiment can receive the driving power through the conductive parts disposed in the openings. And, the melting point of the conductive parts disposed in the openings may be selected to have a higher value than the melting point of the common bonding material. Therefore, even when the light emitting device package 100 according to the embodiment is bonded to a main board or the like through a reflow process, re-melting phenomenon does not occur, so that electrical connection and physical bonding force are not deteriorated.

Next, FIGS. 27 and 28 are side sectional views of a light emitting device package according to an embodiment.

Referring to FIGS. 27 and 28, in describing the embodiment, description overlapping with those described above may be omitted.

As shown in FIGS. 27 and 28, the light emitting device package may comprise a body 110B and a light emitting device 120.

The body 1101 may provide a concave cavity C in an upper portion. The cavity C may reflect the incident light upward. The cavity C may have an inclined side surface with respect to a bottom surface. The body 110B may be formed of at least one material selected from a group including Polyphthalamide (PPA), polychlorotriphenyl (PCT), liquid crystal polymer (LCP), polyimide: 9T (PA9T), silicone, epoxy molding compound (EMC), silicone molding compound (SMC), ceramics, photo sensitive glass (PSG), sapphire ($Al_2O_3$), and the like. In addition, the body 110B may comprise a high refractive filler such as $TiO_2$, $SiO_2$, and the like.

According to the embodiment, the light emitting device 120 may comprise a first bonding pad 121, a second bonding pad 122, and a light emitting structure 123 having a semiconductor layer. The configuration of the light emitting device 120 will be referred to the description of the embodiment disclosed above. As shown in FIG. 29, the first bonding pads 1172 may be provided with different sizes of contact regions according to regions. FIG. 29 shows an example in which the shapes and sizes of the first and second bonding pads 1172 and 1171 are modified to change the sizes of the contact region and the non-contact region.

The light emitting device 120 may be disposed on the body 110. The first bonding pad 121 may be disposed on the lower surface of the light emitting device 120. The second bonding pad 122 may be disposed on the lower surface of the light emitting device 120.

The body 110B may comprise a plurality of openings, for example, a first opening TH1 and a second opening TH2. The first opening TH1 may be disposed under the first bonding pad 121 of the light emitting device 120 and may pass through a lower portion of the body 110B. The first opening TH1 may be provided to overlap with the first bonding pad 121 of the light emitting device 120. The second opening TH2 may be disposed under the second bonding pad 122 of the light emitting device 120 and may be provided through the lower portion of the body 110B. The second opening TH2 may be provided to overlap with the second bonding pad 122 of the light emitting device 120.

At least one or both of the first bonding pad 121 and the second bonding pad 122 may comprise the contact region and the non-contact region described above, and a detailed description will be referred to the description disclosed above. For example, as shown in FIG. 28, the first bonding pad 121 may comprise first contact regions 21 and 22 and a first non-contact region 33.

The body 110B may comprise a recess R. The recess R may be recessed from the bottom surface of the cavity C to the lower surface of the body 110B. The recess R may be disposed under the light emitting device 120 and may overlap with a region between the first and second bonding pads 121 and 122.

The adhesive 130 may be disposed in the recess R. The adhesive 130 may be disposed between the light emitting device 120 and the bottom surface of the cavity C. The adhesive 130 may be disposed between the first bonding pad 121 and the second bonding pad 122. For example, the adhesive 130 may be disposed in contact with a side surface of the first bonding pad 121 and a side surface of the second bonding pad 122. The adhesive 130 may provide a stable fixing force between the light emitting device 120 and the body 110B. For example, the adhesive 130 may be disposed in direct contact with the bottom surface of the cavity C of the body 110. In addition, the adhesive 130 may be disposed in direct contact with the lower surface of the light emitting device 120. For example, the adhesive 130 may comprise at least one of an epoxy-based material, a silicone-based material, and a hybrid material including an epoxy-based material and a silicone-based material.

The adhesive 130 may provide a light diffusion function between the light emitting device and the body when light is emitted through the lower surface of the light emitting device 120, When the light is emitted from the light emitting device 120 to the lower surface of the light emitting device 120, the adhesive 130 may provide a light diffusion function. Accordingly, the light extraction efficiency of the light emitting device package 300 can be improved.

According to the embodiment, the depth T1 of the recess R may be smaller than the depth T2 of the openings TH1 and TH2. The depth T1 of the recess R may be determined in consideration of the adhesive force of the adhesive 130. In addition, as shown in FIG. 28, the depth T1 of the recess R may be determined in consideration of the stable strength of the mount part 111, or may be determined so that no crack is generated in the light emitting device package 300 due to heat emitted from the light emitting device 120.

The recess R may provide a suitable space in which a kind of underfill process may be performed under the light emitting device 120. By way of example, the depth T1 of the recess R may be provided of 40 micrometers or more, for example, 40 micrometers to 60 micrometers.

A depth of the openings TH1 and TH2 may be provided of 180 micrometers or more, for example, a range of 180 micrometers to 220 micrometers. By way of example, the depth difference T2-T1 may be selected to be at least 100 micrometers or more. According to the embodiment, the ratio T2/T1 of the depth T1 to the depth T2 may be provided in a range of 2 to 10. By way of example, if the depth of T2 may be provided of 200 micrometers, the depth of T1 may be provided of 20 micrometers to 100 micrometers.

The length of the recess R in the Y direction may be provided greater than the length of the first and second openings TH1 and TH2. The Y direction length of the first and second openings TH1 and TH2 may be provided smaller than the length of the light emitting device 120 in the short axis direction. In addition, the Y direction length of the recess R may be provided larger or smaller than the length of the light emitting device 120 in the short axis direction. A top view shape of the recess R may be elliptical shape, polygonal shape, or circular shape. One or more recesses R may be disposed under the lower portion of the light emitting device 120. The second direction Y length of the recess R may be longer or shorter than the length of the light emitting device 120. One or more recesses R may be disposed under the light emitting device 120 along the second direction.

The conductive parts 411 and 412 may be disposed in the first and second openings TH1 and TH2. The conductive parts 411 and 412 may be conductive materials and connected in contact with the first and second bonding pads 121 and 122. The conductive parts 411 and 412 may comprise one material selected from a group including Ag, Au, Pt, Sn, Cu, Zn, In, Bi, Ti or an alloy thereof. The conductive parts 411 and 412 may be solder pastes, and may be formed by mixing powders or particles and flux. The solder paste may comprise Sn—Ag—Cu, and the weight percentage of each metal may be varied. For example, the first conductive part 411 and the second conductive part 412 may be formed using a conductive paste. The conductive paste may comprise a solder paste, a silver paste, or the like, and may be a multi-layer composed of different materials or a multi-layer or a single layer composed of an alloy.

The conductive parts 411 and 412 may be in contact with the contact regions of the bonding pads 121 and 122 on the openings TH1 and TH2 and may be in non-contact with the non-contact region. This configuration will be referred to the description of the first embodiment. Since the conductive parts 411 and 412 have non-contact regions with the bonding pads 121 and 122 on the openings TH1 and TH2, damage to the bonding pads 121 and 122 by the conductive parts 411 and 412 can be prevented. That is, the conductive parts 411 and 412 can disperse the pulling force of the bonding pads 121 and 122, thereby preventing damage to the bonding pads.

The package of FIGS. 28 and 29 described above may comprise the resin part described above, or may comprise the resin part and the upper recess described above.

<Light Emitting Device>

The light emitting device package according to the embodiment may be provided, for example, with a flip chip light emitting device. For example, the flip chip light emitting device may be a transmissive flip chip device that is emitting light in six-sided directions, or a reflective flip chip light emitting device that is emitting light in five-sided directions. The reflective flip chip light emitting device in which light is emitted in the five-sided direction may have a structure in which an insulating layer is disposed in a direction close to the body. For example, the reflective flip chip light emitting device may comprise an insulating layer including a Distributed Bragg Reflector (DBR) or an Omni Directional Reflector (ODR) and/or a conductive reflective layer (e.g., Ag, Al, Ni, Au, and the like). In addition, the flip-chip light emitting device, that is emitting light in six-sided directions, may comprise a first bonding pad electrically connected to the first conductivity type semiconductor layer and a second bonding pad electrically connected to the second conductivity type semiconductor layer, and may be provided as a horizontal light emitting device in which light is emitted between the first bonding pad and the second bonding pad.

In addition, the flip-chip light emitting device in which the light is emitted in the six-sided direction may comprise both a reflective part in which an insulating layer is disposed between the first and second bonding pads and a transmissive region emitting a light, and may be provided as a transmissive flip-chip light emitting device. Here, the transmissive flip-chip light emitting device means a device that emits light to six surfaces of an upper surface, four side surfaces, and a lower surface. In addition, the reflective flip chip light emitting device means a device that emits light to five surfaces of the upper surface and the four side surfaces.

Next, an example of a flip chip light emitting device applied to a light emitting device package according to an embodiment of the invention will be described with reference to the accompanying drawings.

Referring to FIGS. 29 to 31, a light emitting device according to an embodiment of the invention will be described. FIG. 29 is a plan view of a light emitting device according to an embodiment of the invention, FIG. 30 is a side sectional view of a region passing through a first electrode and a first bonding pad in the light emitting device of FIG. 29, FIG. 31 is a side sectional view of a region passing through a second electrode and a second bonding pad in the light emitting device of FIG. 29. In FIG. 29, even though a first electrode 1141 and a second electrode 1142 are disposed under a first bonding pad 1171 and a second bonding pad 1172, but the first electrode 1141 electrically connected to the first bonding pad 1171 and the second electrode 1142 electrically connected to the second bonding pad 1172 are shown to be visible.

As shown in FIGS. 30 and 31, the light emitting device 1000 according to the embodiment may comprise a light emitting structure 1110 disposed on the substrate 1105. The substrate 1105 may be selected from a group including a sapphire substrate ($Al_2O_3$), SiC, GaAs, GaN, ZnO, Si, GaP, InP and Ge. For example, the substrate 1105 may have a concave-convex pattern on its upper surface, and may be provided as a patterned sapphire substrate (PSS).

The light emitting structure 1110 may comprise a first conductivity type semiconductor layer 1111, an active layer 1112, and a second conductivity type semiconductor layer 1113. The active layer 1112 may be disposed between the first conductivity type semiconductor layer 1111 and the second conductivity type semiconductor layer 1113. For example, the active layer 1112 may be disposed on the first conductivity type semiconductor layer 1111, and the second conductivity type semiconductor layer 1113 may be disposed on the active layer 1112. The substrate 1105 and the light emitting structure 1110 may be defined as a light emitting part.

According to the embodiment, the first conductivity type semiconductor layer 1111 may be provided as an n-type semiconductor layer, and the second conductivity type semiconductor layer 1113 may be provided as a p-type semiconductor layer. According to another embodiment, the first conductivity type semiconductor layer 1111 may be provided as a p-type semiconductor layer, and the second conductivity type semiconductor layer 1113 may be provided as an n-type semiconductor layer. The light emitting structure 1110 may comprise a plurality of recesses Ra passing through the second conductivity type semiconductor layer 1113 and the active layer 1112 to expose a portion of the first conductivity type semiconductor layer 1111.

The light emitting device 1000 according to the embodiment may comprise a light transmitting electrode layer 1130, The light transmitting electrode layer 1130 may be disposed on the light emitting structure 1110. As shown in FIG. 31, the light transmitting electrode layer 1130 may be disposed on the second conductivity type semiconductor layer 113. The light transmitting electrode layer 1130 may be disposed on the first insulating layer 1125 when the first insulating layer 1125 is disposed on a partial region of the second conductivity type semiconductor layer 113 as shown in FIG. 30. The light transmitting electrode layer 1130 can improve current diffusion and increase light output. For example, the light transmitting electrode layer 1130 may comprise at least one selected from a group including a metal, a metal oxide, and a metal nitride. The light transmitting electrode layer 1130 may comprise a light-transmitting material.

The light transmitting electrode layer 1130 may comprise at least one selected from a group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

As shown in FIGS. 29 to 31, the light emitting device 1000 according to the embodiment may comprise insulating layers 1125, 1135, and 1170 on the light emitting structure 1110. The insulating layers 1125, 1135, and 1170 may comprise a first insulating layer 1125 and a second insulating layer 1135. The first insulating layer 1125 may be disposed on the light emitting structure 1110 and/or on the light transmitting electrode layer 1130. The first insulating layer 1125 may comprise a plurality of first openings h1. Each of the first openings h1 may be overlapped with each of the recesses Ra in third directions. The second insulating layer 1135 may be disposed on the light transmitting electrode layer 1130.

At least one of the first insulating layer 1125, the second insulating layer 1135, and the third insulating layer 1170 may be formed of at least one material selected from a group including, for example, $Si_xO_y$, $SiO_xN_y$, $Si_xN_y$, and $Al_xO_y$. Light emitted between the first insulating layer 1125 and the second insulating layer 1135 may be incident on the adhesive disposed in a recess R of the body as shown in FIG. 3. The light emitted in the lower direction of the light emitting device may be light-diffused by the adhesive, 130 in FIG. 3, and the light extraction efficiency can be improved. An additional insulating layer may be further disposed between the first and second insulating layers 1125 and 1135 to reflect the incident light in the adhesive direction. At least one of the first and second insulating layers 1125 and 1135 may be provided of a Distributed Bragg Reflector (DBR) layer or an Omni Directional Reflector (ODR) layer. In addition, any one of the first and second insulating layers may be provided by stacking a DBR layer and an ODR layer.

When the first electrode 1141 and the second electrode 1142 have different polarities, they may be arranged in different numbers of electrodes. For example, when the first electrode 1141 is an n-electrode and the second electrode 1142 is a p-electrode, the number of the second electrodes 1142 may be larger than that of the first electrode 1141. When the electrical conductivity and/or resistance of the second conductivity type semiconductor layer 1113 and the first conductivity type semiconductor layer 1111 are different from each other, electrons and holes injected into the light emitting structure 1110 by the first electrode 1141 and the second electrode 1142 may be balanced and the optical characteristics of the light emitting device can be improved.

The first electrode 1141 and the second electrode 1142 may have a single-layer structure or a multi-layer structure. For example, the first electrode 1141 and the second electrode 1142 may be ohmic electrodes. For example, the first electrode 1141 and the second electrode 1142 may be formed of one selected from a group including ZnO, IrOx, RuOx, NiO, RuOx/ITO, Ni/IrO/Au, Ni/IrOx/Au/ITO, Ag, Ni, Cr, Ti, Al, Rh, Pd, Ir, Ru, Mg, Zn, Pt, Au, and Hf, or an alloy, of two or more of them.

As shown in FIG. 31, the second insulating layer 1135 may be disposed on the first insulating layer 1125 and may comprise a plurality of second openings h2 which are overlapped with the plurality of first openings h1 in the third direction. The second insulating layer 1135 may comprise a third opening h3 spaced apart from the second opening h2. As shown in FIGS. 29 and 30, the first electrode 1141 may be disposed through the second opening 112 of the second insulating layer 1135 and the first opening h1 of the first insulating layer 1125, and the first electrode 1141 may be connected with the first conductivity type semiconductor layer 1111 in the recess Ra.

The first electrodes 1141 disposed in the plurality of first openings h1 may be connected to each other by a first branch electrode 1143. The first electrode 1141 is in contact with the first conductivity type semiconductor layer 1111 in the different regions and is connected to each other by the first branch electrode 1143, Accordingly, the light emitting structure 11110 can be supplied with the current diffused through the entire region. A plurality of first branch electrodes 1143 may extend from the region of the first bonding pad 1171 toward the second bonding pad 1172. Also, the first branch electrodes 1143 may have a long length in the first direction, and one or more than two first branch electrodes may be disposed in the second direction. The first branch electrode 1143 may comprise a concave structure Rb that overlaps with the recess Ra.

The first electrode 1141 and the first branch electrode 1143 may be electrically connected to the first conductivity type semiconductor layer 1111. At least one or both of the first electrode 1141 and the first branch electrode 1143 may be connected to the first bonding pad 1171. The first bonding pad 1171 may be disposed through a fourth opening h4 of the third insulating layer 1170, The first bonding pad 1171 may have a plurality of contact regions C21 and C22 through the fourth opening h4 and may be connected to the first branch electrode 1143 and the first electrode 1141. When the plurality of contact regions C21 and C22 are spaced apart from each other, a connection part 1124 may connect the plurality of contact regions C21 and C22 to each other. The first bonding pad 117 may be spaced a predetermined distance W from the chip edge to reduce electrical or physical interference transmitted from the chip edge.

As shown in FIGS. 29 and 31, the second insulating layer 1135 may comprise a plurality of third openings h3. The second electrode 1142 may be connected to the light transmitting electrode layer 1130 and the second conductivity type semiconductor layer 1113 through the third opening h3 of the second insulating layer 1135. The second electrodes 1142 connected through the plurality of third openings h3 may be connected to each other by a second branch electrode 1144. The second bonding pad 1172 has a plurality of contact regions C31, C32 and C33 through the fifth opening h5 and may be connected to the second branch electrode 1144 and/or the second electrode 1142, The plurality of contact regions C31, C32, and C33 may be connected through a connection part. A plurality of second branch electrodes 1142 may extend from the second bonding pad 1172 toward the first bonding pad 1171. The second electrode 1142 and the second branch electrode 1144 may be electrically connected to the second conductivity type semiconductor layer 1113.

The first and second branch electrodes 1142 and 1144 may be alternately arranged in the second direction. The first and second branch electrodes 1142 and 1144 may have a long length in the first direction and may be arranged in the second direction. Any one of the first and second branch electrodes 1142 and 1144 may be arranged in a larger number than the other. For example, the number of the second branch electrodes 1144 may be larger than that of the first branch electrodes 1142.

The third insulating layer 1170 may be disposed on the first electrode 1141, the first branch electrode 1143, the second electrode 1142, and the second branch electrode 1144, and may protect surfaces of the above electrodes. The third insulating layer 1170 may comprise fourth and fifth openings h4 and h5 to open the first and second bonding pads 1171 and 1172.

As shown in FIG. 29, the first branch electrodes 1142 may have one or more line shapes and extend toward the second bonding pad 1172, One or more first electrodes 1141 may be disposed under the first branch electrodes 1142. The second branch electrode 1144 may have a line shape between or outside of the first, branch electrodes 1142 and may extend toward the first bonding pad 1171. One or more second electrodes 1142 may be disposed under the second branch electrodes 1144. The line-shaped electrode may be a branch electrode or an arm electrode. The first and second branch electrodes 1142 and 1144 may be disposed to be offset from each other and extend in a direction facing each other.

The first electrode 1141 and the second bonding pad 1172 may be disposed to be offset from each other. When viewed from a first direction perpendicular to the upper surface of the second bonding pad 1172, the first electrode 1141 and the second bonding pad 1172 may be disposed not to be overlapped with each other in the first direction.

In addition, the second electrode 1142 and the first bonding pad 1171 may be disposed to be offset from each other. When viewed from a first direction perpendicular to the upper surface of the first bonding pad 1171, the second electrode 1142 and the first bonding pad 1171 may be disposed not to be overlapped with each other in the first direction.

The first bonding pad 1171 may comprise a first concave portion OP1. One or more of the first concave portions OP1 may be disposed. The first concave portion OP1 may be disposed in a region where at least one of the plurality of second branch electrodes 1144 extends toward the first bonding pad 1171 and may be disposed at a region between the contact regions C21 and C22 of the first bonding pad 1171. The second branch electrode 1144 may be disposed on the first concave portion OP1. A plurality of second electrodes 1142 may be disposed in a region overlapping the second branch electrode 1144 in the vertical direction in the first concave portion OP1. Since the second electrode 1142 and the second branch electrode 1144 are disposed in the peripheral region of the first bonding pad 1171, the current in the light emitting structure 1110 can be diffused. The first concave portion OP1 may be an open region or a non-contact region of the first bonding pad 1171.

The second bonding pad 1172 may comprise a second concave portion OP2. One or more of the second concave portions OP2 may be disposed. The number of the second concave portion OP2 may be the same as or different from the number of the first concave portion OH. The first and second concave portions OP1 and OP2 may be disposed in regions facing each other or not facing each other. The second concave portion OP2 is disposed in a region where at least one of the plurality of first branch electrodes 1143 extends toward the second bonding pad 1172 and may be disposed at region between the contact regions C31, C32, and C33 of the second bonding pad 1172. The first branch electrode 1143 may be disposed in the second concave portion OP2. A plurality of first electrodes 1141 may be disposed in a region overlapping with the first branch electrodes 1143 in the vertical direction in the second concave portion OP2. Since the first electrode 1141 and the first branch electrode 1143 are disposed in the peripheral region of the second bonding pad 1172, the current in the light emitting structure can be diffused. The second concave portion OP2 may be an open region or a non-contact region of the second bonding pad 1172. The first concave portion OP1 and the second concave portion OP2 may be arranged so as not to overlap in the first direction.

The first concave portion OP1 may be a non-contact region extending from the region adjacent to the second bonding pad 1172 to the inside of the first bonding pad 1711. The second concave portion OP2 may be a non-contact region extending from the region adjacent to the first bonding pad 1171 to the inside of the second bonding pad 1172.

The number of the second concave portion OP2 may be larger than the number of the first concave portion OP1, the number of the second branch electrode 1144 may be larger than the number of the second concave portion OP2, and the number of the first branch electrodes 1143 may be equal to the number of the second concave portions OP2. The size of the second bonding pad 1172 may be larger than the size of the first bonding pad 1171.

According to the embodiment, since power can be supplied through a plurality of contact regions, there is an advantage that a current dispersion effect can be generated according to an increase of the contact area and dispersion of branch electrodes, and the operation voltage can be reduced.

As shown in FIG. 30, the first insulating layer 1125 and the second insulating layer 1135 reflect light emitted from the active layer 1112 of the light emitting structure 1110, and it is possible to minimize the occurrence of light absorption at the first and second electrodes and improve the luminous intensity Po. For example, the first insulating layer and the second insulating layer may have a DBR structure. The DBR structure may be arranged in a multi-layer structure including different materials such as $TiO_2$, $SiO_2$, $Ta_2O_5$, and $HfO_2$.

In addition, according to another embodiment, it is not limited thereto, the first insulating layer 1125 and the second insulating layer 1135 may be freely selected so as to adjust the reflectivity of the light emitted from the active layer 1112 in accordance with the wavelength of light emitted from the active layer 1112. According to the embodiment, the first insulating layer 1125 and the second insulating layer 1135 may be provided as an ODR layer. According to another embodiment, the first insulating layer 1125 and the second insulating layer 1135 may be provided as a kind of hybrid type in which a DBR layer and an ODR layer are stacked.

When the light emitting device according to the embodiment is mounted by a flip chip bonding method and is implemented as a light emitting device package, the light provided from the light emitting structure 1110 may be emitted through the substrate 1105. Light emitted from the light emitting structure 1110 may be reflected by the first insulating layer 1125 and the second insulating layer 1135, and may be emitted toward the light transmitting substrate 1105. Light emitted from the light emitting structure 1110 may also be emitted in a lateral direction of the light emitting structure 1110. Also, the light emitted from the light emitting structure 1110 may be transmitted to the outside through a region where the first bonding pad 1171 and the second bonding pad 1172 are not provided, among the surfaces on which the first bonding pad 1171 and the second bonding pad 1172 are disposed. The light emitting device 1000 can emit light in six-sided directions, and the light intensity can be remarkably improved.

According to the light emitting device of the embodiment, when viewed from the upper direction of the light emitting device 1000, the sum of the area of the first bonding pad 1171 and the area of the second bonding pad 1172 may be provided equal to or smaller than 60% of the entire area of the upper surface of the light emitting device 1000 on which the first bonding pad 1171 and the second bonding pad 1172 are disposed.

For example, the entire area of the upper surface of the light emitting device 1000 may correspond to an area defined by a lateral length and a longitudinal length of the lower surface of the first conductivity type semiconductor layer 1111 of the light emitting structure 1110. The entire area of the upper surface of the light emitting device 1000 may correspond to the area of the upper surface or the lower surface of the substrate 1105.

Since the sum of the areas of the first bonding pad 1171 and the second bonding pad 1172 is provided as equal to or smaller than 60% of the entire area of the light emitting device 1000, the amount of light emitted to the surface on which the first bonding pad 1171 and the second bonding pad 1172 are disposed can be increased. Accordingly, according to the embodiment, since the amount of light emitted toward the six-sided surfaces of the light emitting device 1000 is increased, the light extraction efficiency can be improved and the light intensity Po can be increased. The first bonding pad 1171 and the second bonding pad 1172 may have the same area ratio, or an area of the first bonding pad 1171 may be 1% or less smaller than an area of the second bonding pad 1172, for example, the area of the first bonding pad 1171 may be as smaller as in a range of 1% to 40% than an area of the second bonding pad 1172. The first bonding pad 1172 may be spaced a predetermined distance W from the chip edge.

In addition, when viewed from the upper direction of the light emitting device 1000, the sum of the area of the first bonding pad 1171 and the area of the second bonding pad 1172 may be provided equal to or greater than 30% of the entire area of the light emitting device 1000. By thus providing the sum of the areas of the first bonding pad 1171 and the second bonding pad 1172 equal to or greater than 30% of the entire area of the light emitting device 1000, stable mounting can be performed through the first bonding pad 1171 and the second bonding pad 1172, and the electrical characteristics of the light emitting device 1000 can be secured.

In the light emitting device 1000 according to the embodiment, the sum of the areas of the first bonding pad 1171 and the second bonding pad 1172 may be selected in a range of 30% or more to 60% or less of the entire areas of the light emitting device 1000 in order to secure light extraction efficiency and stability of bonding. That is, when the sum of the areas of the first bonding pad 1171 and the second bonding pad 1172 is in a range of 30% to 100% of the entire area of the light emitting device 1000, the electrical characteristics can be improved, and the bonding force of the light emitting device can be stable.

In addition, when the sum of the areas of the first bonding pad 1171 and the second bonding pad 1172 is in a range of more than 0% to 60% or less of the entire area of the light emitting device 1000, the amount of light emitted to the surface on which the first bonding pad 1171 and the second bonding pad 1172 are disposed is increased to improve the light extraction efficiency of the light emitting device 1000 and increase the light intensity Po.

When the area of the third insulating layer 1170 is 10% or more of the entire upper surface of the light emitting device 1000, the package body disposed under the light emitting device may be prevented from discolored or occurring of cracking, when it is 25% or less, it is advantageous to secure the light extraction efficiency to emit light to the six-sided surfaces of the light emitting device.

According to the embodiment, by the first insulating layer 1125 and the second insulating layer 1135, the light emitted from the light emitting structure 1110 can be reflected without being incident to the first bonding pad 1171 and the second bonding pad 1172 and the second insulating layer 1135. Accordingly, according to the embodiment, being incident on the first bonding pad 1171 and the second bonding pad 1172 and a loss of the light that is generated and emitted from the light emitting structure 1110 can be minimized.

According to the light emitting device 1000 of the embodiment, since the third insulating layer 1170 is disposed between the first bonding pad 1171 and the second bonding pad 1172, the amount of light emitted between the first bonding pad 1171 and the second bonding pad 1172 can be controlled.

As described above, the light emitting device 1000 according to the embodiment may be mounted in a flip chip bonding manner, for example, and provided as a light emitting device package. At this time, when the package body on which the light emitting device 1000 is mounted is provided by resin or the like, the package body may be discolored or cracked under the light emitting device 1000 due to strong short-wavelength light emitted from the light emitting device 1000.

When the first and second insulating layers 1125 and 1135, and the light transmitting electrode layer 1130 are in contact with each other, the coupling force or the adhesion between the first and second insulating layers 1125 and 1135, and the light transmitting electrode layer 1130 may be weakened. For example, when the insulating layer and the metal layer are coupled, the bonding force or adhesion between the materials may be weakened.

For example, if the bonding force or adhesive force between the insulating layers 1125 and 1135, and the ohmic contact layer is weak, peeling may occur between the two layers. If the peeling occurs between the insulating layers 1125 and 1135, and the ohmic contact layer, the characteristics of the light emitting device 1000 may deteriorate and the reliability of the light emitting device 1000 may not be secured.

In the light emitting device package according to the embodiment, at least one or all of the electrodes of the light emitting device according to the embodiment may correspond to the opening of the frame or the body, and at least one of the electrodes corresponding to the opening may correspond to the opening in a region that is not in contact with the conductive part and in a region contacting with the conductive part. Accordingly, the electrode of the light emitting device may receive driving power through the frame and/or the conductive part. Since an area of the contact region between the conductive part and the electrode is provided smaller than an area of the upper surface of the opening, the adhesive force between the conductive part and the electrode may be alleviated, so that the interface separation between the electrode and the semiconductor layer may be prevented.

The melting point of the conductive part disposed in the opening may be selected to have a higher value than the melting point of the common bonding material. Therefore, the light emitting device package according to the embodiment has the advantage that the electrical connection and the physical bonding force are not deteriorated because the re-melting phenomenon does not occur even when the light emitting device package according to the embodiment is bonded to the main board or the like through a reflow process.

According to the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

According to the embodiments of the invention, it is possible to reduce the damage to the bonding pads by providing a contact region and a non-contact region in the bonding pads of the light emitting device at regions corresponding to the openings of the package body. The light extraction efficiency and electrical characteristics of the light emitting device package can be improved. The process efficiency of the light emitting device package is improved and a new package structure is presented, so that the manufacturing cost can be reduced and the manufacturing yield can be improved. The package according to the embodiment of the invention can prevent the reflector from being discolored by providing the body having high reflectance, thereby improving the reliability of the semiconductor device package. According to the light emitting device or the light emitting device package of the embodiment of the invention, stable bonding can be performed by providing a small pressure at a low temperature, and there is an advantage that in the process of re-bonding to a substrate, re-melting phenomenon in a bonding region of the light emitting device or semiconductor device can be prevented from occurring. The reliability of the semiconductor device package or the light emitting device package according to the embodiment of the invention can be improved.

Next, referring to FIGS. 32 and 33, another example of a semiconductor device which can be applied to an embodiment of the invention will be described. FIG. 32 is a plan view illustrating a semiconductor device according to an embodiment of the invention, and FIG. 33 is a cross-sectional view taken along line A-A of the semiconductor device shown in FIG. 32.

Meanwhile, in order to facilitate understanding, in FIG. 32, even though a first electrode 3141 and a second electrode 3142 are disposed under a first bonding pad 3171 and a second bonding pad 3172, but the first electrode 3141 electrically connected to the first bonding pad 3171 and the second electrode 3142 electrically connected to the second bonding pad 3172 are shown to be visible.

As shown in FIGS. 32 and 33, a semiconductor device 3100 according to an embodiment may comprise a light emitting structure 3110 disposed on a substrate 3105.

The substrate 3105 may be selected from a group including a sapphire substrate ($Al_2O_3$), SiC, GaAs, GaN, ZnO, Si, GaP, InP, Ge. By way of example, the substrate 3105 may be provided as a Patterned Sapphire Substrate (PSS) having a concave-convex pattern on the upper surface.

The light emitting structure 3110 may comprise a first conductivity type semiconductor layer 3111, an active layer 3112, and a second conductivity type semiconductor layer 3113. The active layer 3112 may be disposed between the first conductivity type semiconductor layer 3111 and the second conductivity type semiconductor layer 3113. By way of example, the active layer 3112 may be disposed on the first conductivity type semiconductor layer 3111, and the second conductivity type semiconductor layer 3113 may be disposed on the active layer 3112.

According to the embodiment, the first conductivity type semiconductor layer 3111 may be provided of an n-type semiconductor layer, and the second conductivity type semiconductor layer 3113 may be provided of a p-type semiconductor layer. Of course, according to another embodiment, the first conductivity type semiconductor layer 3111 may be provided of a p-type semiconductor layer, and the second conductivity type semiconductor layer 3113 may be provided of an n-type semiconductor layer.

Hereinafter, for convenience of explanation, a case where the first conductivity type semiconductor layer 3111 is provided of an n-type semiconductor layer and the second conductivity type semiconductor layer 3113 is provided of a p-type semiconductor layer will be described.

While the above description has been described in a case where the first conductivity type semiconductor layer 3111 is disposed on and in contact with the substrate 3105. However, a buffer layer may be further disposed between the first conductivity type semiconductor layer 3111 and the substrate 3105. For example, the buffer layer may function to reduce the lattice constant difference between the substrate 3105 and the light emitting structure 3110 and to improve crystallinity.

As shown in FIG. 33, the semiconductor device 3100 according to the embodiment may comprise a light transmitting electrode layer 3130. The light transmitting electrode layer 3130 may increase the light output to improve the current spreading. An arrangement position and a shape of the light transmitting electrode layer 3130 will be further described with reference to a method of manufacturing a semiconductor device according to an embodiment light transmitting electrode layer 3130

As an example, the light transmitting electrode layer 3130 light transmitting electrode layer 3130 may comprise at least one selected from a group including a metal, a metal oxide, and a metal nitride. The light transmitting electrode layer 3130 may comprise a material of the light transmissive. The light transmitting electrode layer 3130 may also be referred as an ohmic contact layer.

The light transmitting electrode layer 3130 may comprise, for example, at least one selected from a group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

The semiconductor device 3100 according to the embodiment may comprise a reflective layer 3160, as shown in FIGS. 32 and 33. The reflective layer 3160 may be disposed on the light transmitting electrode layer 3130.

Since the reflective layer 3160 is disposed on the light transmitting electrode layer 3130, light emitted from the active layer 3112 can be reflected by the reflective layer 3160. Accordingly, since the light emitted from the active layer 3112 can be prevented from being absorbed and lost in a first electrode 3141 and a second electrode 3142, which will be described later, the light extraction efficiency of the semiconductor device can be improved.

That is, in the embodiment, the light transmitting electrode layer 3130 and the reflective layer 3160 are employed in order to secure electric characteristics. However, this is not limited thereto, according to another embodiment, it may comprise an embodiment configured to ensure both electrical and optical properties by providing only the reflective layer 3160 without disposing the light transmitting electrode layer 3130.

The reflective layer 3160 may comprise a first opening LI exposing the light transmitting electrode layer 3130. The reflective layer 3160 may comprise a plurality of the first openings h1 provided on the light transmitting electrode layer 3130.

The reflective layer 3160 may comprise a second opening h2 exposing an upper surface of the first conductivity type semiconductor layer 3111. The reflective layer 3160 may, comprise a plurality of second openings h2 exposing the upper surface of the first conductivity type semiconductor layer 3111.

According to the embodiment, a current diffusion layer 3120 may be further disposed under the first opening h1. The current diffusion layer 3120 may be disposed between the second conductivity type semiconductor layer 3113 and the light transmitting electrode layer 3130.

According to the embodiment, a distance d1 between neighboring first openings among the plurality of first openings LI may be provided as 110 micrometers to 140 micrometers. A distance d1 between neighboring second openings among the plurality of second openings 112 may be provided as 110 micrometers to 140 micrometers. A distance d2 between neighboring first and second openings h1 and h2 among the plurality of first and second openings h1 and h2 may be provided in a range of 120 micrometers to 160 micrometers.

A first electrode 3141 or a second electrode 3142 may be disposed in the plurality of first and second openings h1 and h2 to supply power to the first conductivity type semiconductor layer 3111 and the second conductivity type semiconductor layer 3113.

Thus, the arrangement interval of the first and second opening h1 and 112 may be set in consideration of the size and current spreading characteristics of the semiconductor device.

According to the embodiment, a distance between neighboring first openings h1 among the plurality of first openings h1 may be provided to be different from a distance between neighboring first and second openings h1 and h2 among the plurality of first and second openings h1 and h2.

As an example, the distance between neighboring first openings h1 among the plurality of first openings h1 may be provided smaller than the distance between neighboring first and second openings h1 and h2 among the plurality of first and second openings h1 and h2.

In addition, a distance between neighboring second openings h2 among the plurality of second openings h2 may be provided smaller than a distance between neighboring first and second openings h1 and h2 among the plurality of first and second openings h1 and h2. The distance between neighboring second openings h2 among the plurality of second openings h2 may be provided as similar to the distance between neighboring first openings h1 among the plurality of first openings h1.

Regarding above description, it will be described later with reference to an arrangement interval between the first electrode 3141 and the second electrode 3142.

In addition, an arrangement position and shapes of the reflective layer 3160, the light transmitting electrode layer 3130, and the current diffusion layer 3120 will be further described with reference to a method of manufacturing a semiconductor device according to an embodiment.

The reflective layer 3160 may be provided with an insulating reflective layer. By way of example, the reflective layer 3160 may be provided with Distributed Bragg Reflector (DBR) layer. In addition, the reflective layer 3160 may be provided with Omni Directional Reflector (ODR) layer. In addition, the reflective layer 3160 may be provided with a stacked structure of a DBR layer and an ODR layer.

The semiconductor device 3100 according to the embodiment may comprise a first electrode 3141 and a second electrode 3142 as shown in FIGS. 32 and 33.

The first electrode 3141 may be electrically connected with the first conductivity, type semiconductor layer 3111 in the second opening h2. The first electrode 3141 may be disposed on the first conductivity type semiconductor layer 3111.

For example, according to the semiconductor device 3100 of the embodiment, the first electrode 3141 may be disposed on an upper surface of the first conductivity type semiconductor in a recess that passes through the second conductivity type semiconductor layer 3113 and the active layer 3113, and is disposed on a partial portion of the first conductivity type semiconductor layer 3111

The first electrode 3141 may be electrically connected to the upper surface of the first conductivity type semiconductor layer 3111 through the second opening 112 provided in the reflective layer 3160. The second opening h2 and the recess may overlap vertically, and by way of example, as shown in FIGS. 32 and 33, the first electrode 3141 may be directly contacted to the upper surface of the first conductivity type semiconductor layer 3111 in a plurality of the recessed regions.

A side surface of the second opening h2 and a side surface of the recess may have a different angle of inclination. An angle of inclination between the side surface of the second opening h2 and a bottom surface of the recess may be different from an angle of inclination between the side surface of the recess and the bottom surface of the recess. In a case where the reflective layer 3160 is disposed in the recess, due to the step coverage characteristic in the process of arranging the reflective layer 3160, the inclination angle between the side surface of the recess and the bottom surface of the recess, and the inclination angle between the side surface of the second opening h2 and the bottom surface of the recess may be different from each other.

Therefore, a width in the horizontal direction of the reflective layer 3160 disposed on a lower portion of the recess, and a width in the horizontal direction of the reflective layer 3160 disposed on an upper portion of the recess may be different from each other. As the width in the horizontal direction of the reflective layer 3160 disposed on the lower portion of the recess and the width in the horizontal direction of the reflective layer 3160 disposed on the upper portion of the recess are different from each other, electrical reliability of the semiconductor device can be improved, and optical characteristics according to the reflective layer 3160 can be improved.

The second electrode 3142 may be electrically connected to the second conductivity type semiconductor layer 3113. The second electrode 3142 may be disposed on the second conductivity type semiconductor layer 3113. According to the embodiment, the light transmitting electrode layer 3130 may be disposed between the second electrode 3142 and the second conductivity type semiconductor layer 3113.

The second electrode 3142 may be electrically connected to the second conductivity type semiconductor layer 3113 through the first opening h1 provided in the reflective layer 3160. By way of example, as shown in FIGS. 32 and 33, the second electrode 3142 may electrically connected to the second conductivity type semiconductor layer 3113 through the light transmitting electrode layer 3130 in the plurality of regions.

As shown in FIGS. 32 and 33, the second electrode 3142 may be directly contacted to an upper surface of the light transmitting electrode layer 3130 through a plurality of the first openings h1 provided in the reflective layer 3160

According to the embodiment, as shown in FIGS. 32 and 33, the first electrode 3141 and the second electrode 3142 may have different polarities and may be disposed spaced apart from each other.

The first electrode 3141 may be provided in a shape of a plurality of lines, for example. In addition, the second electrode 3142 may be provided in a shape of a plurality of lines, for example. The first electrode 3141 and the second electrode 3142 each may comprise a plurality, of branch electrodes. The first electrode 3141 may be disposed between the plurality of neighboring second electrodes 3142. The second electrode 3142 may be disposed between the plurality of neighboring first electrodes 3141.

The first electrode 3141 may comprise a first sub-electrode 3141a and a plurality of first branch electrodes 3141a1 and 3141a2. The first sub-electrode 3141a may be disposed under the first bonding pad 3171. The plurality of first branch electrodes 3141a1 and 3141a2 may be disposed extending toward the second electrode 3142 from the first sub-electrode 3141a.

The second electrode 3142 may comprise a second sub-electrode 3142a and a plurality of second branch electrodes 3142a1, 3142a2, and 3142a3. The second sub-electrode 3142a may be disposed under the second bonding pad 3172. The plurality of second branch electrodes 3142a1, 3142a2, and 3142a3 may be disposed extending toward the first electrode 3141 from the second sub-electrode 3142a.

For example, the plurality of first branch electrodes 3141a1 and 3141a2 and the plurality of second branch electrodes 3142a1, 3142a2, and 3142a3 may be arranged to be offset from each other on the upper surface of the reflective layer 3160.

In addition, a distance between neighboring the first and second branch electrodes among the plurality of first and second branch electrodes 3141a1, 3141a2, 3142a1, 3142a2, and 3142a3 may be provided in a range of 110 micrometers to 140 micrometers. Further, each width of the plurality of first and second branch electrodes 3141a1, 3141a2, 3142a1, 3142a2, and 3142a3 may be provided in a range of few micrometers to tens of micrometers.

A number and a width of the plurality of first and second branch electrodes 3141a1, 3141a2, 3142a1, 3142a2, and 3142a3) may be set in consideration of the size and degree of current diffusion of semiconductor device.

When the number of the plurality of first and second branch electrodes 3141a1, 3141a2, 3142a1, 3142a2, and 3142a3 is large, it may be more advantageous for current spreading.

In addition, when the number of the plurality of first and second branch electrodes 3141a1, 3141a2, 3142a1, 3142a2, and 3142a3 is small, light extraction efficiency may be improved because light generated in the active layer 3112 may be reduced from being absorbed by the plurality of first and second branch electrodes 3141a1, 3141a2, 3142a1, 3142a2, and 3142a3.

According to the semiconductor device of the embodiment, by setting the number of the plurality of first and second branch electrodes 3141a1, 3141a2, 3142a1, 3142a2, and 3142a3 to 5, and to be provided in the numerical range as described above, it is possible to improve current diffusion efficiency and light extraction efficiency.

Meanwhile, in FIG. 32, as an example, the plurality of first branch electrodes 3141a1 and 3141a2 is provided with two, and the plurality of second branch electrodes 3142a1, 3142a2, and 3142a3 is provided with three. However, a number of the first and second branch electrodes may be provided more than five or provided with smaller in consideration of the size and degree of current diffusion of a semiconductor device.

According to the embodiment, the plurality of first branch electrodes 3141a1 and 3141a2 may be provided to be overlapped with the plurality of second openings h2 in a first direction perpendicular to the upper surface of the reflective layer 3160.

Further, the plurality of second branch electrodes 3142a1, 3142a2, and 3142a3 may be provided to be overlapped with the plurality of first openings h1 in the first direction.

When the first electrode 3141 and the second electrode 3142 are configured with different polarities, they may be arranged with different numbers of branch electrodes. For example, when the first electrode 3141 is an n electrode and the second electrode 3142 is a p electrode, the number of branch electrodes of the second electrode 3142 may be larger than that of the first electrode 3141.

For example, an entire area of a region where the second electrode 3142 contacts the second conductivity type semiconductor layer 3113 through the first opening h1 may be provided great than an entire area of a region where the first electrode 3141 contacts the first conductivity type semiconductor layer 3111 through the second opening h2.

When the electrical conductivity and/or resistance of the second conductivity type semiconductor layer 3113 and the first conductivity type semiconductor layer 3111 are different from each other, a balance between electrons and holes injected into the light emitting structure 3110 by the first electrode 314 and the second electrode 3142 can be matched, and thus optical properties of the semiconductor device can be improved.

The first electrode 3141 and the second electrode 3142 may be formed of a single layer or multi-layer structure. For example, the first electrode 3141 and the second electrode 3142 may be an ohmic electrode. For example, the first electrode 3141 and the second electrode 3142 may be at least one of ZnO, IrOx, RuOx, NiO, RuOx/ITO, Ni/IrOx/Au, Ni/IrOx/Au/ITO, Ag, Ni, Cr, Ti, Al, Rh, Pd, Ru, Mg, Zn, Pt, Au, Elf, Cr/Al/Ni/Au, Cr/Al/Ni/Au/Ti or an alloy of at least two materials of them.

The semiconductor device 3100 according to the embodiment may comprise a protective layer 3150, as shown in FIGS. 32 and 33.

The protective layer 3150 may be disposed on the reflective layer 3160. The protective layer 3150 may be disposed on the first electrode 3141 and the second electrode 3142.

The protective layer 3150 may comprise a plurality of third openings h3 exposing the upper surface of the second electrode 3142. Further, the protective layer 3150 may comprise a second measuring portion PB2 exposing the upper surface of the second electrode 3142. In FIGS. 32 and 33, although only one second measuring portion PB2 is illustrated, but the second measuring portion PB2 may be provided in plurality.

Further, the protective layer 3150 may comprise a plurality of fourth openings 114 exposing the upper surface of the first electrode 3141. The protective layer 3150 may comprise a first measuring portion PB1 exposing the upper surface of the first electrode 3141. In FIGS. 32 and 33, although only one first measuring portion PB1 is illustrated, but the first measuring portion PB1 may be provided in plurality.

The first measuring portion PB1 and the second measuring portion PB2 may be used to detect the electric characteristics of the semiconductor device 3100. Measuring terminals of an inspection equipment may contact the first and second electrodes 3141 and 3142 through the first measuring portion PB1 and the second measuring portion PB2 to detect electrical characteristics of the semiconductor device. Advantages of the semiconductor device comprising the first and second measurement portions PB1 and PB2 will be further described later.

As an example, the protective layer 3150 may be provided with an insulating material. For example, the protective layer 3150 may be formed of at least one material selected from a group including $Si_xO_y$, $SiO_xN_y$, $Si_xN_y$, and $Al_xO_y$.

The semiconductor device 3100 according to the embodiment, as shown in FIGS. 32 and 33, may comprise a first bonding pad 3171 and a second bonding pad 3172 disposed on the protective layer 3150.

The first bonding pad 3171 may be disposed on the reflective layer 3160. The first bonding pad 3171 may be disposed on the first electrode 3141.

Further, the second bonding pad 3172 may be disposed on the reflective layer 3160. The second bonding pad 3172 may be disposed on the second electrode 3142. The second bonding pad 3172 may be disposed spaced apart from the first bonding pad 3171.

The first bonding pad 3171 may be in contact with the upper surface of the first electrode 3141 through the plurality of fourth openings h4 that is provided in the protective layer 3150. The plurality of fourth openings h4 may be disposed to be offset without overlapping each other in the vertical direction with the second opening h2. When the plurality of fourth openings h4 and the second openings h2 are vertically offset from each other, the current injected into the first bonding pad 3171 may spread evenly in the horizontal direction of the first electrode 3141, and thus the current in the plurality of fourth openings h4 can be injected evenly.

Further, the second bonding pad 3172 may be in contact with the upper surface of the second electrode 3142 through the plurality of third openings h3 that is provided in the protective layer 3150. When the plurality of third openings h4 and the plurality of first openings h1 are vertically offset from each other, the current injected into the second bonding pad 3172 may spread evenly in the horizontal direction of the second electrode 3142. Thus the current in the plurality of third openings h3 can be injected evenly.

According to the semiconductor device 3100 of the embodiment, the first bonding pad 3171 and the first electrode 3141 may be contacted in regions of the plurality of fourth opening h4. Further, the second bonding pad 3172 and the second electrode 3142 may be in contact at a plurality of regions. Accordingly, according to the embodiment, since power can be supplied through a plurality of regions, there is an advantage that the current dispersion effect can be generated and the operating voltage can be reduced by increasing the contact area and the dispersion of the contact region.

Further, according to the semiconductor device 3100 of the embodiment, as shown in FIG. 33, the reflective layer 3160 may be disposed under the first electrode 3141 and the second electrode 3142. Accordingly, the reflective layer 3160 may improve light intensity Po by reflecting light emitted from the active layer 3112 of the light emitting structure 3110 to minimize light absorption at the first electrode 3141 and the second electrode 3142.

For example, the reflective layer 3160 may be formed of an insulating material, and may have a high reflectance material, for example, a DBR structure, to reflect light emitted from the active layer 114.

The reflective layer 3160 may be formed of a DBR structure in which materials having different refractive indices are repeatedly arranged with each other. For example, the reflective layer 3160 may be disposed in a single layer or a stacked structure including at least one of $TiO_2$, $SiO_2$, $Ta_2O_5$, and $HfO_2$.

Further, according to another embodiment, it is not limited thereto, the reflective layer 3160 may be freely selected to adjust the reflectivity of the light emitted from the active layer 3112 according to the wavelength of light emitted from the active layer 3112.

Further, according to another embodiment, the reflective layer 3160 may be provided with ODR layer. According to another embodiment, the reflective layer 3160 may be provided in the form of a sort of hybrid with the stacked layer of DBR layer and ODR layer.

The semiconductor device according to the embodiment may be connected to an external power in a flip-chip bonding method. By way of example, in the manufacturing a semiconductor device package, the upper surface of the first bonding pad 3171 and the upper surface of the second bonding pad 3172 may be arranged to be attached to the sub-mount, lead frame, circuit board, and the like.

For example, the first bonding pad 3171 and the second bonding pad 3172 may be formed of Au, AuTi, or the like, so that the mounting process may be stably performed. In addition, the first bonding pad 3171 and the second bonding pad 3172 may be formed in a single layer or multiple layers using one or more materials or alloys of Ti, Al, In, Ir, Ta, Pd, Co, Cr, Mg, Zn, Ni, Si, Ge, Ag, Ag alloy, Au, Hf, Pt, Ru, Rh, Sn, ZnO, IrOx, RuOx, NiO, RuOx/ITO, Ni/IrOx/Au, Ni/IrOx/Au/ITO, and the like.

When the semiconductor device according to the embodiment is mounted in a flip chip bonding method and implemented as a semiconductor device package, light provided from the light emitting structure 3110 may be emitted through the substrate 3105. Light emitted from the light emitting structure 3110 may be reflected at the reflective layer 3160 and may be emitted toward the substrate 3105. Further, light emitted from the light emitting structure 3110 may be emitted in the lateral direction of the light emitting structure 3110.

Further, according to the semiconductor device and the semiconductor device package of the embodiment, since the first bonding pad 3171 and the second bonding pad 3172 having a large area may be directly bonded to the circuit board providing power, the flip chip bonding process may be easily and stably performed.

Meanwhile, according to the semiconductor device of the embodiment, when viewed from the upper direction of the light emitting device 3100, the sum of the area of the first bonding pad 3171 and the area of the second bonding pad 3172 may be provided equal to or smaller than 60% of the entire area of the upper surface of the light emitting device 3100 on which the first bonding pad 3171 and the second bonding pad 3172 are disposed.

For example, the entire area of the upper surface of the light emitting device 3100 may correspond to an area defined by a lateral length and a longitudinal length of the lower surface of the first conductivity type semiconductor layer 3111 of the light emitting structure 3110. The entire area of the upper surface of the light emitting device 3100 may correspond to the area of the upper surface or the lower surface of the substrate 3105.

In addition, when viewed from the upper direction of the light emitting device, the sum of the area of the first bonding pad 3171 and the area of the second bonding pad 3172 may be provided equal to or greater than 30% of the entire area of the light emitting device 3100.

By thus providing the sum of the areas of the first bonding pad 3171 and the second bonding pad 3172 equal to or greater than 30% of the entire area of the light emitting device 3100, stable mounting can be performed through the first bonding pad 3171 and the second bonding pad 3172, and the electrical characteristics of the light emitting device 3100 can be secured.

In the light emitting device 3100 according to the embodiment, the sum of the areas of the first bonding pad 3171 and the second bonding pad 3172 may be selected in a range of 30% or more to 60% or less of the entire areas of the light emitting device 3100 in order to secure light extraction efficiency and stability of bonding.

When the sum of the areas of the first bonding pad 3171 and the second bonding pad 3172 is in a range of 30% or more to 100% or less of the entire area of the light emitting device 3100, the electrical characteristics of the semiconductor device 3100 can be secured, and stable mounting may be performed by securing the bonding force to be mounted on the semiconductor device package.

In addition, an appropriate interval must be provided between the first bonding pad 3171 and the second bonding pad 3172, so that the first bonding pad 3171 and the second bonding pad 3172 can be prevented from being electrically connected each other in the process of being mounted on the frame when the semiconductor device package is manufactured. In consideration of this, the sum of the areas of the first bonding pad 3171 and the second bonding pad 3172 may be set to 60% or less of the total area of the semiconductor device. An appropriate distance between the first bonding pad 3171 and the second bonding pad 3172 will be described later.

In the embodiment, in order to secure the electrical characteristics of the semiconductor device 3100 and the bonding force to be mounted on the semiconductor device package, and to improve the reliability, the sum of the areas of the first bonding pad 3171 and the second bonding pad 3172 is selected as 30% or more to 60% or less of the total area of the semiconductor device 3100.

According to the embodiment, by the reflective layer 3160, the light emitted from the light emitting structure 3110 can be reflected and cannot incident on the first bonding pad 3171 and the second bonding pad 3172. Accordingly, according to the embodiment, being incident on the first bonding pad 3171 and the second bonding pad 3172 and a loss of the light that is generated and emitted from the light emitting structure 3110 can be minimized.

Further, according to the semiconductor device 3100 of the embodiment, since the reflective layer 3160 is disposed between the first bonding pad 3171 and the second bonding pad 3172, light may be prevented from being emitted between the first bonding pad 3171 and the second bonding pad 3172.

In addition, the minimum spacing between the first bonding pad 3171 and the second bonding pad 3172 may be provided as equal to or larger than 125 micrometers. The minimum distance between the first bonding pad 3171 and the second bonding pad 3172 may be selected in consideration of the distance between the first pad and the second pad of the package body on which the semiconductor device 3100 is mounted.

As an example, the minimum spacing between the first pad and the second pad of the package body may be provided at a minimum of 125 micrometers and may be provided at a maximum of 200 micrometers. In this case, in consideration of a process error, the distance between the first bonding pad 3171 and the second bonding pad 3172 may be provided, for example, in a range of 125 micrometers or more to 300 micrometers or less.

In addition, the distance between the first bonding pad 3171 and the second bonding pad 3172 should be greater than 125 micrometers, so the minimum space can be ensured that no short circuit occurs between the first bonding pad 3171 and the second bonding pad 3172 of the semiconductor device.

In addition, the distance between the first bonding pad 3171 and the second bonding pad 3172 should be provided to be less than 300 micrometers so that the first and second pads of the semiconductor device package, and the first and second bonding pads 3171 and 3172 of the semiconductor device can be bonded with sufficient bonding force, and electrical characteristics of the semiconductor device 3100 can be secured.

The minimum spacing between the first bonding pad 3171 and the second bonding pad 3172 may be provided greater than 125 micrometers to secure optical properties and to secure process margins, and may be provided smaller than 300 micrometers to secure reliability of electrical properties and bonding forces.

In the embodiment, the spacing between the first bonding pad 3171 and the second bonding pad 3172 is described as 125 micrometers or more and 300 micrometers or less. However, the invention is not limited thereto, and the distance between the first bonding pad 3171 and the second bonding pad 3172 may be provided smaller than 125 micrometers in order to improve electrical characteristics or reliability of the semiconductor device package, and may be provided larger than 300 micrometers to improve optical properties.

Further, according to the embodiment, by the reflective layer 3160, the light emitted from the light emitting structure 3110 can be reflected without being incident to the first electrode 3141 and the second electrode 3142. Accordingly, according to the embodiment, being incident on the first electrode 3141 and the second electrode 3142 and a loss of the light that is generated and emitted from the light emitting structure 3110 can be minimized.

As described above, the semiconductor device 3100 according to the embodiment may be mounted in a flip chip bonding manner, for example, and provided as a semiconductor device package. At this time, when the package body on which the semiconductor device 3100 is mounted is provided by resin or the like, the package body may be discolored or cracked under the semiconductor device 3100 due to strong short-wavelength light emitted from the semiconductor device 3100.

However, according to the semiconductor device 3100 of the embodiment, since light may be prevented from being emitted between a region where the first bonding pad 3171 and the second bonding pad 3172 are disposed, it is possible to prevent the package body disposed under the semiconductor device 3100 from being discolored or cracked.

Meanwhile, according to the semiconductor device 3100 of the embodiment, the first bonding pad 3171 and the second bonding pad 3172 may comprise a Sn layer or an In layer. By way of example, the first and second bonding pads 3171 and 3172 may comprise a Ag layer disposed on the protective layer 3150, and a Sn layer or an In layer disposed on the Ag layer.

When the first and second bonding pads 3171 and 3172 according to the embodiment comprise a Ag layer and a Sn layer, in a process of manufacturing a semiconductor device package, an intermetallic compound (IMC) layer may be formed during bonding between a frame or a pad provided in a package body.

In this case, the intermetallic compound (IMC) layer may be formed by a reaction between material contained in the first and second bonding pads 3171 and 3172, and material contained in the frame or the pad of the package. By way of example, the intermetallic compound (IMC) layer may comprise Ag and Sn. Further, the intermetallic compound layer may comprise a AgSn layer.

According to the method of manufacturing the semiconductor device package and the semiconductor device package using the formation of an intermetallic compound (IMC) layer, the melting point of the intermetallic compound layer formed by coupling between the first and second bonding pads 3171 and 3172 of the semiconductor device 3100 according to the embodiment, and the frame of the package body can be selected to have a higher value than the melting point of the general bonding material.

Therefore, the semiconductor device package according to the embodiment does not cause re-melting even when bonded to a main substrate through a reflow process, so there is an advantage that the electrical connection and physical bonding force are not degraded.

Further, according to the method of manufacturing the semiconductor device package and the semiconductor device package of the embodiment, the pre-bonding process and an air reflow process for mounting a semiconductor device on the package body may be relatively, performed at a low temperature. Accordingly, the package body is not exposed to high temperature in the process of manufacturing the semiconductor device package. According to the embodiment, it is possible to prevent the package body from being damaged or discolored due to exposure to high temperature.

Accordingly, a wider selection range of materials constituting the package body can be obtained. According to the embodiment, the package body may be provided using a relatively inexpensive resin material as well as an expensive material such as a ceramic.

For example, the package body may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

When the first bonding pad 3171 and the second bonding pad 3172 comprise a low melting point metal material including Sn or In, and an intermetallic compound (IMC) is formed during a manufacturing process of the semiconductor device package, the description and advantages thereof will be described later with reference to the accompanying drawings.

Meanwhile, as a method of detecting electrical characteristics of the semiconductor device 3100, a method of measuring electrical characteristics by contacting the measuring terminal of the inspection equipment with the first bonding pad 3171 and the second bonding pad 3172 may be used.

By the way, when the first and second bonding pads 3171 and 3172 comprise a low melting point metal material such as Sn, in, or the like, during the inspection are performed, as the measurement terminals of the inspection equipment come into contact with the first and second bonding pads 3171 and 3172, a phenomenon in which the measurement result is distorted due to side effects such as contamination by Sn or In may be occurred.

For example, the actual operating voltage Vf characteristics of the semiconductor device 3100 is normal, but as the measuring terminal of the inspection equipment is contaminated, an error that is detected as having a high operating voltage or a value different from the actual operating voltage may occur.

According to the embodiment, the terminals of the test equipment are directly, contacted on the first electrode 3141 and the second electrode 3142 through the first measuring portion PB1 and the second measuring portion PB2 provided in the protective layer 3150, and electrical characteristics of the semiconductor device 3100 can be detected.

As shown in FIGS. 32 and 33, the test measuring portion PB1 may be exposed through the first recess R1 provided in the first bonding pad 3171. Further, the second measuring portion PB2 may be exposed through the second recess R2 provided in the second bonding pad 3172.

Therefore, according to the semiconductor device 3100 of the embodiment, in detecting electrical characteristics of the semiconductor device 3100, the measuring terminals of the inspection equipment do not need to be in contact with the first and second bonding pads 3171 and 3172, so the measurement terminal may not be contaminated and the undistorted electrical characteristics of the semiconductor device 3100 may be accurately detected.

Then, with reference to the accompanying drawings, a method of manufacturing a semiconductor device according to an embodiment will be described. In the following description of the method of manufacturing the semiconductor device according to the embodiment, descriptions overlapping with those described above with reference to FIGS. 32 and 33 may be omitted.

First, according to the method of manufacturing the semiconductor device of the embodiment, as shown in FIGS. 34a to 34c, a light emitting structure 3110 may be formed on a substrate 3105.

FIG. 34a is a plan view illustrating a shape of a light emitting structure formed by a method of manufacturing a semiconductor device according to an embodiment, FIG. 34b is a plan view illustrating a result of performing a unit process illustrated in FIG. 34a, and FIG. 34c is a process sectional view taken along line A-A of the semiconductor device shown in FIG. 34a.

According to the embodiment, the light emitting structure 3110 may be formed on the substrate 3105. By way of example, a first conductivity type semiconductor layer 3111, an active layer 3112, and a second conductivity type semiconductor layer 3113 may be formed on the substrate 3105.

Further, according to the embodiment, a current diffusion layer 3120 may be formed on the light emitting structure. The current diffusion layer 3120 may be formed on the second conductivity type semiconductor layer 3113. The current diffusion layer 3120 may be provided in plurality and may be provided separately from each other.

As an example, the current diffusion layer 3120 may be provided as an oxide, a nitride, or the like.

Next, as shown in FIGS. 35a to 35c, the light transmitting electrode layer 3130 may be formed.

FIG. 35a is a plan view illustrating a shape of the light transmitting electrode layer formed by the method of manufacturing the semiconductor device according to the embodiment, 35b is a plan view illustrating a result of performing a unit process illustrated in FIG. 35a, and FIG. 35c is a process sectional view taken along line A-A of the semiconductor device shown in FIG. 35a.

According to the embodiment, the light transmitting electrode layer 3130 may be formed on the light emitting structure 3110, and a mesa etching may be performed. The light transmitting electrode layer 3130 may be formed on the second conductivity type semiconductor layer 3113, and the mesa etching process may be performed to expose the first conductivity type semiconductor layer 3111.

According to the embodiment, a portion of the first conductivity type semiconductor layer 3111 may be formed so as to be exposed through the mesa etching process. The light emitting structure 3110 may comprise, by the mesa etching, a plurality of mesa openings M to expose the first conductivity type semiconductor layer 3111. By way of example, the mesa opening M may be provided at a plurality of circular shape. Further, the mesa opening M may also be referred to as a recess. The mesa opening M may be provided in a variety of shapes such as, as well as circular, oval or polygonal.

Next, as shown in FIGS. 36a to 36c, a reflective layer 3160 may be formed.

FIG. 36a is a plan view illustrating a shape of the reflective layer formed by the method of manufacturing the semiconductor device according to the embodiment, FIG. 36b is a plan view illustrating a result of performing a unit process illustrated in FIG. 36a, and FIG. 36c is a process sectional view taken along line A-A of the semiconductor device shown in FIG. 36a.

The reflective layer 3160 may be disposed on the light transmitting electrode layer 3130.

The reflective layer 3160 may comprise a plurality of openings. By way of example, the reflective layer 3160 may comprise a plurality of the first openings h1 that is overlapping with the current diffusion layer 3120 in a first direction perpendicular to the upper surface of the substrate 3105. The light transmitting electrode layer 3130 disposed on the current diffusion layer 3120 may be exposed through the plurality of the first openings h1.

In addition, the reflective layer 3160 may comprise a plurality of second openings h2 which is overlapped with the plurality of the mesa recess M in the first direction. An upper surface of the first conductivity type semiconductor layer 3111 may be exposed through the plurality of second openings h2. The plurality of second openings h2 may be provided in a region corresponding to the plurality of mesa opening M formed in the light emitting structure 3110. In addition, the plurality of second openings h2 may be provided in a region corresponding to the plurality of openings provided in the light transmitting electrode layer 3130.

For example, the plurality of first openings h1 may be provided in a plurality of line shapes along the long axis direction of the substrate 3105. In addition, the plurality of second openings h2 may be provided in a plurality of line shapes along the long axis direction of the substrate 3105. The plurality of first openings h1 and the plurality of second openings h2 may be sequentially arranged to each other in a short axis direction of the substrate 3105.

According to the embodiment, the distance d1 between neighboring first openings among the plurality of first openings h1 may be provided as 110 micrometers to 140 micrometers. The distance d1 between the neighboring second openings among the plurality of second openings h2 may be provided as 110 micrometers to 140 micrometers. The distance d2 between the neighboring first opening h1 and the second opening h2 among the plurality of first and second openings h1 and h2 may be provided as 120 micrometers to 160 micrometers.

A first electrode 3141 or a second electrode 3142 may be disposed in the plurality, of first and second openings h1 and h2, respectively, so that power may be provided to the first conductivity type semiconductor layer 3111 and the second conductivity type semiconductor layer 3113.

Therefore, the arrangement interval of the first and second openings h1 and h2 may be set in consideration of the size and current spreading characteristics of the semiconductor device.

According to the embodiment, the distance between the neighboring first openings h1 among the plurality of first openings h1 may be provided different from the distance between the neighboring first opening h1 and the second opening 112 among the plurality of first and second openings h1 and h2.

For example, the distance between the neighboring first openings h1 among the plurality of first openings h1 may be provided smaller than the distance between the neighboring first opening h1 and the second opening h2 among the plurality of first and second openings h1 and h2.

In addition, the distance between the neighboring second openings h2 among the plurality of second openings h2 may be provided smaller than the distance between the neighboring first opening h1 and the second opening h2 among the plurality of first and second openings h1 and h2. The distance between the neighboring second openings h2 among the plurality, of second openings h2 may be provided similar as the distance between the neighboring first openings h1 among the plurality of first openings h1.

This will be described later with reference to an arrangement interval between the first electrode 3141 and the second electrode 3142.

Next, as shown in FIGS. 37a to 37c, the first electrode 3141 and the second electrode 3142 may be formed.

FIG. 37a is a plan view illustrating a shape of the first electrode and the second electrode formed by the method of manufacturing the semiconductor device according to the embodiment, FIG. 37b is a plan view illustrating a result of performing a unit process illustrated in FIG. 37a, and FIG. 37c is a process sectional view taken along line A-A of the semiconductor device shown in FIG. 37a.

According to the embodiment, the first electrode 3141 and the second electrode 3142 may be arranged separately from each other.

The first electrode 3141 may be electrically connected to the first conductivity type semiconductor layer 3111. The first electrode 3141 may be disposed on the first conductivity type semiconductor layer 3111, By way of example, according to the semiconductor device 3100 of the embodiment, the first electrode 3141 may be disposed on an upper surface of the first conductivity type semiconductor layer 3111 exposed by removing a portion of the second conductivity type semiconductor layer 3113 and a portion of the active layer 3112.

The first electrode 3141 may be electrically connected to the upper surface of the first conductivity type semiconductor layer 3111 through the second opening 112 provided in the reflective layer 3160. By way of example, the first electrode 3141 may be in direct contact with the upper surface of the first conductivity type semiconductor layer 3111 in a plurality of regions.

The second electrode 3142 may be electrically connected to the second conductivity type semiconductor layer 3113. The second electrode 3142 may be disposed on the second conductivity type semiconductor layer 3113. According to the embodiment, the light transmitting electrode layer 3130 may be disposed between the second electrode 3142 and the second conductivity type semiconductor layer 3113.

The second electrode 3142 may be electrically connected to the upper surface of the second conductivity type semiconductor layer 3113 through the first opening h1 provided in the reflective layer 3160. By way of example, the second electrode 3142 may be electrically connected to the second conductivity type semiconductor layer 3113 through the light transmitting electrode layer 3130 in a plurality of regions. The second electrode 3142 may be in direct contact with the upper surface of the light transmitting electrode layer 3130 in a plurality of regions.

The first electrode 3141 may comprise a first sub-electrode 3141a and a plurality, of first branch electrodes 3141a1 and 3141a2. The first sub-electrode 3141a may be disposed under the first bonding pad 3171. The plurality of first branch electrodes 3141a1 and 3141a2 may be arranged extending toward the second electrode 3142 from the first sub-electrode 3141a.

The second electrode 3142 may comprise a second sub-electrode 3142a and a plurality of second branch electrodes 3142a1, 3142a2, and 3142a3. The second sub-electrode 3142a may be disposed under the second bonding pad 3172. The plurality of second branch electrodes 3142a1, 3142a2, and 3142a3 may be disposed extending toward the first electrode 3141 from the second sub-electrode 3142a.

For example, the plurality of first branch electrodes 3141a1 and 3141a2, and the plurality of second branch electrodes 3142a1, 3142a2, and 3142a3 may be arranged to be offset from each other on the upper surface of the reflective layer 3160.

In addition, a distance between neighboring the first branch electrodes and the second branch electrodes among the plurality of first and second branch electrodes 3141a1, 3141a2, 3142a1, 3142a2, and 3142a3 may be provided in a range of 110 micrometers to 140 micrometers. Further, each width of the plurality of first and second branch electrodes 3141a1, 3141a2, 3142a1, 3142a2, and 3142a3 may be provided with a few micrometer to tens of micrometers.

The number and width of the plurality of first and second branch electrodes 3141a1, 3141a2, 3142a1, 3142a2, and 3142a3 may be set in consideration of the size and the degree of current diffusion of the semiconductor device.

When the number of the plurality of first and second branch electrodes 3141a1, 3141a2, 3142a1, 3142a2, and 3142a3 is large, it may be more advantageous for current spreading.

In addition, when the number of the plurality of first and second branch electrodes 3141a1, 3141a2, 3142a1, 3142a2, and 3142a3 is small, since light generated in the active layer 3112 may be reduced from being absorbed by the plurality of first and second branch electrodes 3141a1, 3141a2, 3142a1, 3142a2, and 3142a3, light extraction efficiency may be improved.

According to the semiconductor device of the embodiment, by setting the number of the plurality of first and second branch electrodes 3141a1, 3141a2, 3142a1, 3142a2, and 3142a3 to five and providing them in the numerical range as described above, the current diffusion efficiency and the light extraction efficiency can be improved.

Meanwhile, in FIGS. 37a to 37c, a case where the plurality of first branch electrodes 3141a1 and 3141a2 are provided in two and the plurality of second branch electrodes 3142a1, 3142a2, and 3142a3 are provided in three is illustrated as an example. However, in consideration of the size and current spreading of the semiconductor device, the number of the plurality of first and second branch electrodes may be provided more than five, and may also be provided smaller.

According to the embodiment, the plurality of first branch electrodes 3141a1 and 3141a2 may be provided to be overlapped with the plurality of second openings h2 in a first direction perpendicular to the upper surface of the reflective layer 3160.

Further, the plurality of second branch electrodes 3142a1, 3142a2, and 3142a3 may be provided to be overlapped with the plurality of first openings h1 in the first direction.

When the first electrode 3141 and the second electrode 3142 have different polarities, they may be arranged in different numbers of branch electrodes. For example, when the first electrode 3141 is an n-electrode and the second electrode 3142 is a p-electrode, the number of branch electrodes of the second electrodes 3142 may be larger than the number of branch electrodes of the first electrode 3141.

For example, an entire area of a region where the second electrode 3142 contacts the second conductivity type semiconductor layer 3113 through the first opening h1 may be provided larger than an entire area of a region where the first electrode 3141 contacts the first conductivity type semiconductor layer 3111 through the second opening h2.

When the electrical conductivity and/or resistance of the second conductivity type semiconductor layer 3113 and the first conductivity type semiconductor layer 3111 are different from each other, a balance between electrons and holes injected into the light emitting structure 3110 by the first electrode 3141 and the second electrode 3142 can be achieved, and thus the optical properties of the semiconductor device can be improved.

Next, as shown in FIG. 38a to FIG. 38c, a protective layer 3150 may be formed.

FIG. 38a is a plan view illustrating a shape of the protective layer formed by the method of manufacturing the semiconductor device according to the embodiment, FIG. 38b is a plan view illustrating a result of performing a unit process illustrated in FIG. 38a, and FIG. 38c is a process sectional view taken along line A-A of the semiconductor device shown in FIG. 38a.

The protective layer 3150 may be disposed on the first electrode 3141 and the second electrode 3142. The protective layer 3150 may be disposed on the reflective layer 3160.

The protective layer 3150 may comprise a fourth opening h4 to expose an upper surface of the first electrode 3141. The protective layer 3150 may comprise a plurality of fourth openings h4 to expose a plurality of regions of the first electrode 3141.

The protective layer 3150 may comprise a third opening h3 to expose an upper surface of the second electrode 3142. The protective layer 3150 may comprise a plurality of third openings h3 to expose a plurality of regions of the second electrode 3142.

The protective layer 3150 may comprise the first measuring portion PB1 exposing the upper surface of the first electrode 3141. FIGS. 38a to 38c have been shown as the first measuring portion PB1 is only provided, however the first measuring portion PB1 may be provided in plurality.

Further, the protective layer 3150 may comprise a second measuring portion PB2 exposing the upper surface of the second electrode 3142. FIGS. 38a to 38c have been shown as the second measuring portion PB2 is only provided, however the second measuring portion PB2 may be provided in plurality.

The first measuring portion PB1 and the second measuring portion PB2 may be used to detect electric characteristics of the semiconductor device 3100. Measuring terminals of the inspection equipment may contact the first and second electrodes 3141 and 3142 through the first measuring portion PB1 and the second measuring portion PB2 to detect electrical characteristics of the semiconductor device 3100.

Then, as shown in FIGS. 39a to 39c, a first bonding pad 3171 and a second bonding pad 3172 may be formed.

FIG. 39a is a plan view illustrating a shape of the first and second bonding pads formed by the method of manufacturing the semiconductor device according to the embodiment, FIG. 39b is a plan view illustrating a result of performing a unit process illustrated in FIG. 39a, and FIG. 39c is a process sectional view taken along line A-A of the semiconductor device shown in FIG. 39a.

According to the embodiment, the first bonding pad 3171 and the second bonding pad 3172 may be formed in the shape illustrated in FIG. 39a. The first bonding pad 3171 and the second bonding pad 3172 may be disposed on the protective layer 3150.

The first bonding pad 3171 may be disposed on the reflective layer 3160. The first bonding pad 3171 may be disposed on the first electrode 3141.

The second bonding pad 3172 may be disposed on the reflective layer 3160. The second bonding pad 3172 may be disposed on the second electrode 3142. The second bonding pad 3172 may be disposed spaced away from the first bonding pad 3171.

The first bonding pad 3171 may be in contact with an upper surface of the first electrode 3141 through the plurality of fourth openings h4 provided in the protective layer 3150. The plurality of fourth openings h4 may be disposed to be offset without overlapping with the second opening h2 in the vertical direction. When the plurality of fourth openings h4 and the second openings h2 are vertically offset from each other, current injected into the first bonding pad 3171 may spread evenly in the horizontal direction of the first electrode 3141, thereby current may be evenly injected through the plurality of fourth openings h4.

Further, the second bonding pad 3172 may be in contact with an upper surface of the second electrode 3142 through the plurality of third openings h3 provided in the protective layer 3150. When the plurality of third openings h3 and the plurality of first openings h1 are offset from each other in the vertical direction, current injected into the second bonding pad 3172 may spread evenly in the horizontal direction of the second electrode 3142, thereby current may be evenly injected through the plurality of third openings h3.

As described above, according to the semiconductor device 3100 of the embodiment, the first bonding pad 3171 and the first electrode 3141 may be in contact with each other in the plurality of fourth openings h4. In addition, the second bonding pad 3172 and the second electrode 3142 may be in contact with each other in a plurality of regions. Accordingly, according to the embodiment, since power can be supplied through a plurality of regions, there is an advantage that current dispersion effect can be generated and operating voltage can be reduced by increasing the contact area and the dispersion of the contact region.

According to the embodiment, as the power is supplied to the first bonding pad 3171 and the second bonding pad 3172, the light emitting structure 3110 is able to be emitted.

As described above, according to the semiconductor device 3100 of the embodiment, the first bonding pad 3171 and the first electrode 3141 may be in contact with each other in a plurality of regions. In addition, the second bonding pad 3172 and the second electrode 3142 may be in contact with each other in a plurality of regions. Accordingly, according to the embodiment, since power can be supplied through a plurality of regions, there is an advantage that current dispersion effect can be generated and operating voltage can be reduced by increasing the contact area and the dispersion of the contact region.

The semiconductor device according to the embodiment may be connected to an external power by a flip chip bonding method. For example, in manufacturing a semiconductor device package, an upper surface of the first bonding pad 3171 and an upper surface of the second bonding pad 3172 may be disposed to be attached to a submount, a lead frame, a circuit board, or the like.

When the semiconductor device according to the embodiment is mounted in a flip chip bonding method and implemented as a semiconductor device package, light provided from the light emitting structure 3110 may be emitted through the substrate 3105. Light emitted from the light emitting structure 3110 may be reflected by the reflective layer 3160 and emitted toward the substrate 3105. In addition, light emitted from the light emitting structure 3110 may also be emitted in a lateral direction of the light emitting structure 3110.

In addition, according to the semiconductor device and the semiconductor device package of the embodiment, since the first bonding pad 3171 and the second bonding pad 3172 having a large area can be directly bonded to the circuit board for providing power, the flip chip bonding process can be easily and stably performed.

Meanwhile, according to the semiconductor device of the embodiment, when viewed from an upper direction of the semiconductor device 3100, the sum of the areas of the first bonding pad 3171 and the second bonding pad 3172 may be provided equal to or smaller than 60% of the total area of the upper surface of the semiconductor device 3100 on which the first bonding pad 3171 and the second bonding pad 3172 are disposed.

For example, the entire area of the upper surface of the semiconductor device 3100 may correspond to an area defined by a lateral length and a longitudinal length of the lower surface of the first conductivity type semiconductor layer 3111 of the light emitting structure 3110. The entire area of the upper surface of the semiconductor device 3100 may correspond to the area of the upper surface or the lower surface of the substrate 3105.

In addition, when viewed from the upper direction of the semiconductor device, the sum of the area of the first bonding pad 3171 and the area of the second bonding pad 3172 may be provided equal to or greater than 30% of the entire area of the semiconductor device 3100.

By thus providing the sum of the areas of the first bonding pad 3171 and the second bonding pad 3172 equal to or greater than 30% of the entire area of the semiconductor device 3100, stable mounting can be performed through the first bonding pad 3171 and the second bonding pad 3172, and the electrical characteristics of the semiconductor device 3100 can be secured.

In the semiconductor device 3100 according to the embodiment, the sum of the areas of the first bonding pad 3171 and the second bonding pad 3172 may be selected in a range of 30% or more to 60% or less of the entire areas of the semiconductor device 3100 in order to secure light extraction efficiency and stability of bonding.

When the sum of the areas of the first bonding pad 3171 and the second bonding pad 3172 is in a range of 30% or more to 100% or less of the entire area of the semiconductor device 3100, the electrical characteristics can be secured, and the bonding force to be mounted to the semiconductor device package can be secured to perform stable mounting.

In addition, an appropriate gap must be provided between the first bonding pad 3171 and the second bonding pad 3172 to prevent the first bonding pad 3171 and the second bonding pad 3172 from being electrically connected in the process of being mounted on the frame when manufacturing a semiconductor device package. In consideration of this, the sum of the areas of the first bonding pad 3171 and the second bonding pad 3172 may be set to 60% or less of the total area of the semiconductor device 3100.

In the embodiment, the sum of the areas of the first bonding pad 3171 and the second bonding pad 3172 is selected to be in a range of 30% or more to 60% or less of the total area of the semiconductor device in order to secure electrical characteristics of the semiconductor device 3100 and bonding strength to be mounted to the semiconductor device package and improve reliability.

According to the embodiment, by the reflective layer 3160, the light emitted from the light emitting structure 3110 can be reflected without being incident to the first bonding pad 3171 and the second bonding pad 3172. Accordingly, according to the embodiment, being incident on the first bonding pad 3171 and the second bonding pad 3172 and a loss of the light that is generated and emitted from the light emitting structure 3110 can be minimized.

Further, according to the semiconductor device 3100 of the embodiment, since the reflective layer 3160 is disposed between the first bonding pad 3171 and the second bonding pad 3172, it is possible to prevent the light emission between the first bonding pad 3171 and the second bonding pad 3172.

In addition, the minimum spacing between the first bonding pad 3171 and the second bonding pad 3172 may be provided as equal to or larger than 125 micrometers. The minimum distance between the first bonding pad 3171 and the second bonding pad 3172 may be selected in consideration of the distance between the first electrode pad and the second electrode pad of the package body on which the semiconductor device 3100 is mounted.

As an example, the minimum spacing between the first pad and the second pad of the package body may be provided at a minimum of 125 micrometers and may be provided at a maximum of 200 micrometers. In this case, in consideration of a process error, the distance between the first bonding pad 3171 and the second bonding pad 3172 may be provided, for example, in a range of 125 micrometers or more to 300 micrometers or less.

In addition, the distance between the first bonding pad 3171 and the second bonding pad 3172 should be greater than 125 micrometers, so the minimum space can be ensured that no short circuit occurs between the first bonding pads 3171 and the second bonding pads 3172 of the semiconductor device.

In addition, the distance between the first bonding pad 3171 and the second bonding pad 3172 should be provided to be less than 300 micrometers so that the first and second pads of the semiconductor device package, and the first and second bonding pads 3171 and 3172 of the semiconductor device can be bonded with sufficient bonding force, and electrical characteristics of the semiconductor device 3100 can be secured.

The minimum spacing between the first bonding pad 3171 and the second bonding pad 3172 may be provided greater than 125 micrometers to secure optical properties and to secure process margins, and may be provided smaller than 300 micrometers to secure reliability of electrical properties and bonding forces.

In the embodiment, the spacing between the first bonding pad 3171 and the second bonding pad 3172 is described as 125 micrometers or more and 300 micrometers or less. However, it is not limited thereto, and the distance between the first bonding pad 3171 and the second bonding pad 3172 may be provided smaller than 125 micrometers in order to improve electrical characteristics or reliability of the semiconductor device package, and may be provided larger than 300 micrometers to improve optical properties.

Further, according to the embodiment, by the reflective layer 3160, the light emitted from the light emitting structure 3110 can be reflected without being incident to the first electrode 3141 and the second electrode 3142. Accordingly, according to the embodiment, being incident on the first electrode 3141 and the second electrode 3142 and a loss of the light that is generated and emitted from the light emitting structure 3110 can be minimized.

As described above, the semiconductor device 3100 according to the embodiment may be mounted in a flip chip bonding manner, for example, and provided as a semiconductor device package. At this time, when the package body on which the semiconductor device 3100 is mounted is provided by resin or the like, the package body may be discolored or cracked under the semiconductor device 3100 due to strong short-wavelength light emitted from the semiconductor device 3100.

However, according to the semiconductor device 3100 of the embodiment, since light may be prevented from being emitted between a region where the first bonding pad 3171 and the second bonding pad 3172 are disposed, it is possible to prevent the package body disposed under the semiconductor device 3100 from being discolored or cracked.

Meanwhile, in the above description, it has been described with reference to a semiconductor device 3100 in which the reflective layer 3160 is disposed on and in direct contact with the light transmitting electrode layer 3130, However, according to the semiconductor device of another embodiment, an insulating layer or an electrode may be further disposed between the light transmitting electrode layer 3130 and the reflective layer 3160. In addition, a current spreading layer may be further disposed between the light transmitting electrode layer 3130 and the light emitting structure 3110.

Meanwhile, according to the semiconductor device 3100 of the embodiment, the first bonding pad 3171 and the second bonding pad 3172 may comprise a Sn layer or an In layer. By way of example, the first and second bonding pads 3171 and 3172 may comprise a Ag layer disposed on the protective layer 3150, and a Sn layer or an in layer disposed on the Ag layer.

When the first and second bonding pads 3171 and 3172 according to the embodiment comprise a Ag layer and a Sn layer, in a process of manufacturing a semiconductor device package, an intermetallic compound (IMC) layer may be formed during bonding between a frame or a pad provided in a package body.

In this case, the intermetallic compound (IMC) layer may be formed by a reaction between material contained in the first and second bonding pads 3171 and 3172, and material contained in the frame or the pad of the package. By way of example, the intermetallic compound (IMC) layer may comprise Ag and Sn. Further, the intermetallic compound layer may comprise a AgSn layer.

According to the method of manufacturing the semiconductor device package and the semiconductor device package using the formation of an intermetallic compound (IMC) layer, the melting point of the intermetallic compound layer formed by coupling between the first and second bonding pads 3171 and 3172 of the semiconductor device 3100 according to the embodiment, and the frame of the package body can be selected to have a higher value than the melting point of the general bonding material.

Therefore, the semiconductor device package according to the embodiment does not cause re-melting even when bonded to a main substrate through a reflow process, so there is an advantage that the electrical connection and physical bonding force are not degraded.

Further, according to the method of manufacturing the semiconductor device package and the semiconductor device package of the embodiment, the pre-bonding process and an air reflow process for mounting a semiconductor device on the package body may be relatively performed at a low temperature. Accordingly, the package body is not exposed to high temperature in the process of manufacturing the semiconductor device package. According to the embodiment, it is possible to prevent the package body from being damaged or discolored due to exposure to high temperature.

Accordingly, a wider selection range of materials constituting the package body can be obtained. According to the embodiment, the package body may be provided using a relatively inexpensive resin material as well as an expensive material such as a ceramic.

For example, the package body may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

When the first bonding pad 3171 and the second bonding pad 3172 comprise a low melting point metal material including Sn or In, and an intermetallic compound (IMC) is formed during a manufacturing process of the semiconductor device package, the description and advantages thereof will be described later with reference to the accompanying drawings.

Meanwhile, as a method of detecting electrical characteristics of the semiconductor device 3100, a method of measuring electrical characteristics by contacting the measuring terminal of the inspection equipment with the first bonding pad 3171 and the second bonding pad 3172 may be used.

By the way, when the first and second bonding pads 3171 and 3172 comprise a low melting point metal material such as Sn, In, or the like, during the inspection are performed, as the measurement terminals of the inspection equipment come into contact with the first and second bonding pads 3171 and 3172, a phenomenon in which the measurement result is distorted due to side effects such as contamination by Sn or In may be occurred.

For example, the actual operating voltage Vf characteristics of the semiconductor device 3100 is normal, but as the measuring terminal of the inspection equipment is contaminated, an error that is detected as having a high operating voltage or a value different from the actual operating voltage may occur.

According to the embodiment, the terminals of the test equipment are directly contacted on the first electrode 3141 and the second electrode 3142 through the first measuring portion PB1 and the second measuring portion PB2 provided in the protective layer 3150, and electrical characteristics of the semiconductor device 3100 can be detected.

The first measuring portion PB1 may be exposed through the first recess R1 provided in the first bonding pad 3171. Further, the second measuring portion PB2 may be exposed through the second recess R2 provided in the second bonding pad 3172.

Therefore, according to the semiconductor device 3100 of the embodiment, in detecting electrical characteristics of the semiconductor device 3100, the measuring terminals of the inspection equipment do not need to be in contact with the first and second bonding pads 3171 and 3172, so the measurement terminal may not be contaminated and the undistorted electrical characteristics of the semiconductor device 3100 may be accurately detected.

Meanwhile, according to another embodiment, similar to those described with reference to FIGS. 29 to 31, the first electrode 3141 and the second bonding pad 3172 may be disposed to be offset from each other. When viewed from a first direction perpendicular to an upper surface of the second bonding pad 3172, the first electrode 3141 and the second bonding pad 3172 may be disposed not to overlap each other in the first direction. In addition, the second electrode 3142 and the first bonding pad 3171 may be disposed to be offset from each other. When viewed from a first direction perpendicular to an upper surface of the first bonding pad 3171, the second electrode 3142 and the first bonding pad 3171 may be disposed not to overlap each other in the first direction.

Next, another example of the semiconductor device according to an embodiment will be described with reference to FIG. 40. FIG. 40 is a plan view illustrating another example of a semiconductor device according to an embodiment.

In describing another example of the semiconductor device according to an embodiment with reference to FIG. 40, descriptions overlapping with those described above may be omitted.

As shown in FIG. 40, the semiconductor device 3100 according to the embodiment may comprise a plurality of measuring portions PB1, PB2, PB3, and PB4. The plurality of measuring portions PB1, PB2, PB3, and PB4 may be provided in the protective layer 3150 to expose a first electrode 3141 or a second electrode 3142.

For example, the first and third measuring portions PB1 and PB3 may be provided in the protective layer 3150 to expose an upper surface of the first electrode layer 3141. Second and fourth measuring portions PB2 and PB4 may be provided in the protective layer 3150 to expose an upper surface of the second electrode layer 3142.

The first bonding pad 3171 disposed on the first electrode 3141 may comprise first and third recesses R1 and R3 exposing the first and third measuring portions PB1 and PB3. In addition, the second bonding pad 3172 disposed on the second electrode 3142 may comprise second and fourth recesses R2 and R4 exposing the second and fourth measurement portions PB2 and PB4.

Next, the structure of the semiconductor device will be further described during describing a method of manufacturing a semiconductor device according to an embodiment with reference to the accompanying drawings. In describing the method of manufacturing the semiconductor device according to the embodiment, descriptions overlapping with those described above may be omitted.

First, according to the method of manufacturing the semiconductor device of the embodiment, as shown in FIGS. 41a and 41b, a light emitting structure 3110 may be formed on a substrate 3105.

FIG. 41a is a plan view illustrating a shape of a light emitting structure formed by a method of manufacturing a semiconductor device according to an embodiment, and FIG. 41b is a plan view illustrating a result of performing a unit process illustrated in FIG. 41a.

According to the embodiment, the light emitting structure 3110 may be formed on the substrate 3105. By way of example, a first conductivity type semiconductor layer 3111, an active layer 3112, and a second conductivity type semiconductor layer 3113 may be formed on the substrate 3105.

Further, according to the embodiment, a current diffusion layer 3120 may be formed on the light emitting structure. The current diffusion layer 3120 may be formed on the second conductivity type semiconductor layer 3113. The current diffusion layer 3120 may be provided in plurality and may be provided separately from each other.

Next, as shown in FIGS. 42a and 42b, a light transmitting electrode layer 3130 may be formed.

FIG. 42a is a plan view illustrating a shape of the light transmitting electrode layer formed by the method of manufacturing the semiconductor device according to the embodiment, and FIG. 42b is a plan view illustrating a result of performing a unit process illustrated in FIG. 42a.

According to the embodiment, the light transmitting electrode layer 3130 may be formed on the light emitting structure 3110, and a mesa etching may be performed. The light transmitting electrode layer 3130 may be formed on the second conductivity type semiconductor layer 3113, and the mesa etching process may be performed to expose the first conductivity type semiconductor layer 3111.

According to the embodiment, a portion of the first conductivity type semiconductor layer 3111 may be formed so as to be exposed through the mesa etching process. The light emitting structure 3110 may comprise, by the mesa etching, a plurality of mesa openings M to expose the first conductivity type semiconductor layer 3111. By way of example, the mesa opening M may be provided at a plurality of circular shape. Further, the mesa opening M may also be referred to as a recess. The mesa opening M may be provided in a variety of shapes such as, as well as circular, oval or polygonal.

Next, as shown in FIGS. 43a and 43h, a reflective layer 3160 may be formed.

FIG. 43a is a plan view illustrating a shape of the reflective layer formed by the method of manufacturing the semiconductor device according to the embodiment, and FIG. 43b is a plan view illustrating a result of performing a unit process illustrated in FIG. 43a.

The reflective layer 3160 may be disposed on the light transmitting electrode layer 3130.

The reflective layer 3160 may comprise a plurality of openings. By way of example, the reflective layer 3160 may comprise a plurality of the first openings h1 that is overlapping with the current diffusion layer 3120 in a first direction perpendicular to the upper surface of the substrate 3105. The light transmitting electrode layer 3130 disposed on the current diffusion layer 3120 may be exposed through the plurality of the first openings h1.

In addition, the reflective layer 3160 may comprise a plurality of second openings h2 which is overlapped with the plurality of the mesa recess M in the first direction. An upper surface of the first conductivity type semiconductor layer 3111 may be exposed through the plurality of second openings h2. The plurality of second openings h2 may be provided in a region corresponding to the plurality of mesa opening M formed in the light emitting structure 3110. In addition, the plurality of second openings 112 may be provided in a region corresponding to the plurality of openings provided in the light transmitting electrode layer 3130.

For example, the plurality of first openings h1 may be provided in a plurality of line shapes along the long axis direction of the substrate 3105. In addition, the plurality of second openings h2 may be provided in a plurality of line shapes along the long axis direction of the substrate 3105. The plurality of first openings h1 and the plurality of second openings h2 may be sequentially arranged to each other in a short axis direction of the substrate 3105.

According to the embodiment, the distance d1 between neighboring first openings among the plurality of first openings h1 may be provided as 110 micrometers to 140 micrometers. The distance d1 between the neighboring second openings among the plurality of second openings h2 may be provided as 110 micrometers to 140 micrometers. The distance d2 between the neighboring first opening h1 and the second opening 112 among the plurality of first and second openings h1 and h2 may be provided as 120 micrometers to 160 micrometers.

A first electrode 3141 or a second electrode 3142 may be disposed in the plurality of first and second openings h1 and h2, respectively, so that power may be provided to the first conductivity type semiconductor layer 3111 and the second conductivity type semiconductor layer 3113.

Therefore, the arrangement interval of the first and second openings h1 and h2 may be set in consideration of the size and current spreading characteristics of the semiconductor device. This will be described later with reference to the arrangement interval between the first electrode 3141 and the second electrode 3142.

Then, as shown in FIGS. 44a and 44b, the first electrode 3141 and the second electrode 3142 may be formed.

FIG. 44a is a plan view illustrating a shape of the first electrode and the second electrode formed by the method of manufacturing the semiconductor device according to the embodiment, and FIG. 44b is a plan view illustrating a result of performing a unit process illustrated in FIG. 44a.

According to the embodiment, the first electrode 3141 and the second electrode 3142 may be disposed spaced apart from each other.

The first electrode 3141 may be electrically connected to the first conductivity, type semiconductor layer 3111. The first electrode 3141 may be disposed on the first conductivity type semiconductor layer 3111. By way of example, according to the semiconductor device 3100 of the embodiment, the first electrode 3141 may be disposed on an upper surface of the first conductivity type semiconductor layer 3111 exposed by removing a portion of the second conductivity type semiconductor layer 3113 and a portion of the active layer 3112.

The first electrode 3141 may be electrically connected to the upper surface of the first conductivity type semiconductor layer 3111 through the second opening h2 provided in the reflective layer 3160. By way of example, the first electrode 3141 may be in direct contact with the upper surface of the first conductivity type semiconductor layer 3111 in a plurality of regions.

The second electrode 3142 may be electrically connected to the second conductivity type semiconductor layer 3113. The second electrode 3142 may be disposed on the second conductivity type semiconductor layer 3113. According to the embodiment, the light transmitting electrode layer 3130 may be disposed between the second electrode 3142 and the second conductivity type semiconductor layer 3113.

The second electrode 3142 may be electrically connected to the upper surface of the second conductivity type semiconductor layer 3113 through the first opening h1 provided in the reflective layer 3160. By way of example, the second electrode 3142 may be electrically connected to the second conductivity type semiconductor layer 3113 through the light transmitting electrode layer 3130 in a plurality of regions. The second electrode 3142 may be in direct contact with the upper surface of the light transmitting electrode layer 3130 in a plurality of regions.

The first electrode 3141 may comprise a first sub-electrode 3141a and a plurality, of first branch electrodes 3141a1 and 3141a2. The first sub-electrode 3141a may be disposed under the first bonding pad 3171. The plurality of first branch electrodes 3141a1 and 3141a2 may be arranged extending toward the second electrode 3142 from the first sub-electrode 3141a.

The second electrode 3142 may comprise a second sub-electrode 3142a and a plurality of second branch electrodes 3142a1, 3142a2, and 3142a3, The second sub-electrode 3142a may be disposed under the second bonding pad 3172. The plurality of second branch electrodes 3142a1, 3142a2, and 3142a3 may be disposed extending toward the first electrode 3141 from the second sub-electrode 3142a.

For example, the plurality of first branch electrodes 3141a1 and 3141a2 and the plurality of second branch electrodes 3142a1, 3142a2, and 3142a3 may be arranged to be offset from each other on the upper surface of the reflective layer 3160.

In addition, a distance between neighboring the first branch electrodes and the second branch electrodes among the plurality of first and second branch electrodes 3141a1, 3141a2, 3142a1, 3142a2, and 3142a3 may be provided in a range of 110 micrometers to 140 micrometers. Further, each width of the plurality of first and second branch electrodes 3141a1, 3141a2, 3142a1, 3142a2, and 3142a3 may be provided with a few micrometer to tens of micrometers.

The number and width of the plurality of first and second branch electrodes 3141a1, 3141a2, 3142a1, 3142a2, and 3142a3 may be set in consideration of the size and the degree of current diffusion of the semiconductor device.

When the number of the plurality of first and second branch electrodes 3141a1, 3141a2, 3142a1, 3142a2, and 3142a3 is large, it may be more advantageous for current spreading.

In addition, when the number of the plurality of first and second branch electrodes 3141a1, 3141a2, 3142a1, 3142a2, and 3142a3 is small, since light generated in the active layer 3112 may be reduced from being absorbed by the plurality of first and second branch electrodes 3141a1, 3141a2, 3142a1, 3142a2, and 3142a3, light extraction efficiency may be improved.

According to the semiconductor device of the embodiment, by setting the number of the plurality of first and second branch electrodes 3141a1, 3141a2, 3142a1, 3142a2, and 3142a3 to five and providing them in the numerical range as described above, the current diffusion efficiency and the light extraction efficiency can be improved.

Meanwhile, in FIGS. 44a and 44b, a case where the plurality of first branch electrodes 3141a1 and 3141a2 are provided in two and the plurality of second branch electrodes 3142a1, 3142a2, and 3142a3 are provided in three is illustrated as an example. However, in consideration of the size and current spreading of the semiconductor device, the number of the plurality of first and second branch electrodes may be provided more than five, and may also be provided smaller.

According to the embodiment, the plurality of first branch electrodes 3141a1 and 3141a2 may be provided to be overlapped with the plurality of second openings h2 in a first direction perpendicular to the upper surface of the reflective layer 3160.

Further, the plurality of second branch electrodes 3142a1, 3142a2, and 3142a3 may be provided to be overlapped with the plurality of first openings h1 in the first direction.

When the first electrode 3141 and the second electrode 3142 have different polarities, they may be arranged in different numbers of branch electrodes. For example, when the first electrode 3141 is an n-electrode and the second electrode 3142 is a p-electrode, the number of branch electrodes of the second electrodes 3142 may be larger than the number of branch electrodes of the first electrode 3141.

When the electrical conductivity and/or resistance of the second conductivity type semiconductor layer 3113 and the first conductivity type semiconductor layer 3111 are different from each other, a balance between electrons and holes injected into the light emitting structure 3110 by the first electrode 3141 and the second electrode 3142 can be achieved, and thus the optical properties of the semiconductor device can be improved.

Next, as shown in FIGS. 45*a* and 45*b*, a protective layer 3150 may be formed.

FIG. 45*a* is a plan view illustrating a shape of the protective layer formed by the method of manufacturing the semiconductor device according to the embodiment, and FIG. 45*b* is a plan view illustrating a result of performing a unit process illustrated in FIG. 45*a*.

The protective layer 3150 may be disposed on the first electrode 3141 and the second electrode 3142. The protective layer 3150 may be disposed on the reflective layer 3160.

The protective layer 3150 may comprise a fourth opening h4 exposing an upper surface of the first electrode 3141. The protective layer 3150 may comprise a plurality of fourth openings h4 exposing a plurality of regions of the first electrode 3141.

The protective layer 3150 may comprise a third opening h3 exposing an upper surface of the second electrode 3142. The protective layer 3150 may comprise a plurality of third openings h3 exposing a plurality of regions of the second electrode 3142.

Although, FIGS. 45*a* and 45*b* have been shown as the first measuring portion PB1 and the third measuring portion PB3 are provided, however the measuring portion may be provided as one or at least three.

Although, FIGS. 45*a* and 45*b* have been shown as the second measuring portion PB2 and the fourth measuring portion PB4 are provided, however the measuring portion may be provided as one or at least three.

Measuring terminals of the inspection equipment may contact the first and second electrodes 3141 and 3142 through the plurality of measuring portions PB1, PB2, PB3, and PB4 to detect electrical characteristics of the semiconductor device 3100.

Then, as shown in FIGS. 46*a* and 46*b*, a first bonding pad 3171 and a second bonding pad 3172 may be formed.

FIG. 46*a* is a plan view illustrating a shape of the first and second bonding pads formed by the method of manufacturing the semiconductor device according to the embodiment, and FIG. 46*b* is a plan view illustrating a result of performing a unit process illustrated in FIG. 46*a*.

According to the embodiment, the first bonding pad 3171 and the second bonding pad 3172 may be formed in the shape illustrated in FIG. 46*a*. The first bonding pad 3171 and the second bonding pad 3172 may be disposed on the protective layer 3150.

The first bonding pad 3171 may be disposed on the reflective layer 3160. The first bonding pad 3171 may be disposed on the first electrode 3141.

The second bonding pad 3172 may be disposed on the reflective layer 3160. The second bonding pad 3172 may be disposed on the second electrode 3142. The second bonding pad 3172 may be disposed spaced apart from the first bonding pad 3171.

The first bonding pad 3171 may be in contact with an upper surface of the first electrode 3141 through the plurality of fourth openings h4 provided in the protective layer 3150. The plurality of fourth openings h4 may be disposed to be offset without overlapping with the second opening h2 in the vertical direction. When the plurality of fourth openings h4 and the second openings h2 are vertically offset from each other, current injected into the first bonding pad 3171 may spread evenly in the horizontal direction of the first electrode 3141, thereby current may be evenly injected through the plurality of fourth openings h4.

Further, the second bonding pad 3172 may be in contact with an upper surface of the second electrode 3142 through the plurality of third openings h3 provided in the protective layer 3150. When the plurality of third openings h3 and the plurality of first openings h1 are offset from each other in the vertical direction, current injected into the second bonding pad 3172 may spread evenly in the horizontal direction of the second electrode 3142, thereby current may be evenly injected through the plurality of third openings h3.

As described above, according to the semiconductor device 3100 of the embodiment, the first bonding pad 3171 and the first electrode 3141 may be in contact with each other in the plurality of fourth openings h4. In addition, the second bonding pad 3172 and the second electrode 3142 may be in contact with each other in a plurality of regions. Accordingly, according to the embodiment, since power can be supplied through a plurality of regions, there is an advantage that current dispersion effect can be generated and operating voltage can be reduced by increasing the contact area and the dispersion of the contact region.

According to the embodiment, as the power is supplied to the first bonding pad 3171 and the second bonding pad 3172, the light emitting structure 3110 is able to be emitted.

As described above, according to the semiconductor device 3100 of the embodiment, the first bonding pad 3171 and the first electrode 3141 may be in contact with each other in a plurality of regions. In addition, the second bonding pad 3172 and the second electrode 3142 may be in contact with each other in a plurality of regions. Accordingly, according to the embodiment, since power can be supplied through a plurality of regions, there is an advantage that current dispersion effect can be generated and operating voltage can be reduced by increasing the contact area and the dispersion of the contact region.

The semiconductor device according to the embodiment may be connected to an external power by a flip chip bonding method. For example, in manufacturing a semiconductor device package, an upper surface of the first bonding pad 3171 and an upper surface of the second bonding pad 3172 may be disposed to be attached to a submount, a lead frame, a circuit board, or the like.

When the semiconductor device according to the embodiment is mounted in a flip chip bonding method and implemented as a semiconductor device package, light provided from the light emitting structure 3110 may be emitted through the substrate 3105. Light emitted from the light emitting structure 3110 may be reflected by the reflective layer 3160 and emitted toward the substrate 3105. In addition, light emitted from the light emitting structure 3110 may also be emitted in a lateral direction of the light emitting structure 3110.

In addition, according to the semiconductor device and the semiconductor device package of the embodiment, since the first bonding pad 3171 and the second bonding pad 3172 having a large area can be directly bonded to the circuit board for providing power, the flip chip bonding process can be easily and stably performed.

Meanwhile, according to the semiconductor device of the embodiment, when viewed from an upper direction of the semiconductor device 3100, the sum of the areas of the first bonding pad 3171 and the second bonding pad 3172 may be provided equal to or smaller than 60% of the total area of the upper surface of the semiconductor device 3100 on which the first bonding pad 3171 and the second bonding pad 3172 are disposed.

For example, the entire area of the upper surface of the semiconductor device 3100 may correspond to an area defined by a lateral length and a longitudinal length of the lower surface of the first conductivity type semiconductor layer 3111 of the light emitting structure 3110. The entire area of the upper surface of the semiconductor device 3100 may correspond to the area of the upper surface or the lower surface of the substrate 3105.

In addition, when viewed from the upper direction of the semiconductor device, the sum of the area of the first bonding pad 3171 and the area of the second bonding pad 3172 may be provided equal to or greater than 30% of the entire area of the semiconductor device 3100.

By thus providing the sum of the areas of the first bonding pad 3171 and the second bonding pad 3172 equal to or greater than 30% of the entire area of the semiconductor device 3100, stable mounting can be performed through the first bonding pad 3171 and the second bonding pad 3172, and the electrical characteristics of the semiconductor device 3100 can be secured.

In the semiconductor device 3100 according to the embodiment, the sum of the areas of the first bonding pad 3171 and the second bonding pad 3172 may be selected in a range of 30% or more to 60% or less of the entire areas of the semiconductor device 3100 in order to secure light extraction efficiency and stability of bonding.

When the sum of the areas of the first bonding pad 3171 and the second bonding pad 3172 is in a range of 30% or more to 100% or less of the entire area of the semiconductor device 3100, the electrical characteristics can be secured, and the bonding force to be mounted to the semiconductor device package can be secured to perform stable mounting.

In addition, an appropriate gap must be provided between the first bonding pad 3171 and the second bonding pad 3172 to prevent the first bonding pad 3171 and the second bonding pad 3172 from being electrically connected in the process of being mounted on the frame when manufacturing a semiconductor device package. In consideration of this, the sum of the areas of the first bonding pad 3171 and the second bonding pad 3172 may be set to 60% or less of the total area of the semiconductor device 3100.

In the embodiment, the sum of the areas of the first bonding pad 3171 and the second bonding pad 3172 is selected to be in a range of 30% or more to 60% or less of the total area of the semiconductor device 3100 in order to secure electrical characteristics of the semiconductor device 3100 and bonding strength to be mounted to the semiconductor device package, and improve reliability.

According to the embodiment, by the reflective layer 3160, the light emitted from the light emitting structure 3110 can be reflected without being incident to the first bonding pad 3171 and the second bonding pad 3172. Accordingly, according to the embodiment, being incident on the first bonding pad 3171 and the second bonding pad 3172 and a loss of the light that is generated and emitted from the light emitting structure 3110 can be minimized.

Further, according to the semiconductor device 3100 of the embodiment, since the reflective layer 3160 is disposed between the first bonding pad 3171 and the second bonding pad 3172, it is possible to prevent the light emission between the first bonding pad 3171 and the second bonding pad 3172.

In addition, the minimum spacing between the first bonding pad 3171 and the second bonding pad 3172 may be provided as equal to or larger than 125 micrometers. The minimum distance between the first bonding pad 3171 and the second bonding pad 3172 may be selected in consideration of the distance between the first electrode pad and the second electrode pad of the package body on which the semiconductor device 3100 is mounted.

In addition, the distance between the first bonding pad 3171 and the second bonding pad 3172 should be provided to be less than 300 micrometers so that the first and second pads of the semiconductor device package, and the first and second bonding pads 3171 and 3172 of the semiconductor device can be bonded with sufficient bonding force, and electrical characteristics of the semiconductor device 3100 can be secured.

The minimum spacing between the first bonding pad 3171 and the second bonding pad 3172 may be provided greater than 125 micrometers to secure optical properties and to secure process margins, and may be provided smaller than 300 micrometers to secure reliability of electrical properties and bonding forces.

In the embodiment, the spacing between the first bonding pad 3171 and the second bonding pad 3172 is described as 125 micrometers or more and 300 micrometers or less. However, it is not limited thereto, and the distance between the first bonding pad 3171 and the second bonding pad 3172 may be provided smaller than 125 micrometers in order to improve electrical characteristics or reliability of the semiconductor device package, and may be provided larger than 300 micrometers to improve optical properties.

According to the embodiment, by the reflective layer 3160, the light emitted from the light emitting structure 3110 can be reflected without being incident to the first electrode 3141 and the second electrode 3142. Accordingly, according to the embodiment, being incident on the first electrode 3141 and the second electrode 3142 and a loss of the light that is generated and emitted from the light emitting structure 3110 can be minimized.

As described above, the semiconductor device 3100 according to the embodiment may be mounted in a flip chip bonding manner, for example, and provided as a semiconductor device package. At this time, when the package body on which the semiconductor device 3100 is mounted is provided by resin or the like, the package body may be discolored or cracked under the semiconductor device 3100 due to strong short-wavelength light emitted from the semiconductor device 3100.

However, according to the semiconductor device 3100 of the embodiment, since light may be prevented from being emitted between a region where the first bonding pad 3171 and the second bonding pad 3172 are disposed, it is possible to prevent the package body disposed under the semiconductor device 3100 from being discolored or cracked.

Meanwhile, according to the semiconductor device 3100 of the embodiment, the first bonding pad 3171 and the second bonding pad 3172 may comprise a Sn layer or an In layer. By way of example, the first and second bonding pads 3171 and 3172 may comprise a Ag layer disposed on the protective layer 3150, and a Sn layer or an In layer disposed on the Ag layer.

When the first and second bonding pads 3171 and 3172 according to the embodiment comprise a Ag layer and a Sn layer, in a process of manufacturing a semiconductor device package, an intermetallic compound (IMC) layer may be formed during bonding between a frame or a pad provided in a package body.

In this case, the intermetallic compound (IMC) layer may be formed by a reaction between material contained in the first and second bonding pads 3171 and 3172, and material contained in the frame or the pad of the package. By way of example, the intermetallic compound (IMC) layer may comprise Ag and Sn. Further, the intermetallic compound layer may comprise a AgSn layer.

According to the method of manufacturing the semiconductor device package and the semiconductor device package using the formation of an intermetallic compound (IMC) layer, the melting point of the intermetallic compound layer formed by coupling between the first and second bonding pads 3171 and 3172 of the semiconductor device 3100 according to the embodiment, and the frame of the package body can be selected to have a higher value than the melting point of the general bonding material.

Therefore, the semiconductor device package according to the embodiment does not cause re-melting even when bonded to a main substrate through a reflow process, so there is an advantage that the electrical connection and physical bonding force are not degraded.

Further, according to the method of manufacturing the semiconductor device package and the semiconductor device package of the embodiment, the pre-bonding process and an air reflow process for mounting a semiconductor device on the package body may be relatively, performed at a low temperature. Accordingly, the package body is not exposed to high temperature in the process of manufacturing the semiconductor device package. According to the embodiment, it is possible to prevent the package body from being damaged or discolored due to exposure to high temperature.

Accordingly, a wider selection range of materials constituting the package body can be obtained. According to the embodiment, the package body may be provided using a relatively inexpensive resin material as well as an expensive material such as a ceramic.

For example, the package body may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

When the first bonding pad 3171 and the second bonding pad 3172 comprise a low melting point metal material including Sn or In, and an intermetallic compound (IMC) is formed during a manufacturing process of the semiconductor device package, the description and advantages thereof will be described later with reference to the accompanying drawings.

Meanwhile, as a method of detecting electrical characteristics of the semiconductor device 3100, a method of measuring electrical characteristics by contacting the measuring terminal of the inspection equipment with the first bonding pad 3171 and the second bonding pad 3172 may be used.

By the way, when the first and second bonding pads 3171 and 3172 comprise a low melting point metal material such as Sn, In, or the like, during the inspection are performed, as the measurement terminals of the inspection equipment come into contact with the first and second bonding pads 3171 and 3172, a phenomenon in which the measurement result is distorted due to side effects such as contamination by Sn or In may be occurred.

For example, the actual operating voltage Vf if characteristics of the semiconductor device 3100 is normal, but as the measuring terminal of the inspection equipment is contaminated, an error that is detected as having a high operating voltage or a value different from the actual operating voltage may occur.

According to the embodiment, the terminals of the test equipment are directly contacted on the first electrode 3141 and the second electrode 3142 through the plurality of measuring portions PB1, PB2, PB3, and PB4 provided in the protective layer 3150, and electrical characteristics of the semiconductor device 3100 can be detected.

The first and third measuring portions PB1 and PB3 may be exposed through the first and third recesses R1 and R3 provided in the first bonding pad 3171. Further, the second and fourth measuring portions PB2 and PB4 may be exposed through the second and fourth recesses R2 and R4 provided in the second bonding pad 3172.

Therefore, according to the semiconductor device 3100 of the embodiment, in detecting electrical characteristics of the semiconductor device 3100, the measuring terminals of the inspection equipment do not need to be in contact with the first and second bonding pads 3171 and 3172, so the measurement terminal may not be contaminated and the undistorted electrical characteristics of the semiconductor device 3100 may be accurately detected.

Meanwhile, according to another embodiment, similar to those described with reference to FIGS. 29 to 31, the first electrode 3141 and the second bonding pad 3172 may be disposed to be offset from each other. When viewed from a first direction perpendicular to an upper surface of the second bonding pad 3172, the first electrode 3141 and the second bonding pad 3172 may be disposed not to overlap each other in the first direction. In addition, the second electrode 3142 and the first bonding pad 3171 may be disposed to be offset from each other. When viewed from a first direction perpendicular to an upper surface of the first bonding pad 3171, the second electrode 3142 and the first bonding pad 3171 may be disposed not to overlap each other in the first direction.

Then, with reference to FIGS. 47 to 50, a case where a first bonding pad and a second bonding pad of the semiconductor device comprise a low melting metal material including Sn or In, and an intermetallic compound (IMC) layer is formed during the semiconductor device package manufacturing process will be described.

First, FIG. 47 is a view illustrating a semiconductor device package according to an embodiment of the invention. In describing the semiconductor device package according to the embodiment with reference to FIG. 47, descriptions overlapping those described above may be omitted.

The semiconductor device package 3800 according to the embodiment, as shown in FIG. 47, may comprise a semiconductor device 3650, a pad part 3210, a lead frame 3220, a package body 3230, and a main board 3300.

The semiconductor device 3650 may be electrically connected to the pad part 3210 provided in the package body 3230. The pad part 3210 may be electrically connected to the main board 3300 disposed at a lower portion. By way of example, the pad part 3210 may be electrically connected to the main board 3300 via the lead frame 3220 disposed at a lower portion.

The pad part 3210 may be provided integrally with the lead frame 3220 or may be provided in a structure separated from each other.

The semiconductor device 3650 may be disposed on the pad part 3210 provided on the lead frame 3220. The molding part 3240 may be disposed on the semiconductor device 3650. For example, the molding part 3240 may comprise wavelength converting particles that receive light provided from the semiconductor device 3650 and emit wavelength converted light.

As shown in FIG. 47, the semiconductor device package 3800 according to the embodiment may comprise an intermetallic compound (IMC) layer 3710 disposed on the pad part 3210 and a bonding layer 3310 disposed under the lead frame 3220.

For example, the intermetallic compound (MC) layer 3710 may be formed while the semiconductor device 3650 is mounted on the pad part 3210. In addition, the bonding layer 3310 may comprise a bonding material used in a bonding process such as soldering. For example, the bonding layer 3310 may comprise at least one selected from a low melting point bonding material including Sn and In, or an alloy thereof.

According to the embodiment, the intermetallic compound (IMC) layer 3710 may, have a higher melting point than the bonding layer 3310. In addition, the intermetallic compound (IMC) layer 3710 may be formed below the melting point of the bonding layer 3310.

According to the method of manufacturing the semiconductor device package 3800, the bonding process between the semiconductor device 3650 and the pad part 3210 may be performed at a first temperature that is relatively low. In addition, the bonding process between the semiconductor device 3650 and the pad part 3210 may be performed while applying a first pressure that is relatively low.

Then, the bonding process between the lead frame 3220 and the main board 3300 may be performed at a second temperature that is relatively high. In addition, the bonding process between the lead frame 3220 and the main board 3300 may be performed while applying a second pressure that is relatively high.

However, as described above, since the melting point of the intermetallic compound (IMC) layer 3710 is higher than the second temperature, in the reflow process for bonding between the lead frame 3220 and the main board 3300, the coupling force between the semiconductor device 3650 and the pad part 3210 is not degraded.

In addition, as described above, the bonding process between the semiconductor device 3650 and the pad part 3210 may be performed at the first temperature that is relatively low. Accordingly, according to the embodiment, it is possible to prevent the package body 3230 from being damaged or discolored in the bonding process between the semiconductor device 3650 and the pad part 3210.

According to the embodiment, since the bonding process between the semiconductor device 3650 and the pad part 3210 may be performed at the first temperature that is relatively low, the range of choices for the materials constituting the package body 3230 may be widened. According to the embodiment, the package body 3230 may be provided using a relatively inexpensive resin material as well as an expensive material such as a ceramic.

Meanwhile, FIG. 48 is a view showing another example of a semiconductor device according to an embodiment of the invention, and FIG. 49 is a view showing an example of a frame applied to a semiconductor device package according to an embodiment of the invention.

In describing the semiconductor device and the semiconductor device package according to the embodiment with reference to FIGS. 48 and 49, descriptions overlapping with those described with reference to FIGS. 32 to 47 may be omitted.

As shown in FIG. 48, the semiconductor device 3500 according to the embodiment may comprise a semiconductor layer 3510. FIG. 48 illustrates only a portion of the semiconductor device 3500 in which power is supplied from the outside to the semiconductor layer 3510. The semiconductor layer 3510 may be provided as a first conductivity type semiconductor layer including an n-type dopant. In addition, the semiconductor layer 3510 may be provided as a second conductivity type semiconductor layer including a p-type dopant.

Further, the semiconductor device 3500 according to the embodiment may, comprise a metal layer 3520 as shown in FIG. 48.

The metal layer 3520 may be disposed on the semiconductor layer 3510. The metal layer 3510 may be provided as a single layer, or may be provided with a plurality of layers. By way of example, the metal layer 3510 may comprise at least one layer from an adhesive metal layer, a reflective metal layer, and a barrier metal layer.

As an example, the metal layer 3520 may be provided in a thickness of several tens of nanometers. The metal layer 3520 may be provided in a thickness of 20 micrometers to 40 micrometers.

According to the embodiment, the adhesive metal layer may comprise a material having excellent adhesion with the semiconductor layer 3510. The adhesive metal layer may comprise at least one selected from a group including materials such as Cr, Ti, and the like, or an alloy thereof, for example. The adhesive metal layer may be provided in a single layer or a plurality of layers.

The reflective metal layer may comprise a highly reflective material for the wavelength band of light emitted from the semiconductor device 3500. The reflective metal layer, for example, may comprise at least one selected from a group including materials such as Al, Ag, Rh, and the like, or an alloy thereof. The reflective metal layer may be provided in a single layer or a plurality of layers.

The barrier metal layer may comprise a material capable of preventing the bonding material from being diffused into the semiconductor layer 3510 while the semiconductor device 3500 is bonded to a frame such as a package body. The barrier metal layer may comprise, for example, at least one selected from a group including materials such as Ni, Cr, Ti, Cu, Pt, Au, and the like, or an alloy thereof. The barrier metal layer may be provided in a single layer or a plurality of layers.

According to the embodiment, the metal layer 3520 may comprise a first electrode that is electrically connected to a first conductivity type semiconductor layer of the semiconductor layer 3510, and a second electrode that is connected to a second conductivity type semiconductor layer of the semiconductor layer 3510.

Meanwhile, as shown in FIG. 48, the semiconductor device 3500 according to the embodiment may comprise a first Ag layer 3530 and a Sn layer 3550.

The first Ag layer 3530 may be disposed on the semiconductor layer 3510. The first Ag layer 3530 may be disposed on the metal layer 3520. The Sn layer 3550 may be disposed on the first Ag layer 3530.

According to the embodiment, the first Ag layer 3530 and the Sn layer 3550 may form an intermetallic compound (MC) layer in the process of bonding the semiconductor device 3500 according to the embodiment to the frame of the semiconductor device package. A forming process of the intermetallic compound (IMC) layer according to the embodiment will be described later.

In addition, the semiconductor device 3500 according to the embodiment may comprise a first barrier layer 3540 and a second barrier layer 3560 as shown in FIG. 48.

The first barrier layer 3540 may be disposed on the first Ag layer 3530. The first barrier layer 3540 may be disposed between the first Ag layer 3530 and the Sn layer 3550.

The Sn layer 3550 may be disposed on the first barrier layer 3540. The Sn layer 3550 may be disposed between the first barrier layer 3540 and the second barrier layer 3560.

The first barrier layer 3540 and the second barrier layer 3560 may comprise, for example, at least one selected from a group including materials such as Ni, Cr, Ti, Cu, Pt, Au, and the like, or an alloy thereof. The first barrier layer 3540 and the second barrier layer 3560 may be provided in a single layer or a plurality of layers.

As an example, the first hairier layer 3540 may provide a function of preventing the first Ag layer 3530 from being oxidized. In addition, the second barrier layer 3560 may provide a function of preventing the Sn layer 3550 from being oxidized.

In addition, the second barrier layer 3560 may provide a function of improving adhesion to the frame while the semiconductor device 3500 is bonded to a frame such as a package body.

The first barrier layer 3540 and the second barrier layer 3560 may be formed of the same material or may be formed of different materials. The first barrier layer 3540 and the second barrier layer 3560 may be provided to a thickness of several tens of nanometers. For example, the first barrier layer 3540 and the second barrier layer 3560 may be provided in a thickness of 20 nanometers to 40 nanometers.

Meanwhile, according to the semiconductor device 3500 of the embodiment, an additional conductive material electrically connected to the semiconductor layer 3510 may be further provided between the metal layer 3520 and the semiconductor layer 3510. In addition, according to a semiconductor device 3500 of another embodiment, the metal layer 3520 may not be provided, and the first Ag layer 3530 may be disposed in direct contact with the semiconductor layer 3510.

Further, according to the semiconductor device 3500 of the embodiment, at least one of the first barrier layer 3540 and the second barrier layer 3560 may be provided. Further, according to a semiconductor device 3500 of another embodiment, both the first barrier layer 3540 and the second barrier layer 3560 may be selected not to be provided.

The amount of the first Ag layer 3530 may be provided to be smaller than 2.73 times the amount of the Sn layer 3550 based on mass percentage (Wt %). The amount of the Sn layer 3550 may be provided to be greater than 1/2.73 times the amount of the first Ag layer 3530 based on mass percentage (Wt %).

When the first Ag layer 3530 and the Sn layer 3550 form an intermetallic compound (IMC) layer, the amount of Ag and the amount of Sn may be combined at a ratio of 2.73:1 based on the mass percentage (Wt %). In addition, since the atomic weight of Ag is 107.8682 and the atomic weight of Sn is 118.710, Ag and Sn may be bonded at a ratio of 3:1 based on At %.

However, the Sn layer 3550 according to the embodiment should be able to form an intermetallic compound (IMC) layer not only with the first Ag layer 3530 but also with a metal layer provided in the frame of the package body to which the semiconductor device 3500 is to be bonded.

Accordingly, the amount of the Sn layer 3550 and the first Ag layer 3530 should be selected so that the amount of Sn layer 3550 can be left when the intermetallic compound (IMC) layer between the Sn layer 3550 and the first Ag layer 3530 is formed.

This is because the Sn layer 3550 must be able to form an intermetallic compound (IMC) layer not only with the first Ag layer 3530 but also with the frame, so that a stable bonding coupling force can be provided between the semiconductor device of the embodiment and the pad part provided in the frame.

As an example, the first Ag layer 3530 and the Sn layer 3550 may be provided in a thickness of several micrometers, respectively. The thickness of the first Ag layer 3530 may be provided to be smaller than 0.47 times the thickness of the Sn layer 3550.

According to the embodiment the thickness of the Sn layer 3550 may be provided in a range of 2 micrometers to 4 micrometers. And, the thickness of the first Ag layer 3530 may be provided in a range of 0.6 micrometers to 1.8 micrometers.

According to the semiconductor device 3500 of the embodiments, the layers disposed on the semiconductor layer 3510 may also be referred to as a bonding pad. The semiconductor layer 3510 may be provided power through the bonding pad.

As an example, the bonding pad according to the embodiment may comprise Ag layer/Au layer/Sn layer/Au layer. Further, the bonding pad according to the embodiment may comprise Ti layer/Ag layer/Au layer/Sn layer/Au layer. Further, the bonding pad according to the embodiment may comprise Ag layer/Au layer/Sn layer, Ag layer/Sn layer/Au layer, or Ag layer/Sn layer.

Meanwhile, a frame 3600 applied to a semiconductor device package according to an embodiment of the invention the frame may be provided in a plurality of layers, as shown in FIG. 49.

The frame 3600 according to the embodiment may comprise a first layer 3610, a second layer 3620, and a second Ag layer 3630 as shown in FIG. 49.

For reference, the frame 3600 according to the embodiment shown in FIG. 49 illustrates a state before the semiconductor device 3500 described with reference to FIG. 48 is bonded.

The first layer 3610 is a basic support member of the frame 3600 and may be provided as, for example, a Cu layer. In addition, the second layer 3620 may be formed as a plating layer on an upper surface of the processed first layer 3610. For example, the second layer 3620 may be provided as a Ni plating layer, and the upper surface of the second layer may be provided as flat.

The frame 3600 according to the embodiment may comprise the second Ag layer 3630, The second Ag layer 3630 may form an intermetallic compound (IMC) layer by bonding with the Sn layer 3550 during the bonding of the semiconductor device 3500 described above with reference to FIG. 48.

As an example, the thickness of the first layer 3610 may be provided in several tens of micrometers to several hundreds of micrometers. In addition, the thickness of the second layer 3620 may be provided in several micrometers. In addition, the thickness of the second Ag layer 3630 may be provided in several micrometers.

According to the embodiment, the thickness and amount of the second Ag layer 3630 may be selected according to the amount of the Sn layer 3550 provided in the semiconductor device 3500 to be bonded together with the Ag material to form an intermetallic compound (IMC) layer.

In addition, when the second layer 3620 is formed of a Ni layer, the Ni layer is known to have a small change in thermal expansion. Accordingly, even when the size or arrangement position of the package body is changed by thermal expansion, the position of the bonding pad bonded to the upper portion by the Ni layer can be stably fixed. The thickness of the second layer 3620 may be provided, for example, in a range of 1 micrometer to 2 micrometers.

Next, an example in which an intermetallic compound (IMC) layer is formed in a semiconductor device package in which a semiconductor device 3500 according to an embodiment is bonded to a frame 3600 will be described.

FIG. 50 is a view explaining an intermetallic compound (MC) layer applied to a semiconductor device package according to an embodiment of the invention.

In describing an intermetallic compound layer applied to a semiconductor device package according to an embodiment, descriptions overlapping with those described above may be omitted.

The semiconductor device package 3700 according to the embodiment may comprise a frame 3600, an intermetallic compound (IMC) layer 3710, and a semiconductor layer 3510 as shown in FIG. 50.

The frame 3600 may comprise a first layer 3610 and a second layer 3620 described with reference to FIG. 49. The intermetallic compound (IMC) layer 3710 may be disposed on the frame 3600. The intermetallic compound (IMC) layer 3710 may be disposed between the frame 3600 and the semiconductor layer 3510. The semiconductor layer 3510 may be disposed on the intermetallic compound (IMC) layer 3710.

The intermetallic compound (IMC) layer 3710 may be provided with an intermetallic compound (IMC) layer including Ag and Sn. As described with reference to FIGS. 48 and 49, the intermetallic compound (IMC) layer 3710 may be formed by coupling between the first and second Ag layer 3530 and 3630, and the Sn layer 3550.

The intermetallic compound (IMC) layer 3710 according to the embodiment may be formed in a process in which the semiconductor device 3500 according to the embodiment is disposed on the frame 3600 and air reflow is performed.

According to the embodiment, as the Sn material included in the Sn layer 3550 is diffused toward the first Ag layer 3530 and coupled by an air reflow process, the intermetallic compound (IMC) layer 3710 may be formed by the Sn material and the Ag material. In addition, as the Sn material included in the Sn layer 3550 is diffused toward the second Ag layer 3630 and coupled by an air reflow process, the intermetallic compound (IMC) layer 3710 may be formed by the Sn material and the Ag material.

For example, the intermetallic compound (IMC) layer 3710 may be formed in a ratio of 2.73:1 based on the mass percentage (Wt %) of Ag and Sn.

Meanwhile, according to the embodiment, the intermetallic compound (IMC) layer 3710 may be formed by changing the composition ratio of Ag and Sn within a certain range. For example, the intermetallic compound (IMC) layer 3710 may be provided in an amount of Ag in a range of 2.27:1 to 3.18:1 relative to an amount of Sn based on the mass percentage (Wt %).

In addition, according to the embodiment, the intermetallic compound (IMC) layer 3710 may comprise a region further containing Au. The semiconductor device 3500 according to the embodiment may comprise first and second barrier layers 3540 and 3560 as shown in FIG. 48, and the Au material included in the first and second barrier layers 3540 and 3560 may be included in the intermetallic compound (IMC) layer 3710.

For example, a region including Au may be provided between a center region of the intermetallic, compound (IMC) layer 3710 and the frame 3600. The region including Au may be provided closer to the frame 3600 than the semiconductor layer 3510 within the intermetallic compound (IMC) layer 3710.

Meanwhile, according to the semiconductor device package of the embodiment, the second Ag layer 3630 described with reference to FIG. 49 may be further disposed between the intermetallic compound (IMC) layer 3710 and the second layer 3620.

For example, in the formation of the intermetallic compound (IMC) layer 3710, when, among the Ag material included in the second Ag layer 3630, an amount remaining without forming the intermetallic compound layer with the Sn layer 3550 is left, the second Ag layer 3630 may be exist between the intermetallic compound (IMC) layer 3710 and the second layer 3620.

In addition, according to the embodiment, the metal layer 3520 described with reference to FIG. 48 may be further disposed between the semiconductor layer 3510 and the intermetallic compound (IMC) layer 3710.

As described above, according to the semiconductor device package and the method of manufacturing the semiconductor device package of the embodiment, the melting point of the intermetallic compound layer formed by coupling between the bonding pad and the frame of the semiconductor device according to the embodiment may be selected to have a higher value than the melting point of the general bonding material.

Therefore, the semiconductor device package according to the embodiment does not cause remelting even when bonded to a main board through a reflow process, so there is an advantage that the electrical connection and physical bonding force are not degraded.

In addition, according to the semiconductor device package and the semiconductor device package manufacturing method according to the embodiment, the pre-bonding process and the air reflow process can be performed at a relatively low temperature, so that the package body is not exposed to high temperatures in the process of manufacturing a semiconductor device package. Therefore, according to the embodiment, it is possible to prevent the package body from being exposed to high temperature to cause damage or discoloration.

Accordingly, a wider selection range of materials constituting the package body can be obtained. According to the embodiment, the package body may be provided using a relatively inexpensive resin material as well as an expensive material such as ceramics.

For example, the package body may comprise at least one material selected from a group including PolyPhtalAmide (PPA) resin, PolyCyclohexylenedimethylene Terephthalate (PCT) resin, Epoxy Molding Compound (EMC) resin, and Silicone Molding Compound (SMC) resin.

Meanwhile, the semiconductor device and the semiconductor device package according to the embodiment may be applied to a light source device.

In addition, the light source device may comprise a display device, a lighting device, a head lamp, or the like according to an industrial field.

As an example of the light source device, a display device may comprise a bottom cover, a reflector disposed on the bottom cover, a light emitting module including a light emitting device that emits light, a light guide plate disposed in front of the reflector and guiding light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. In this case, the bottom cover, the reflector, the light emitting module, the light guide plate, and the optical sheet may constitute a backlight unit. In addition, the display device may not include a color filter, and may have a structure in which semiconductor device emitting red, green, and blue light are disposed, respectively.

As still another example of the light source device, the head lamp may include a light emitting module including a light emitting device package disposed on a substrate, a reflector for reflecting light emitted from the light emitting module in a predetermined direction, for example, forward, a lens for refracting light reflected by the reflector forward, and a shade for constructing a light distribution pattern desired by designer by blocking or reflecting a portion of the light that is reflected by the reflector to be directed to the lens.

As another example of the light source device, the lighting device may include a cover, a light source module, a heat radiator, a power supply, an inner case, and a socket. In addition, the light source device according to an embodiment may further include at least one of a member and a holder. The light source module may include the semiconductor device or the semiconductor device package according to the embodiment.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by anyone having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

According to the semiconductor device, the method of manufacturing the semiconductor device, the semiconductor device package, the method of manufacturing the semiconductor device package of the embodiment, there is an advantage capable of improving an extraction efficiency, each of the interface adhesive property and electrical characteristics.

According to the semiconductor device, the method of manufacturing the semiconductor device, the semiconductor device package, the method of manufacturing the semiconductor device package of the embodiment, there is an advantage capable of performing stable bonding by providing a small pressure at a low temperature is provided.

According to the semiconductor device, the method of manufacturing the semiconductor device, the semiconductor device package, the method of manufacturing the semiconductor device package of the embodiment, there is an advantage capable of improving bonding force between a package electrode and a semiconductor device.

According to the semiconductor device, the method of manufacturing the semiconductor device, the semiconductor device package, the method of manufacturing the semiconductor device package of the embodiment, there is an advantage capable of improving reliability by preventing current concentration from occurring.

According to the semiconductor device, the method of manufacturing the semiconductor device, the semiconductor device package, the method of manufacturing the semiconductor device package of the embodiment, there is an advantage capable of preventing a re-melting phenomenon from occurring in a bonding region of a semiconductor device package in a process of re-bonding the semiconductor device package to the substrate and the like.

According to the semiconductor device, the method of manufacturing the semiconductor device, the semiconductor device package, the method of manufacturing the semiconductor device package of the embodiment, there is an advantage capable of accurately detecting the electrical properties of a semiconductor device and a semiconductor device package.

The invention claimed is:

1. A semiconductor device, comprising:
a light emitting structure comprising a first conductivity type semiconductor layer, an active layer disposed on the first conductivity type semiconductor layer, and a second conductivity type semiconductor layer disposed on the active layer, wherein the light emitting structure further comprises a plurality of recesses passing through the second conductivity type semiconductor layer and the active layer to expose a portion of the first conductivity type semiconductor layer;
a light transmitting electrode layer disposed on the light emitting structure;
a reflective layer disposed on the light transmitting electrode layer, and comprising a plurality of first openings exposing an upper surface of the light transmitting electrode layer and a plurality of second openings exposing an upper surface of the first conductivity type semiconductor layer;
a first electrode disposed on the reflective layer and in direct contact with the exposed portion of the first conductivity type semiconductor layer through the plurality of second openings;
a second electrode disposed on the reflective layer and spaced apart from the first electrode, and in direct contact with the light transmitting electrode layer through the plurality of first openings;
a protective layer disposed on the first electrode and the second electrode, and comprising a plurality of third openings exposing an upper surface of the second electrode and a plurality of fourth openings exposing an upper surface of the first electrode;
a first bonding pad disposed on the protective layer, and in contact with the first electrode through the plurality of fourth openings; and
a second bonding pad disposed on the protective layer, and in contact with the second electrode through the plurality of third openings, wherein the fourth openings are formed in the protective layer between an outermost second opening and an outermost edge of the first electrode, wherein the protective layer further comprises a first measuring opening exposing an upper surface of the first electrode and a second measuring opening exposing an upper surface of the second electrode, and wherein the first measuring opening is disposed between a corresponding fourth opening and the protective layer outside of the first electrode.

2. The semiconductor device according to claim 1, wherein a distance between neighboring first openings among the plurality of first openings is different from a distance between neighboring first and second openings among the plurality of first and second openings.

3. The semiconductor device according to claim 1, wherein a distance between neighboring first openings among the plurality of first openings is 110 micrometers to 140 micrometers, and wherein a distance between neighboring second openings among the plurality of second openings is 110 micrometers to 140 micrometers.

4. The semiconductor device of claim 1, wherein the first electrode comprises a first sub-electrode and a plurality of first branch electrodes, and wherein the second electrode comprises a second sub-electrode and a plurality of second branch electrodes.

5. The semiconductor device of claim 4, wherein the first sub-electrode is disposed under the first bonding pad, and the plurality of first branch electrodes are disposed and extending in a direction from the first sub-electrode to the second electrode, and wherein the second sub-electrode is disposed under the second bonding pad, and the plurality of second branch electrodes are disposed and extending in a direction from the second sub-electrode to the first electrode.

6. The semiconductor device of claim 5, wherein the plurality of first branch electrodes and the plurality of second branch electrodes are alternately disposed on an upper surface of the reflective layer.

7. The semiconductor device of claim 5, wherein a distance between neighboring first and second branch electrodes among the plurality of first and second branch electrodes is 110 micrometers to 140 micrometers.

8. The semiconductor device of claim 5, wherein the plurality of first branch electrodes overlap the plurality of second openings in a first direction perpendicular to the upper surface of the reflective layer, and wherein the plurality of second branch electrodes overlap the plurality of first openings in the first direction.

9. The semiconductor device of claim 1, wherein the first electrode and the second bonding pad are disposed to be offset from each other, and wherein the second electrode and the first bonding pad are disposed to be offset from each other.

10. The semiconductor device of claim 1, wherein the first and second bonding pads comprise a Ag layer disposed on the protective layer and a Sn layer disposed on the Ag layer.

11. The semiconductor device of claim 1, wherein the first and second bonding pads comprise a Sn layer or an In layer.

12. The semiconductor device of claim 11, wherein the Sn layer or the In layer is provided in a thickness of several micrometers.

13. The semiconductor device of claim 1, wherein the first bonding pad forms a first intermetallic compound layer with a first frame of a semiconductor package, and the second bonding pad forms a second intermetallic compound layer with a second frame of the semiconductor package.

14. The semiconductor device of claim 13, wherein the first and second intermetallic compound layers comprise an AgSn layer.

15. The semiconductor device of claim 1, wherein a distance between neighboring first and second openings among the plurality of first and second openings is 120 micrometers to 160 micrometers.

16. The semiconductor device of claim 1, wherein the first measuring opening is disposed within an outside edge of the protective layer on which the first bonding pad is not disposed.

17. The semiconductor device of claim 16, wherein the plurality of first openings are arranged next to each other without a corresponding second opening disposed therebetween, and wherein the plurality of second openings are arranged next to each other without a corresponding first opening disposed therebetween.

18. The semiconductor device of claim 1, wherein the second measuring opening is disposed within an outside edge of the protective layer on which the second bonding pad is not disposed.

* * * * *